(12) United States Patent
Wang et al.

(10) Patent No.: US 10,637,470 B2
(45) Date of Patent: Apr. 28, 2020

(54) OPTICAL KEYSWITCH

(71) Applicant: Darfon Electronics Corp., Taoyuan (TW)

(72) Inventors: Yung-Chih Wang, Taoyuan (TW); Yu-Chun Hsieh, Taoyuan (TW); Chen Yang, Taoyuan (TW); Chia-Hung Liu, Taoyuan (TW)

(73) Assignee: DARFON ELECTRONICS CORP., Taoyuan (TW)

( * ) Notice: Subject to any disclaimer, the term of this patent is extended or adjusted under 35 U.S.C. 154(b) by 15 days.

(21) Appl. No.: 16/240,021

(22) Filed: Jan. 4, 2019

(65) Prior Publication Data

US 2019/0214987 A1 Jul. 11, 2019

Related U.S. Application Data

(60) Provisional application No. 62/613,806, filed on Jan. 5, 2018.

(30) Foreign Application Priority Data

Jul. 23, 2018 (TW) .............................. 107125385 A

(51) Int. Cl.
*H03K 17/00* (2006.01)
*G01J 1/02* (2006.01)
*H03K 17/968* (2006.01)

(52) U.S. Cl.
CPC .......... *H03K 17/968* (2013.01); *G01J 1/0238* (2013.01)

(58) Field of Classification Search
CPC .............................. H03K 17/968; G01J 1/0238

USPC ......................................................... 250/239
See application file for complete search history.

(56) References Cited

U.S. PATENT DOCUMENTS

| 4,479,111 A | 10/1984 | Madsen et al. |
| 4,836,636 A | 6/1989 | Obara et al. |
| 5,266,949 A | 11/1993 | Rossi |
| 8,178,830 B2 * | 5/2012 | Condon ................ H01H 35/24 200/83 R |

(Continued)

FOREIGN PATENT DOCUMENTS

| CN | 203521244 U | 4/2014 |
| CN | 203812764 U | 9/2014 |

(Continued)

*Primary Examiner* — Seung C Sohn
(74) *Attorney, Agent, or Firm* — McClure, Qualey & Rodack, LLP

(57) ABSTRACT

An optical keyswitch includes a casing having a movable portion, a shaft movably disposed on the casing, a resilient member accommodated in the casing, and a switch module including a circuit board, an emitter, and a receiver. The emitter emits an optical signal along an optical path to the receiver. When the shaft is at a non-pressed position, the movable portion has a first spatial relation with the optical path, and the receiver receives the optical signal of a first intensity. When the shaft moves, in response to a pressing force, to a pressed position, the shaft compresses the resilient member and pushes the movable portion to move, so the movable portion no longer has the first spatial relation with the optical path, the optical signal received by the receiver has a second intensity different from the first intensity, and the switch module is triggered to generate a triggering signal.

22 Claims, 40 Drawing Sheets

(56) References Cited

U.S. PATENT DOCUMENTS

| | | | |
|---|---|---|---|
| 8,243,024 B2 * | 8/2012 | Senft | G01D 5/34 250/239 |
| 9,634,661 B1 | 4/2017 | Chen | |
| 2016/0179212 A1 | 6/2016 | Toraille et al. | |
| 2017/0019102 A1 | 1/2017 | Chen | |
| 2017/0115747 A1 | 4/2017 | Chen et al. | |
| 2017/0178830 A1 | 6/2017 | Feng | |
| 2017/0264294 A1 | 9/2017 | Li | |

FOREIGN PATENT DOCUMENTS

| | | |
|---|---|---|
| CN | 204130394 U | 1/2015 |
| CN | 204407228 U | 6/2015 |
| CN | 204441139 U | 7/2015 |
| CN | 104991319 A | 10/2015 |
| CN | 104992867 A | 10/2015 |
| CN | 105006396 A | 10/2015 |
| CN | 105097342 A | 11/2015 |
| CN | 205004229 U | 1/2016 |
| CN | 205004233 U | 1/2016 |
| CN | 105429620 A | 3/2016 |
| CN | 205092842 U | 3/2016 |
| CN | 104299818 B | 9/2016 |
| CN | 105931907 A | 9/2016 |
| CN | 206180999 U | 5/2017 |
| CN | 107017870 A | 8/2017 |
| CN | 206758332 U | 12/2017 |

* cited by examiner

OPTICAL KEYSWITCH

BACKGROUND OF THE INVENTION

1. Field of the Invention

The invention generally relates to an optical keyswitch. Particularly, the invention relates to an optical keyswitch which is triggered according to the receiving status of the optical signal.

2. Description of the Prior Art

Membrane keyswitches and mechanical keyswitches are common types of keyswitch for keyboards. The major difference between the membrane keyswitch and the mechanical keyswitch is the circuit structure for generating the triggering signal. In general, the membrane keyswitch utilizes the membrane circuit as a switch for generating the triggering signal. When the keycap is pressed to trigger the membrane circuit, the upper circuit layer is deformed to enable the upper switch contact of the upper circuit layer to contact the corresponding lower switch contact of the lower circuit layer, so the membrane circuit is conducted to generate the signal. However, the membrane circuit is easily damaged and difficult to repair when it is frequently used or operated by improper forces. Moreover, when the user presses the keycap to trigger the membrane circuit, the tactile feedback is less significant, which causes the pressing feeling to be poor and cannot satisfy the user's expectation.

The mechanical keyswitch is triggered based on whether the metal piece and the metal contact are conducted. However, the metal piece and the metal contact are easily worn out due to operation impact, which reduces the life of the keyswitch. The metal piece and the metal contact are also prone to rusty, resulting in poor conduction, which affects the operation stability of the keyswitch. Moreover, conventional mechanical keyswitches are more complicate in structure and bigger in volume and not suitable for portable electronic devices having higher thinning requirements, such as laptop computer.

SUMMARY OF THE INVENTION

It is an object of the invention to provide an optical keyswitch, which utilizes a switch module constructed by the emitter and the receiver, and provides fast and accurate triggering function based on the receiving status of the optical signal changed by movable components of the keyswitch during the stroke.

It is another object of the invention to provide an optical keyswitch, which integrates the optical switch to the limited space of the keyswitch and utilizes the laterally movable component or portion to change the received intensity of the optical signal, so as to reduce the space requirement in the vertical direction to be suitable for use in portable electronic devices.

In an embodiment, the invention provides an optical keyswitch including a casing having a movable portion, a shaft movably disposed on the casing, in response to a pressing force, the shaft moving along an up-down path from a non-pressed position to a pressed position, a resilient member accommodated in the casing, the resilient member coupling the shaft and enabling the shaft to return to the non-pressed position when the pressing force is released, and a switch module comprising a circuit board, an emitter, and a receiver. The emitter and the receiver are electrically connected to the circuit board; the emitter emits an optical signal along an optical path to the receiver. When the shaft is at the non-pressed position, the movable portion has a first spatial relation with the optical path, and the receiver receives the optical signal of a first intensity. When the shaft moves, in response to the pressing force, from the non-pressed position to the pressed position along the up-down path, the shaft compresses the resilient member and pushes the movable portion to move, so the movable portion no longer has the first spatial relation with the optical path, the optical signal received by the receiver has a second intensity different from the first intensity, and the switch module is triggered to generate a triggering signal.

In an embodiment, when the shaft is at the non-pressed position, the movable portion has a less portion entering the optical path and blocks a less amount of the optical signal. When the shaft moves to the pressed position, the movable portion laterally moves away from the up-down path and has a larger portion entering the optical path, so the movable portion blocks a larger amount of the optical signal, and the second intensity is smaller than the first intensity.

In an embodiment, the shaft has an activating portion protruding along the up-down path and corresponding to the movable portion. When the shaft is at the non-pressed position, the activating portion at least partially overlaps the movable portion in a direction parallel to the up-down path. When the shaft moves along the up-down path and pushes the movable portion to laterally move, the activating portion at least partially contacts the movable portion in a direction perpendicular to the up-down path.

In an embodiment, the activating portion has a first inclined surface, and the movable portion has a second inclined surface corresponding to the first inclined surface. When the shaft moves along the up-down path, the first inclined surface moves relative to the second inclined surface to push the movable portion to laterally move.

In an embodiment, the circuit board further has a receiving space. When the shaft is at the pressed position, a distal end of the activating portion extends beyond the movable portion into the receiving space.

In an embodiment, the casing comprises an upper casing and a lower casing. The upper casing has a through hole and an upper engaging portion. The shaft is movably inserted into the through hole to position the resilient member. The movable portion is disposed on the lower casing. The lower casing has a lower engaging portion engaging the upper engaging portion to combine the upper casing and the lower casing.

In an embodiment, the casing comprises an upper casing and a lower casing. The upper casing has a through hole and an upper engaging portion. The shaft is movably inserted into the through hole to position the resilient member. The movable portion is disposed on the upper casing. The lower casing has a lower engaging portion engaging the upper engaging portion to combine the upper casing and the lower casing.

In an embodiment, the casing further has a grating portion disposed between the emitter and the receiver. The grating portion has a slit. The movable portion has a horizontal extension axis. When the shaft is at the non-pressed position, the horizontal extension axis does not pass through the slit. When the movable portion laterally moves away from the up-down path, the horizontal extension axis passes through the slit.

In an embodiment, the circuit board further has a positioning hole, and the lower casing has a positioning post for being inserted into the positioning hole to position the casing on the circuit board.

In an embodiment, the optical keyswitch further includes a light guiding rod and a backlight source, wherein the light guiding rod is disposed corresponding to the resilient member in the casing, and the backlight source is electrically connected to the circuit board and disposed corresponding to the light guiding rod to provide a light toward the shaft.

In another embodiment, the invention provides an optical keyswitch including a casing, a shaft movably disposed on the casing, in response to a pressing force, the shaft moving along an up-down path from a non-pressed position to a pressed position, a resilient member accommodated in the casing, the resilient member coupling the shaft and enabling the shaft to return to the non-pressed position when the pressing force is released, a switch module comprising a circuit board, an emitter, and a receiver, the emitter and the receiver electrically connected to the circuit board, the emitter emitting an optical signal along an optical path to the receiver, and a shielding baffle disposed on the casing. When the shaft is at the non-pressed position, the shielding baffle has a first spatial relation with the optical path, and the receiver receives the optical signal of a first intensity. When the shaft moves, in response to the pressing force, from the non-pressed position to the pressed position along the up-down path, the shaft compresses the resilient member and drives the shielding baffle to move, so the shielding baffle no longer has the first spatial relation with the optical path, the optical signal received by the receiver has a second intensity different from the first intensity, and the switch module is triggered to generate a triggering signal.

In an embodiment, when the shaft is at the non-pressed position, the shielding baffle has a less portion entering the optical path and blocks a less amount of the optical signal. When the shaft moves to the pressed position, the shielding baffle laterally moves away from the up-down path and has a larger portion entering the optical path, so the shielding baffle blocks a larger amount of the optical signal, and the second intensity is smaller than the first intensity.

In an embodiment, when the shaft is at the non-pressed position, the shielding baffle is located in the optical path and blocks the optical signal. When the shaft moves to the pressed position, the shielding baffle is pushed by the shaft to laterally move away from the optical path, so the second intensity is larger than the first intensity.

In an embodiment, the casing comprises an upper casing and a lower casing. The upper casing has a through hole and an upper engaging portion. The shaft is movably inserted into the through hole to position the resilient member. The lower casing has a lower engaging portion engaging the upper engaging portion to combine the upper casing and the lower casing. The casing further has a grating portion disposed between the emitter and the receiver. The grating portion has a slit. The shielding baffle has a shielding portion. In response to the movement of the shaft, the shielding portion selectively blocks or exposes the slit with respect to the emitter.

In another embodiment, the invention provides an optical keyswitch including a keycap, a support mechanism disposed below the keycap and configured to support the keycap moving upward and downward, a restoring mechanism disposed below the keycap and configured to provide a restoring force to enable the keycap to return to a non-pressed position, the restoring mechanism comprising a casing having a movable portion and a resilient member accommodated in the casing, and a switch module comprising a circuit board, an emitter, and a receiver, the emitter and the receiver electrically connected to the circuit board, the emitter emitting an optical signal to the receiver. When the keycap is not pressed, the receiver receives the optical signal of a first intensity. When the keycap is pressed, the resilient member is compressed and the support mechanism is driven to move along with the keycap to push the movable portion to change the optical signal received by the receiver to have a second intensity different from the first intensity, so that the switch module is triggered to generate a triggering signal.

In an embodiment, the support mechanism includes an inner frame and an outer frame. The inner frame is pivotally connected to an inner side of the outer frame to form a scissor-like support mechanism. The support mechanism has a protrusion. The protrusion extends from an inner side of the inner frame toward an inner direction of the inner frame.

In an embodiment, when the support mechanism is driven to move along with the keycap, the protrusion pushes the movable portion to at least partially block the optical signal, so that the second intensity is smaller than the first intensity.

In an embodiment, when the keycap is not pressed, the protrusion at least partially overlaps the movable portion in a direction parallel to a moving direction of the keycap. When the keycap is pressed, the protrusion pushes the movable portion to laterally move, and the protrusion at least partially contacts the movable portion in a direction perpendicular to the moving direction of the keycap.

In an embodiment, the protrusion has a first inclined surface, and the movable portion has a second inclined surface corresponding to the first inclined surface. When the support mechanism is driven to move along with the keycap, the first inclined surface moves relative to the second inclined surface to push the movable portion to laterally move.

In an embodiment, the casing further has a grating portion disposed between the emitter and the receiver. When the keycap is pressed, the support mechanism pushes the movable portion to move, so as to change a relative position of the movable portion and the grating portion.

Compared to the prior art, the optical keyswitch of the invention utilizes the emitter and the receiver as the switch unit. The optical keyswitch can be fast and accurately triggered by changing the receiving status of the optical signal and is applicable to various kinds of keyswitch structures for portable electronic devices. Moreover, the optical keyswitch of the invention optionally has the grating portion to reduce the interference of external light, so that the triggering accuracy can be enhanced and the triggering position can be suitably controlled to reduce the triggering error. Furthermore, the optical keyswitch of the invention utilizes a laterally movable component or portion to change the received intensity of the optical signal, so the space requirement in the vertical direction (i.e. the thickness direction) can be effectively reduced.

DETAILED DESCRIPTION OF THE PREFERRED EMBODIMENT

The invention provides an optical keyswitch, which can be applied to any pressing-type input device, such as keyboard, or integrated to any suitable electronic devices, such as keybuttons or keyboard equipped in portable devices or lap top computers, so as to provide fast and accurate triggering function and to be applicable to various keyswitch designs. Hereinafter, the optical keyswitch of the invention will be described in detail with reference to the drawings.

Figure 1A:
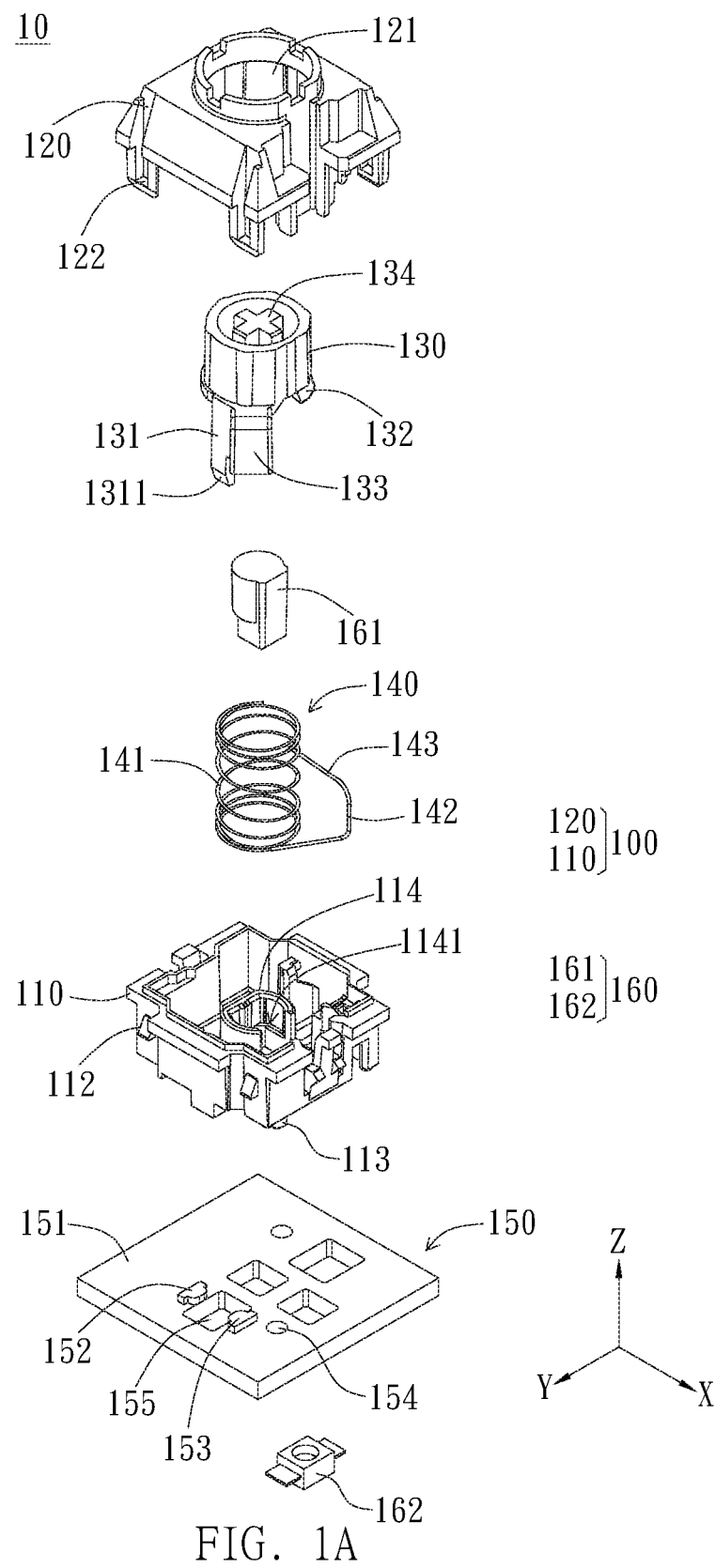
FIGS. 1A and 1B are exploded views of a first embodiment of the optical keyswitch of the invention from different viewing angles.
Figure 1B:
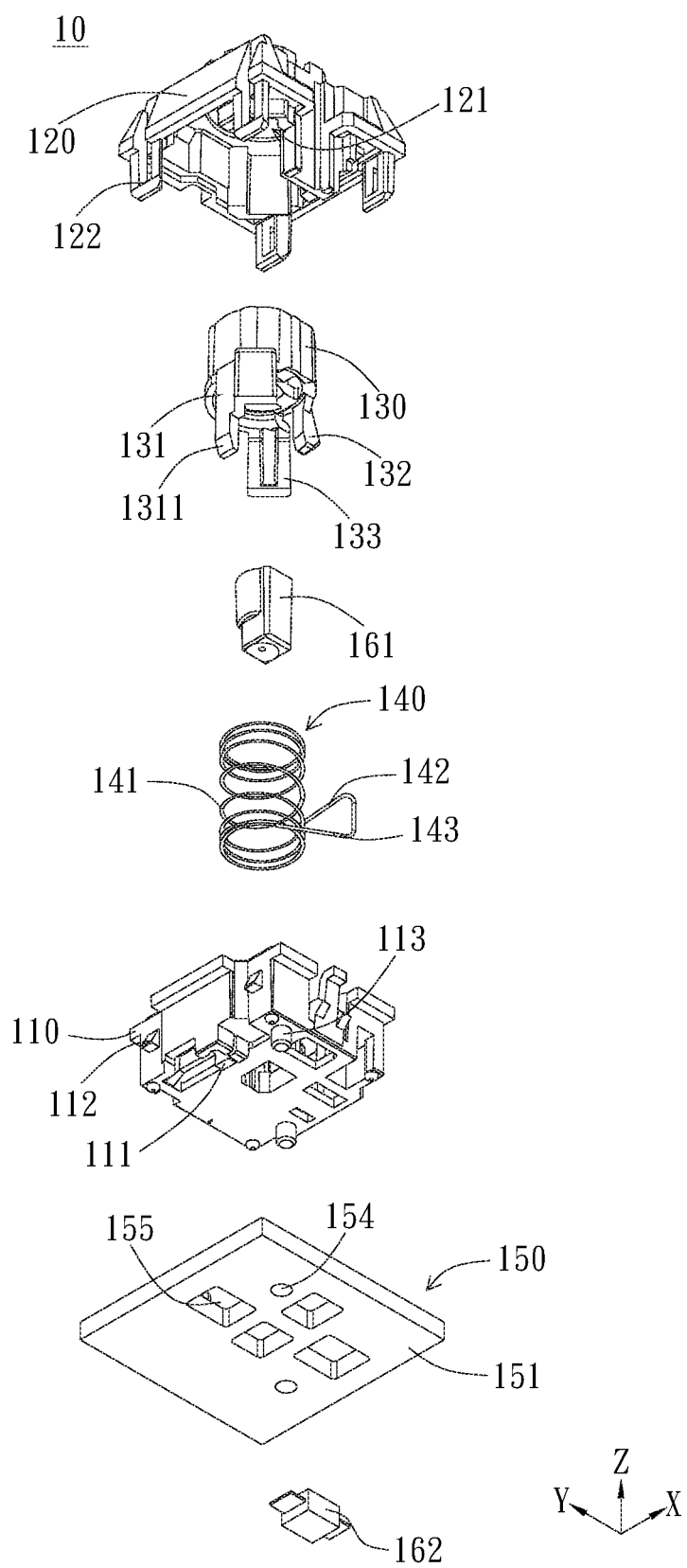
Figure 1C:
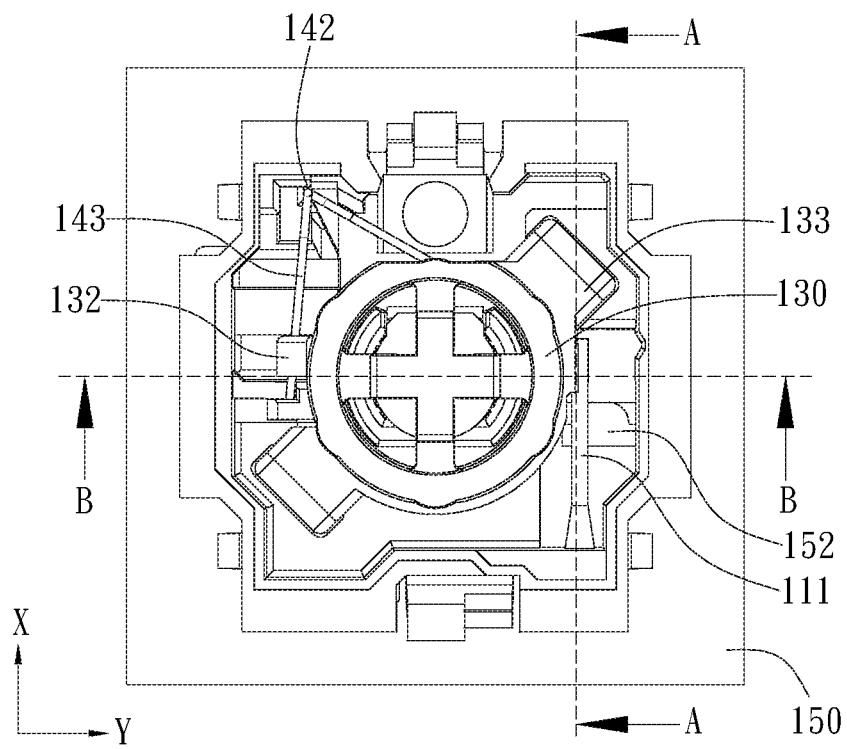
FIG. 1C is a schematic top view of the optical keyswitch of FIG. 1A without the upper casing.
Figure 1D:
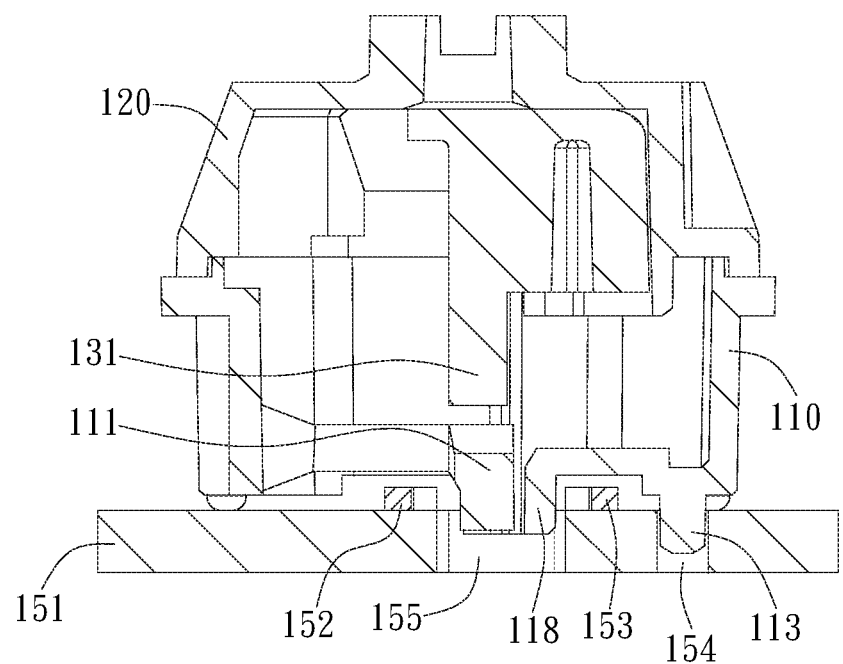
FIG. 1D is a cross-sectional view of FIG. 10 along the cutting line AA with the upper casing.
Figure 10:
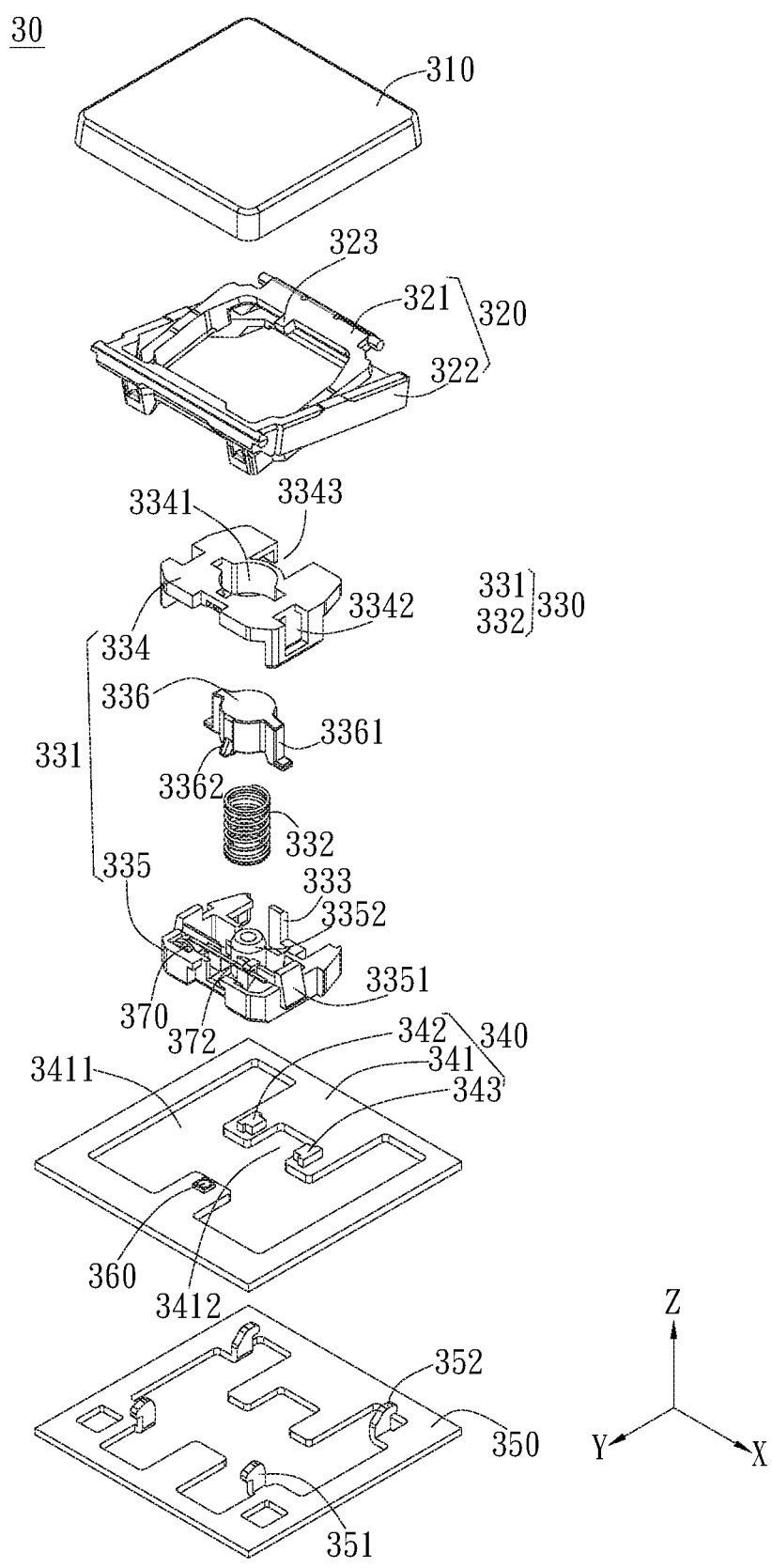
FIG. 10 is an exploded view of the optical keyswitch of a fifth embodiment.

FIGS. 1A to 5D are schematic views of a first embodiment of the invention, wherein FIGS. 1A and 1B are exploded views of the optical keyswitch from different viewing angles, FIG. 10 is a schematic top view of the optical keyswitch of FIG. 1A without the upper casing, and FIG. 1D is a cross-sectional view of FIG. 10 along the cutting line AA with the upper casing. As shown in FIGS. 1A to 1D, the optical keyswitch 10 includes a casing 100, a shaft 130, a resilient member 140, and a switch module 150. The casing 100 has a movable portion 111. The shaft 130 is movably disposed on the casing 100. In response to a pressing force, the shaft 130 can move along an up-down path from a non-pressed position to a pressed position. The resilient member 140 is accommodated in the casing 100. The resilient member 140 couples the shaft 130 and enables the shaft 130 to return to the non-pressed position when the pressing force is released. The switch module 150 includes a circuit board 151, an emitter 152, and a receiver 153. The emitter 152 and the receiver 153 are electrically connected to the circuit board 151, and the emitter 152 emits an optical signal along an optical path to the receiver 153. When the shaft 130 is at the non-pressed position, the movable portion 111 has a first spatial relation with the optical path, and the receiver 153 receives the optical signal of a first intensity. When the shaft 130 moves, in response to the pressing force, from the non-pressed position to the pressed position along the up-down path, the shaft 130 compresses the resilient member 140 and pushes the movable portion 111 to move, so the movable portion 111 no longer has the first spatial relation with the optical path, the optical signal received by the receiver 153 has a second intensity different from the first intensity, and the switch module 150 is triggered to generate a triggering signal.

In addition, the optical keyswitch 10 may further include a backlight unit 160 for proving a backlight. For example, the backlight unit 160 includes a light guiding rod 161 and a backlight source 162. The light guiding rod 161 is disposed corresponding to the resilient member 140 in the casing 100, and the backlight source 162 is electrically connected to the circuit board 151 and disposed corresponding to the light guiding rod 161 to provide the light.

The casing 100 preferably includes an upper casing 120 and a lower casing 110, which are combined to enclose an accommodation space for accommodating components of the optical keyswitch 10, such as the resilient member 140, the light guiding rod 161. In this embodiment, the upper casing 120 has a through hole 121 and an upper engaging portion 122. The shaft 130 is movably inserted into the through hole 121 to position the resilient member 140. The lower casing 110 has a lower engaging portion 112 for engaging the upper engaging portion 122 to combine the upper casing 120 and the lower casing 110 to form the casing 100 with the accommodation space in which the resilient member 140 and the light guiding rod 161 are disposed. In an embodiment, the upper engaging portion 122 can be slots formed on two opposite sides of the upper casing 120, and the lower engaging portion 112 can be corresponding protrudent portions, but not limited thereto. According to practical applications, the upper engaging portion 122 can be protrudent portions formed on the upper casing 120, and the lower engaging portion 112 can be corresponding slots formed on the lower casing 110.

Moreover, the casing 100 can be positioned on the underlying component, such as the circuit board 151 or a baseplate (not shown), by engaging, securing, adhering, leaning, etc. In this embodiment, the casing 100 is preferably disposed on the circuit board 151, but not limited thereto. In another embodiment, the casing 100 can be disposed on the baseplate, and according to practical applications, the circuit board 151 can be disposed above or beneath the baseplate. In an embodiment, the casing 100 is preferably positioned on the circuit board 151 by positioning mechanism. For example, the lower casing 110 has a positioning post 113, and the circuit board 151 has a positioning hole 154 corresponding to the positioning post 113, so that the positioning post 113 can be inserted into the positioning hole 154 to position the casing 100 on the circuit board 151, but not limited thereto. In other embodiments, the locations of the positioning hole and the positioning post can be exchanged as appropriate.

The through hole 121 of the upper casing 120 preferably has a shape corresponding to the top end of the shaft 130, so that the shaft 130 can be inserted into the through hole 121 from the bottom side of the upper casing 120, and the top end of the shaft 130 protrudes from the through hole 121. In this embodiment, the shaft 130 preferably has an activating portion 131, an acting portion 132, a restricting portion 133, and a coupling portion 134. For example, the shaft 130 is preferably a barrel-like object. The activating portion 131, the acting portion 132, and the restricting portion 133 are preferably disposed along the lower periphery of the shaft 130, and the coupling portion 134 is preferably disposed on top of the shaft 130.

Specifically, the activating portion 131 protrudes along the up-down path (e.g. along the Z axis direction) and corresponds to the movable portion 111. For example, the activating portion 131 can be a protrudent post or block extending along the Z axis direction to correspond to the movable portion 111 of the casing 100. In an embodiment, the activating portion 131 preferably has a first inclined surface 1311. In this embodiment, the first inclined surface 1311 is preferably formed on the free end (i.e. the lower end) of the activating portion 131 and inclines inwardly along the up-down path. For example, the first inclined surface 1311 preferably extends along the Z axis direction and inclines toward the inner side of the shaft 130. The acting portion 132 is disposed corresponding to the extending arm 143 of the resilient member 140, and the acting portion 132 is preferably a protrudent block (e.g. angular block) and configured to work with the extending arm 143 of the resilient member 140 to provide tactile feedback. The restricting portion 133 can be columnar portions extending radially outward from two sides of the shaft 130, so that the distance between the two columnar portions is larger than the size of the through hole 121 of the upper casing 120. As such, the restricting portion 133 can restrict the movement of shaft 130 relative to the upper casing 120 and prevent the shaft 130 from escaping from the upper casing 120 via the through hole 121. The coupling portion 134 is configured to engage the keycap (not shown) and can be, for example, a cross engaging bump formed on the top of the shaft 130, but not limited thereto. In another embodiment, the coupling portion 134 can have other configurations, such as engaging hole, protrudent bump, to engage or contact the keycap.

In this embodiment, the resilient member 140 preferably includes a spring portion 141, a positioning portion 142, and an extending arm 143. The positioning portion 142 is connected to the spring portion 141 and the extending arm 143. For example, the positioning portion 142 and the extending arm 143 are preferably formed by bending a rod, which extends from one end of the spring portion 141, such as the lower end, and the positioning portion 142 and the extending arm 143 serve as a tactile resilient member of the optical keyswitch 10, but not limited thereto. In this embodiment, the positioning portion 142 preferably extends substantially horizontally from one end of the spring portion 141 and then is bent upward substantially along the Z axis direction, and the extending arm 143 is bent with respect to the positioning portion 142. In this embodiment, the angle between the extending arm 143 and the positioning portion 142, i.e. the angle between the extending directions of the extending arm 143 and the positioning portion 142, is preferably less than 120 degrees. In another embodiment, the resilient member 140 can be implemented as a spring without the positioning portion 142 and the extending arm 143, and a tactile resilient member (e.g. a torsion spring) can be separately provided and configured to provide the tactile feedback in response to the movement of the acting portion 132 of the shaft 130. In another embodiment, the resilient member 140 can merely include the spring portion 141, and the optical keyswitch 10 may not be provided with the additional tactile resilient member, so that the acting portion 132 can be omitted from the shaft 130. Though the resilient member 140 is illustrated as the spring-type resilient member, but not limited thereto. In other embodiments, the resilient member 140 can be implemented as a rubber dome or an elastomer, which is disposed between the lower casing 110 and the shaft 130 to provide the restoring force after the pressing force is released.

Figure 2A:
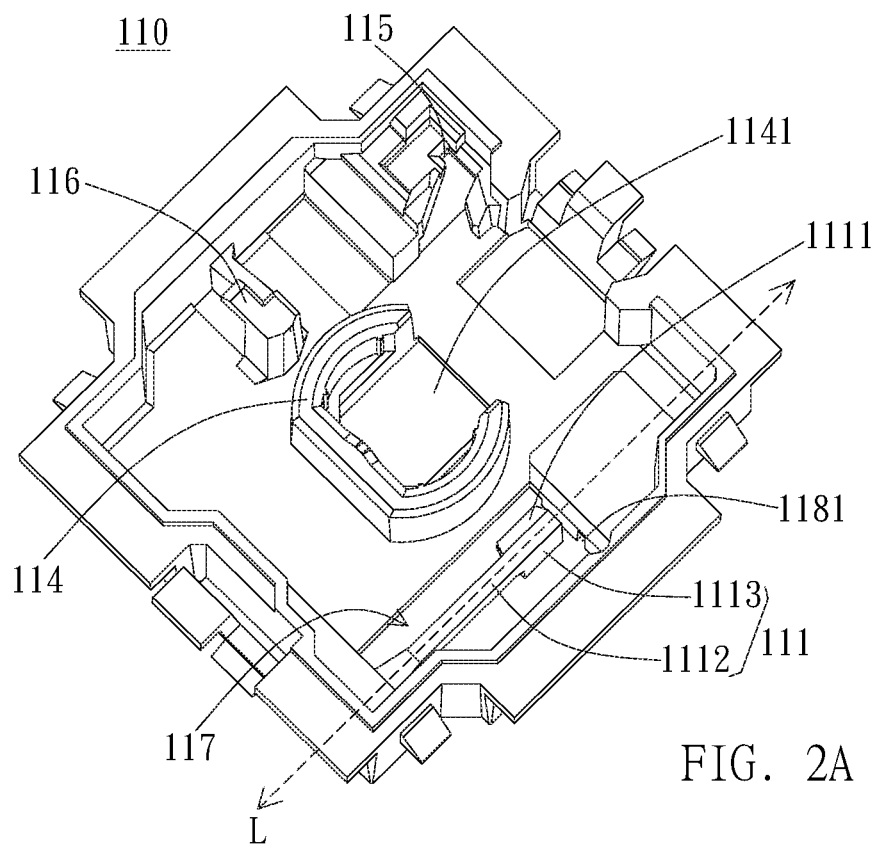
FIGS. 2A and 2B are schematic views of the lower casing from different viewing angles.
Figure 2B:
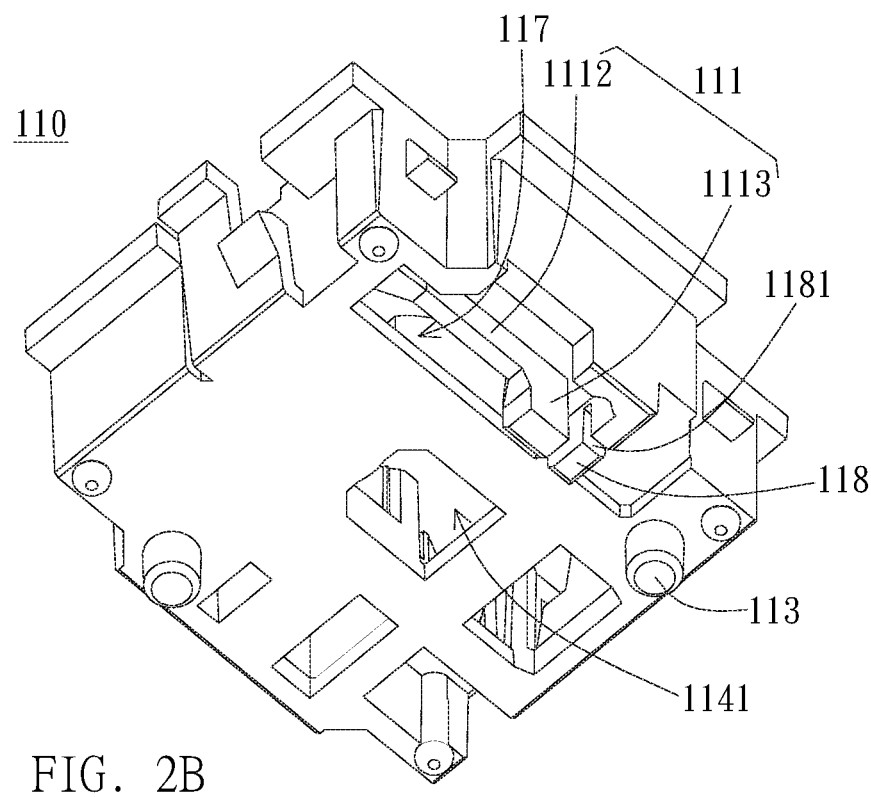

Also referring to FIGS. 2A and 2B, the structure of the lower casing 110 and the arrangement of components relative to the lower casing 110 will be described in detail. Corresponding to the resilient member 140, the lower casing 110 further includes a coupling portion 114 for positioning the spring portion 141. For example, the coupling portion 114 can be a ring shape column extending from the bottom of the lower casing 110 toward the upper casing 120, so that one end of the spring portion 141 is sleeved on the ring shape column, and the other end of the spring portion 141 contacts the bottom of the shaft 130 to enable the top end of the shaft 130 to protrude out of the upper casing 120 from the through hole 121. As such, when the pressing force is exerted on the keycap, and the shaft 130 moves, in response to the pressing force, from the non-pressed position toward the lower casing 110 to the pressed position, the shaft 130 compresses the spring portion 141 of the resilient member 140. When the pressing force is released, the spring portion 141 provides the restoring force to enable the shaft 130 to move away from the lower casing 110 back to the non-pressed position. Moreover, the lower casing 110 preferably further includes a limiting portion 115, which corresponds to the positioning portion 142 of the resilient member 140. The positioning portion 142 is positioned on the lower casing 110 by the limiting portion 115, and the extending arm 143 extends corresponding to the acting portion 132. The limiting portion 115 preferably corresponds to the upper section of the positioning portion 142, i.e. the vertical portion close to the extending arm 143, so as to limit movements of the positioning portion 142. Specifically, when the spring portion 141 is sleeved on the coupling portion 114, the positioning portion 142 of the resilient member 140 preferably extends substantially horizontally to the limiting portion 115, so that the upper section of the vertical portion of the positioning portion 142 can be positioned by the limiting portion 115, and the extending arm 143 extends relative to the positioning portion 142 to be under the acting portion 132. For example, the limiting portion 115 can be a groove formed on the wall of the lower casing 110 or a wall surface which can be leaned by the connection section of the positioning portion 142 and the extending arm 143. Moreover, the lower casing 110 can optionally include an impact portion 116. When the shaft 130 moves, in response to the pressing force, toward the lower casing 110, the acting portion 132 moves downward along with the shaft 130 to generate relative displacement with respect to the extending arm 143, so that the finger of the user firstly feels larger resistance, and then the resistance is greatly reduced when the extending arm 143 escapes from the downward pressing of the acting portion 132 and hits the impact portion 116 to generate a sound. As such, a significant tactile feedback can be provided to the user. When the pressing force is released, the spring portion 141 provides the restoring force to enable the shaft 130 along with the acting portion 132 to move upward, and the extending arm 143 slides downward relative to the acting portion 132 back to its original position.

Moreover, the lower casing 110 preferably has an accommodation portion 1141 corresponding to the backlight unit 160. For example, the accommodation portion 1141 can be a space enclosed by the ring shape post, which serves as the coupling portion 114 and configured to accommodate the light guiding rod 161. In other words, the light guiding rod 161 is disposed on the inner side of the coupling portion 114, and the spring portion 141 is sleeved on the outer side of the coupling portion 114. The lower casing 110 preferably has an opening on the bottom corresponding to the coupling portion 114, and the backlight source 162 is correspondingly disposed under the light guiding rod 161 to emit light into the light guiding rod 161. In this embodiment, the backlight source 162 is preferably a light-emitting diode, but not limited thereto.

As shown in the figures, the movable portion 111 is disposed on the lower casing 110 corresponding to the activating portion 131 of the shaft 130. Specifically, the movable portion 111 can be a flexible arm disposed on the lower casing 110, so that the movable portion 111 can shift or deform in response to the movement of the activating portion 131 and change the spatial relation (or relative position) of the movable portion 111 with the optical path between the emitter 152 and the receiver 153 to trigger the switch module 150 to generate the triggering signal. In this embodiment, the movable portion 111 is preferably integrally formed with the lower casing 110. For example, the lower casing 110 has an opening 117 at the bottom, and the movable portion 111 extends from one side of the opening 117 toward the other side of the opening 117. In other words, the movable portion 111 is preferably disposed in the opening 117, wherein one end of the movable portion 111 is connected to the wall of the lower casing 110, which defines the opening 117, and the other end of the movable portion 111 is a free end located in the opening 117. The movable portion 111 preferably extends horizontally parallel to the bottom of the lower casing 110 in the opening 117, so that the movable portion 111 has a horizontal extension axis L. That is, the horizontal extension axis L is preferably a longitudinal axis from the connection end of the movable portion 111 to the free end. In this embodiment, the movable portion 111 is preferably an L-shape flexible arm having a connection portion 1112 and a shielding portion 1113. The long axis of the L-shape flexible arm is preferably the connection portion 1112, which extends parallel to the bottom of the lower casing 110, and the short axis of the L-shape flexible arm is the shielding portion 1113, which extends from the free end of the movable portion 111 to protrude from the bottom of the lower casing 110. In other words, one end of the connection portion 1112 is connected to the lower casing 110, and the other end of the connection portion 1112 is connected to the shielding portion 1113.

Figure 2C:
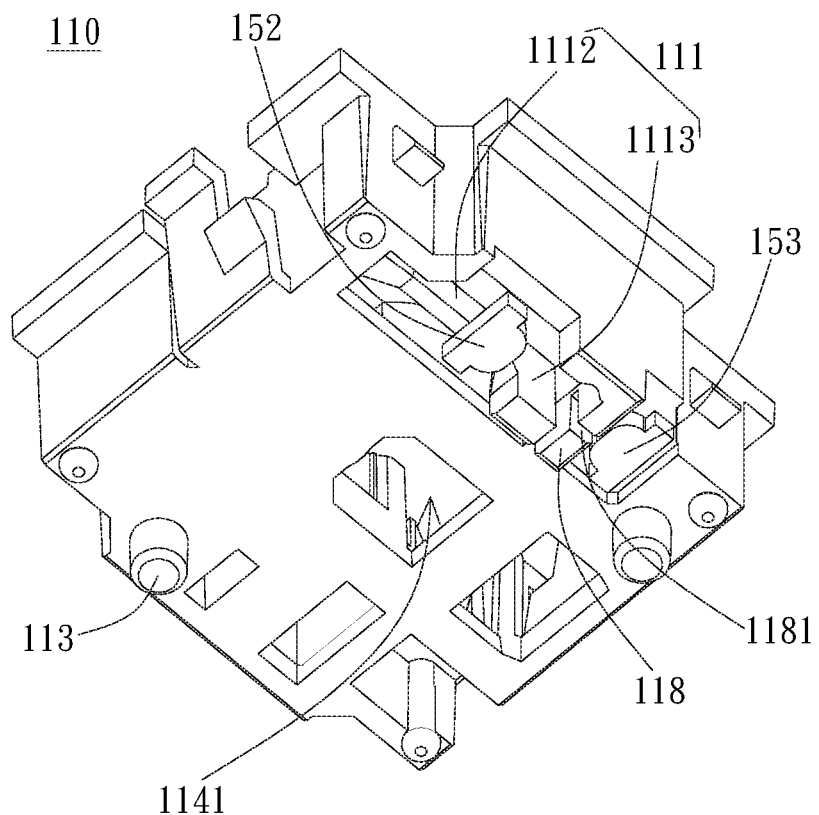
FIG. 2C is a schematic view of FIG. 2B showing the positions of the emitter and the receiver relative to the lower casing.

It is noted that though the shielding portion 1113 is illustrated to extend downward from the connection portion 1112, in other embodiments, the shielding portion 1113 can extend upward from the connection portion 1112. Moreover, in this embodiment, the connection portion 1112 is a connection arm extending linearly parallel to the lower casing 110, but not limited thereto. In other embodiments, according to practical applications, the connection portion 1112 can be a rod or an arm of any suitable shape to serve as a supporting arm of the movable portion 111, which can elastically deform. In addition, as shown in FIG. 2C, the emitter 152 and the receiver 153 are preferably disposed on two opposite sides of the shielding portion 1113 of the movable portion 111 and under the connection portion 1112. As such, when the movable portion 111 deforms or shifts, the emitter 152 (or the receiver 153) will not interfere the lateral movement of the connection portion 1112 and the shielding portion 1113.

In this embodiment, the movable portion 111 preferably has a second inclined surface 1111 corresponding to the first inclined surface 1311 of the activating portion 131. Therefore, when the shaft 130 moves along the up-down path, the first inclined surface 1311 moves relative to the second inclined surface 1111 to push the movable portion 111 to laterally move. Specifically, the second inclined surface 1111 is preferably an inner surface of the shielding portion 1113, i.e. the lateral surface that faces the shaft 130. The second inclined surface 1111 preferably extends downward along the Z axis and inclines outward to correspond to the first inclined surface 1311.

The casing 100 preferably further has a grating portion 118. The grating portion 118 has a slit 1181 and is disposed between the emitter 152 and the receiver 153. Specifically, in this embodiment, the grating portion 118 is disposed on the lower casing 110 corresponding to the emitter 152 or the receiver 153 to define the distance of pressing the keycap to generate the triggering signal. In other words, the grating portion 118 can have a gate-like structure with the slit 1181 and is preferably located between the emitter 152 and the receiver 153 adjacent to the emitting end of the emitter 152 or the receiving end of the receiver 153. The grating portion 118 can control the triggering position by controlling the size and position of the slit 1181, so as to reduce the false triggering. For example, the possible triggering error is about the thickness of the emitter 152 and the receiver 153, and by controlling the size of the slit 1181 to correspond to (e.g. smaller than) the thickness of the emitter 152 or the receiver 153, the triggering error can be reduced. In an embodiment, the grating portion 118 of the lower casing 110 is disposed neighboring the receiver 153, so that the optical signal at the receiver 153 is less interfered by external light, and the possibility of generating a false triggering signal is effectively reduced, but not limited thereto. According to practical applications, in corporation with the design of the circuit board 151, the locations of the emitter 152 and the receiver 153 can be exchanged, so that the grating portion 118 is disposed neighboring the emitter 152. Moreover, with respect to the grating portion, the movable portion 111 is preferably disposed at one side of the grating portion 118, so that when the movable portion 111 deforms or shifts relative to the lower casing 110 in response to movement of the activating portion 131, the position of the movable portion 111 relative to the slit 1181 can be changed, so as to change the intensity of the optical signal received by the receiver 153. For example, the size (e.g. width and length) of shielding portion 1113 of the movable portion 111 is preferably equal to or larger than the size of the slit 1181, so that when the movable portion 111 deforms or shifts in response to the movement of the activating portion 131, the shielding portion 1113 can selectively block the slit 1181.

The emitter 152 and the receiver 153 are disposed on the circuit board 151 and electrically connected to the circuit board 151. Specifically, the circuit board 151 has a switch circuit, and the emitter 152 and the receiver 153 are electrically connected to the switch circuit, so that the emitter 152 can emit the optical signal toward the receiver 153. When the intensity of the optical signal received by the receiver 153 changes, the switch module 150 is triggered to generate the triggering signal. For example, the emitter 152 can be any suitable emitters, which can emit optical signal of suitable wavelength, and the optical signal emitted by the emitter 152 can include electromagnetic waves, infrared rays, or visible lights. The receiver 153 can be any suitable receivers, which can correspondingly receive the optical signal. The emitter 152 and the receiver 153 are preferably disposed linearly, so that the optical path can be substantially a straight path. The circuit board 151 preferably has a receiving space 155. The receiving space 155 communicates with the opening 117. When the shaft 130 is at the pressed position, the distal end of the activating portion 131 extends into the receiving space 155 to increase the stroke distance and improve the operation feeling. For example, the receiving space 155 can be a receiving groove (or hole) opened on the circuit board 151, and the emitter 152 and the receiver 153 are disposed on two opposite sides of the receiving groove.

Moreover, in response to the disposition of the backlight source 162, the circuit board 151 preferably has a light source circuit for driving the backlight source 162. The backlight source 162 can be disposed on the circuit board 151 and electrically connected to the light source circuit of the circuit board 151 to emit light into the light guiding rod 161 and then out of the keycap of the optical keyswitch 10. In an embodiment, the backlight source 162 is preferably a light-emitting diode, and the wavelength of the light emitted from the backlight source 162 is preferably different from the wavelength of the optical signal emitted from the emitter 152, so as to reduce interference, but not limited thereto.

Figure 3A:
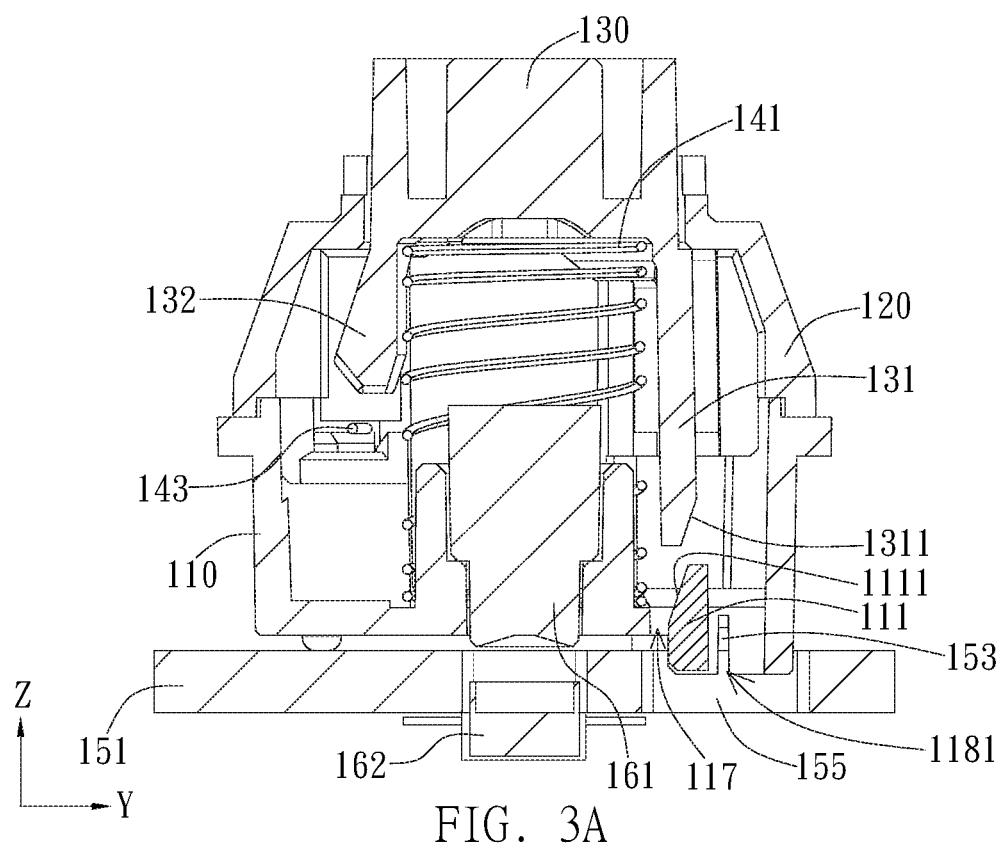
FIGS. 3A to 3D are cross-sectional views of FIG. 10 along the cutting line BB with the upper casing at different positions during the stroke.
Figure 3B:
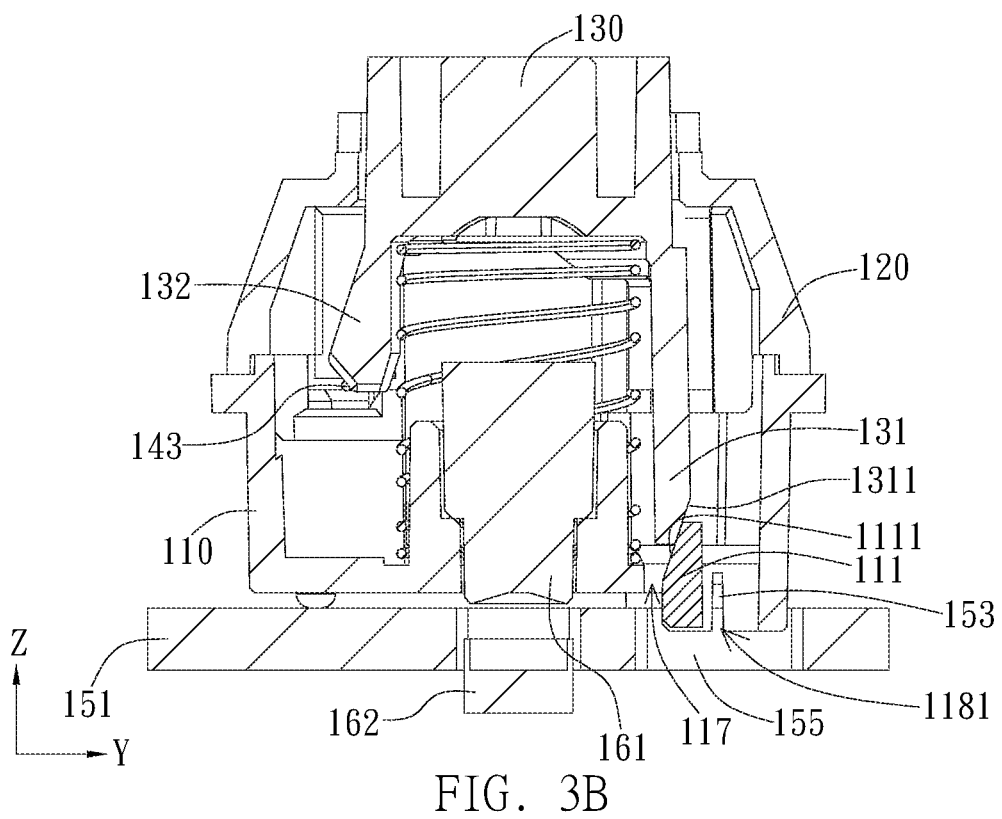
Figure 3C:
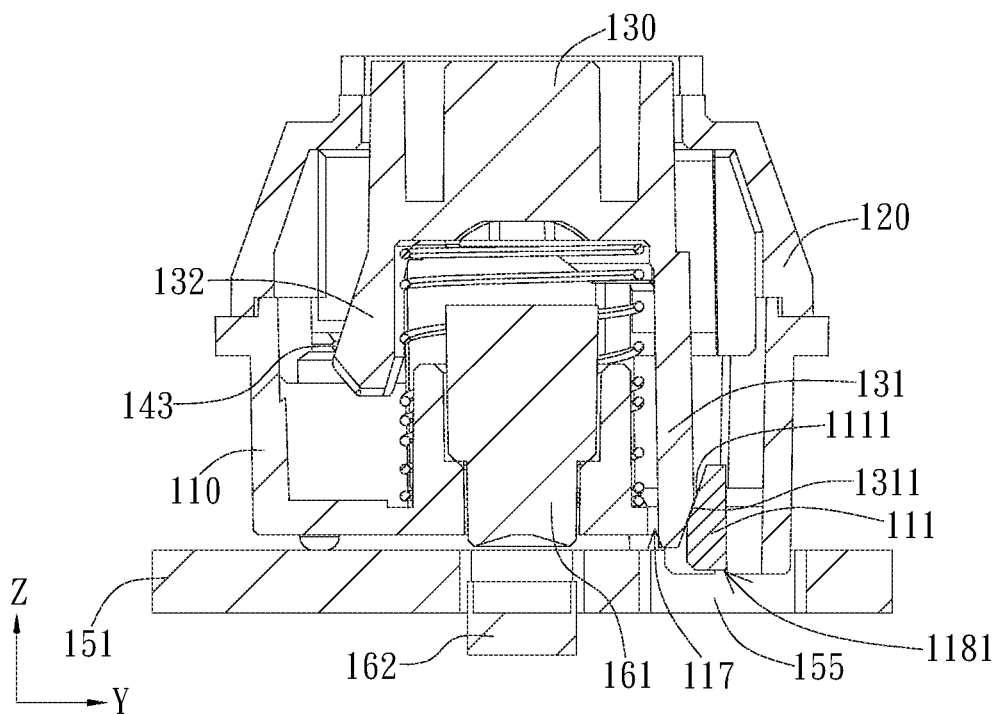
Figure 3D:
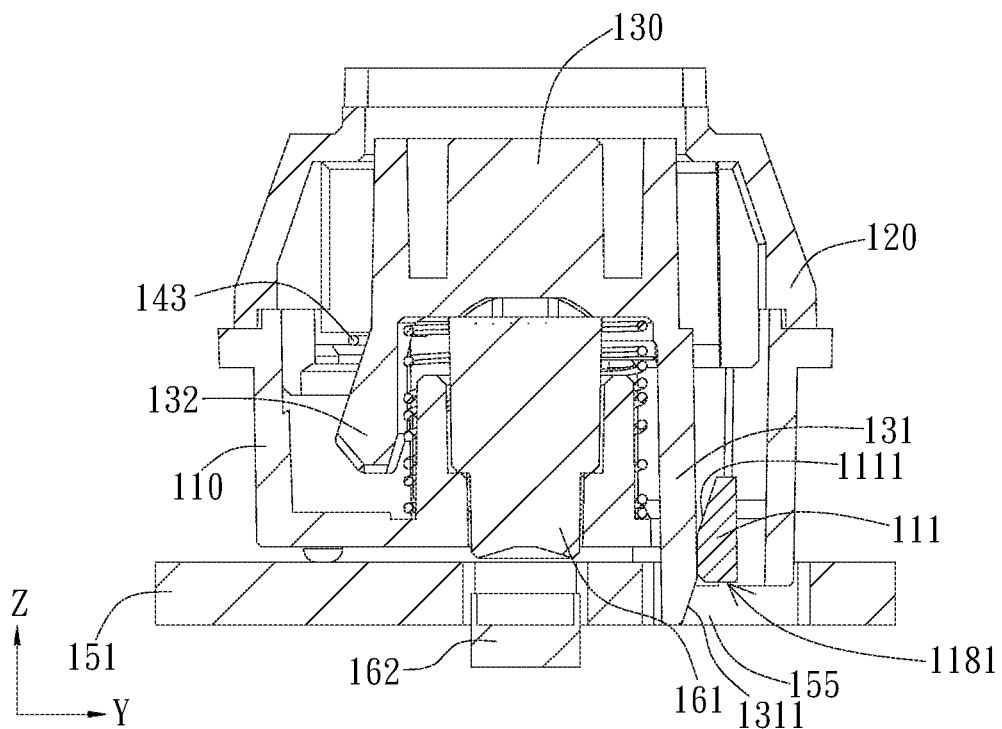

Referring to FIGS. 3A to 3D, the operation of the optical keyswitch 10 of FIG. 1A will be illustrated. FIGS. 3A to 3D are cross-sectional views of FIG. 10 along the cutting line BB with the upper casing 120 at different positions during the stroke. For example, FIG. 3A shows the optical keyswitch 10 at the non-pressed position, FIG. 3B shows the contact position of the activating portion 131 contacting the movable portion 111, FIG. 3C shows the optical keyswitch 10 at the triggering position, and FIG. 3D shows the optical keyswitch 10 at the lowest position. As shown in FIG. 3A, when the shaft 130 is at the non-pressed position, the activating portion 131 at least partially overlaps the movable portion 111 in a direction parallel to the up-down path. For example, when the shaft 130 is at the non-pressed position, the activating portion 131 and the movable portion 111 preferably at least partially overlap with each other in the Z axis direction, i.e. the vertical projections of the activating portion 131 and the movable portion 111 on the lower casing 110 at least partially overlap with each other. Moreover, when the shaft 130 is at the non-pressed position, the movable portion 111 has a first relation with the optical path, and the optical signal received by the receiver 153 has the first intensity. In this embodiment, when the shaft 130 is at the non-pressed position, the movable portion 111 has a less portion entering the optical path and blocks a less amount of the optical signal, so that the first intensity of the optical signal received by the receiver 153 is stronger. For example, when the shaft 130 is at the non-pressed position, the horizontal extension axis L of the movable portion 111 preferably does not pass through the slit 1811, i.e. the movable portion 111 is preferably located at one side of the virtual connecting line (i.e. the optical path) of the emitter 152, the slits 1811, and the receiver 153, so that the optical signal emitted by the emitter 152 is received by the receiver 153 without being interfered by the movable portion 111, and the first intensity is stronger, i.e. the optical signal is not blocked or attenuated.

As shown in FIGS. 3B to 3D, when the shaft 130 moves, in response to the pressing force, from the non-pressed position to the pressed position along the up-down path, the shaft 130 compresses the resilient member 140 and pushes the movable portion 111 to move, so the movable portion 111 no longer has the first spatial relation with the optical path, the optical signal received by the receiver 153 has a second intensity different from the first intensity, and the switch module 150 is triggered to generate the triggering signal. In other words, when the shaft 130 moves along the up-down path toward the lower casing 110 to the pressed position, the activating portion 131 pushes the movable portion 111 to move and changes the spatial relation of the movable portion 111 and the optical path, so that the intensity of the optical signal received by the receiver 153 is changed and the switch module 150 is triggered to generate the triggering signal. In this embodiment, the first spatial relation refers that the movable portion 111 is away from the optical path, and the movable portion 111 substantially does not change the intensity of the optical signal received by the receiver 153. When the movable portion 111 no longer has the first spatial relation with the optical path, it means that the movable portion 111 enters the optical path and at least partially blocks the optical signal received by the receiver 153, i.e. the intensity of the optical signal is attenuated, so that the second intensity is smaller than the first intensity, and the switch module 150 is triggered to generate the triggering signal.

Specifically, as shown in FIG. 3B, when the shaft 130 is driven by the keycap to move toward the lower casing 110 along the up-down path, the activating portion 131 moves downward along with the shaft 130, so that the distal end (i.e. the lower end) of the activating portion 131 contacts the movable portion 111. For example, the activating portion 131 at least partially overlaps the movable portion 111 in the direction parallel to the up-down path (e.g. the Z axis direction), i.e. at least a portion of the movable portion 111 is located at the up-down path of the activating portion 131, so that when the activating portion 131 moves downward, the lower end of the activating portion (e.g. the first inclined surface 1311) contacts the top end of the movable portion 111 (e.g. the second inclined surface 1111).

As shown in FIG. 3C, when the shaft 130 continuously moves toward the lower casing 110 along the up-down path to the triggering position, the first inclined surface 1311 of the activating portion 131 moves relative to the second inclined surface 1111 of the movable portion 111 to push the movable portion 111 to laterally move with respect to the up-down path and to change the spatial relation of the movable portion 111 and the optical path, so that the intensity of the optical signal received by the receiver 153 is changed and the switch module 150 is triggered to generate the triggering signal. For example, when the shaft 130 moves toward the lower casing 110 along the up-down path to the triggering position, the movable portion 111 laterally moves away from the up-down path and has a larger portion entering the optical path, so the movable portion 111 blocks a larger amount of the optical signal, and the second intensity of the optical signal received by the receiver 153 is smaller, i.e. smaller than the first intensity. As such, the switch module 150 is triggered to generate the triggering signal. Specifically, when the shaft 130 moves along the up-down path and pushes the movable portion 111 to laterally move, the activating portion 131 at least partially contacts the movable portion 111 in a direction perpendicular to the up-down path. That is, the first inclined surface 1311 contacting the second inclined surface 1111 moves downward to generate a lateral dividing force and push the movable portion 111 to laterally move in a direction away from the activating portion 131, i.e. toward the optical path. In an embodiment, when the movable portion 111 laterally moves away from the up-down path, the horizontal extension axis L preferably passes through the slit 1811, so that the movable portion 111 substantially completely blocks the optical signal emitted from the emitter 152, so the optical signal cannot be received by the receiver 153, i.e. the second intensity is zero. It is noted that by modifying the circuit design of the circuit board 151, the switch module 150 can generate the triggering signal based on the variation in intensity of the optical signal received by the receiver 153, or based on whether the receiver 153 receives the optical signal.

As shown in FIG. 3D, when the shaft 130 is at the pressed position (e.g. the lowest position), the distal end of the activating portion 131 extends beyond the movable portion 111 into the receiving space 155. Specifically, when the shaft 130 continuously moves from the triggering position to the lowest portion, the activating portion 131 passes through the opening 117 and protrudes from the bottom of the lower casing 110 into the receiving space 155 of the circuit board 151, so that the stroke distance can be increased and the operation feeling is enhanced. When the pressing force is released, by means of the restoring force provided by the resilient member 140 (i.e. the spring portion 141), the shaft 130 returns to the non-pressed position shown in FIG. 3A, and the movable portion 111 bounces back to its original position.

Figure 4A:
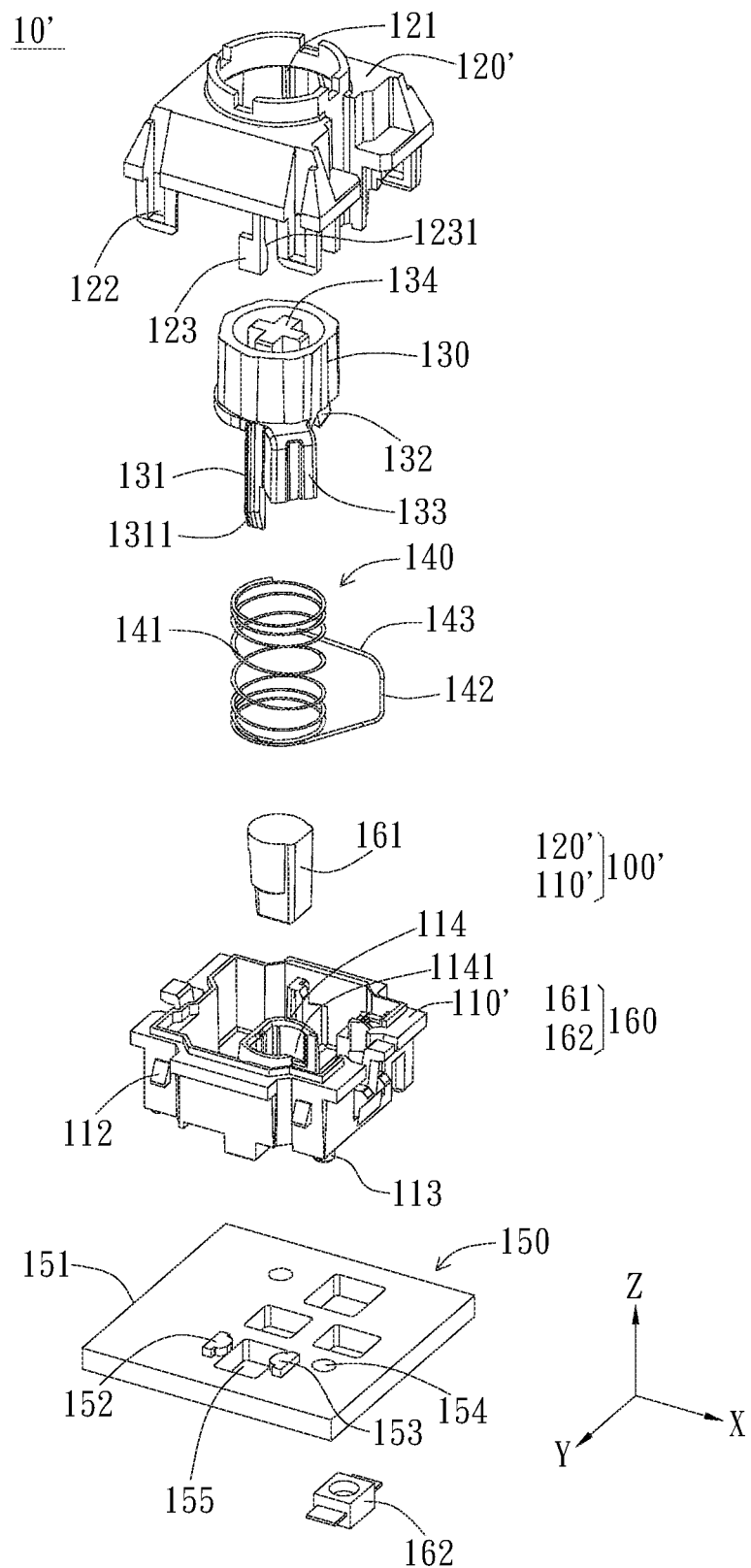
FIGS. 4A and 4B are exploded views of a second embodiment of the optical keyswitch of the invention from different viewing angles.
Figure 4B:
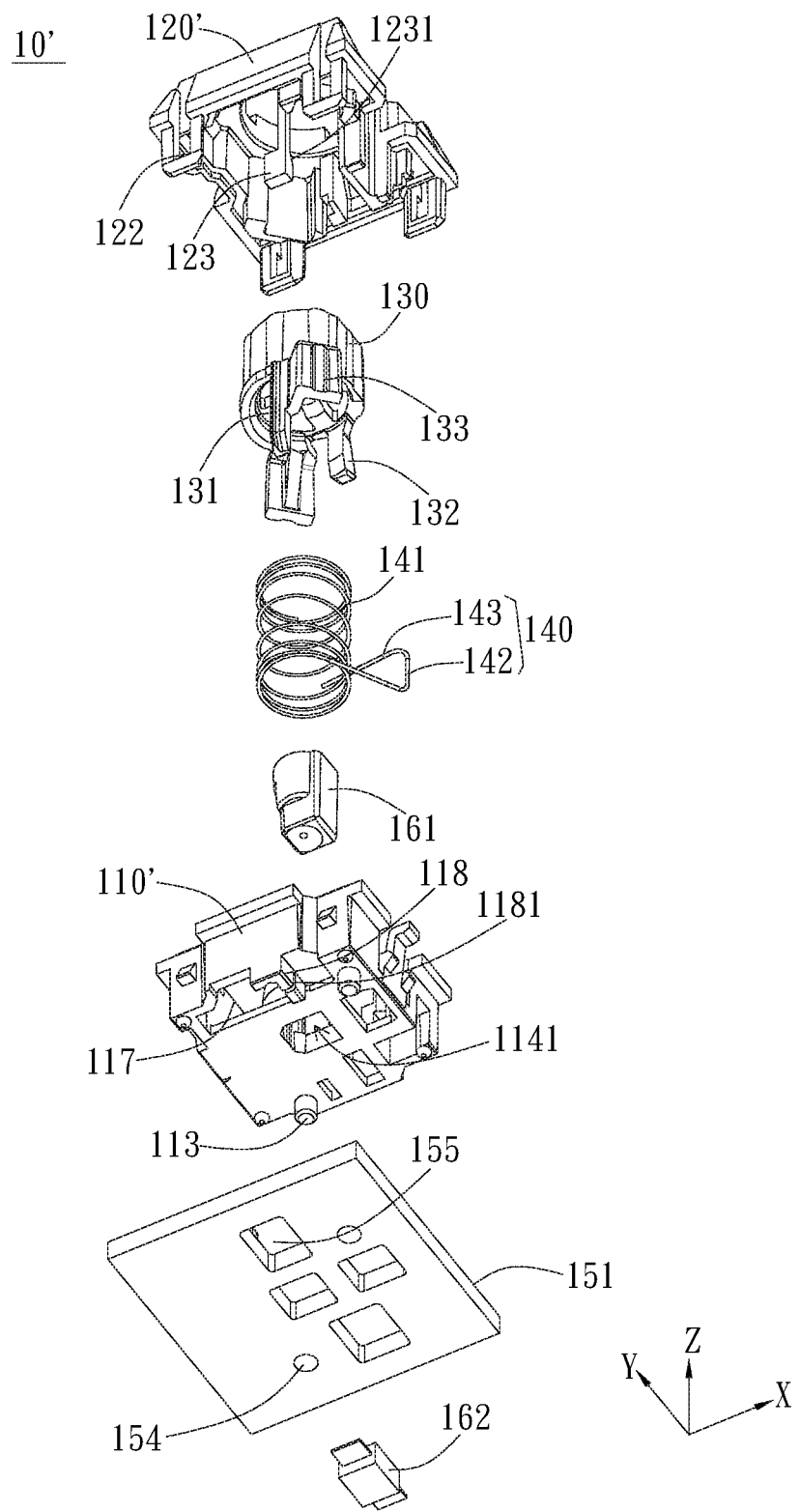
Figure 4C:
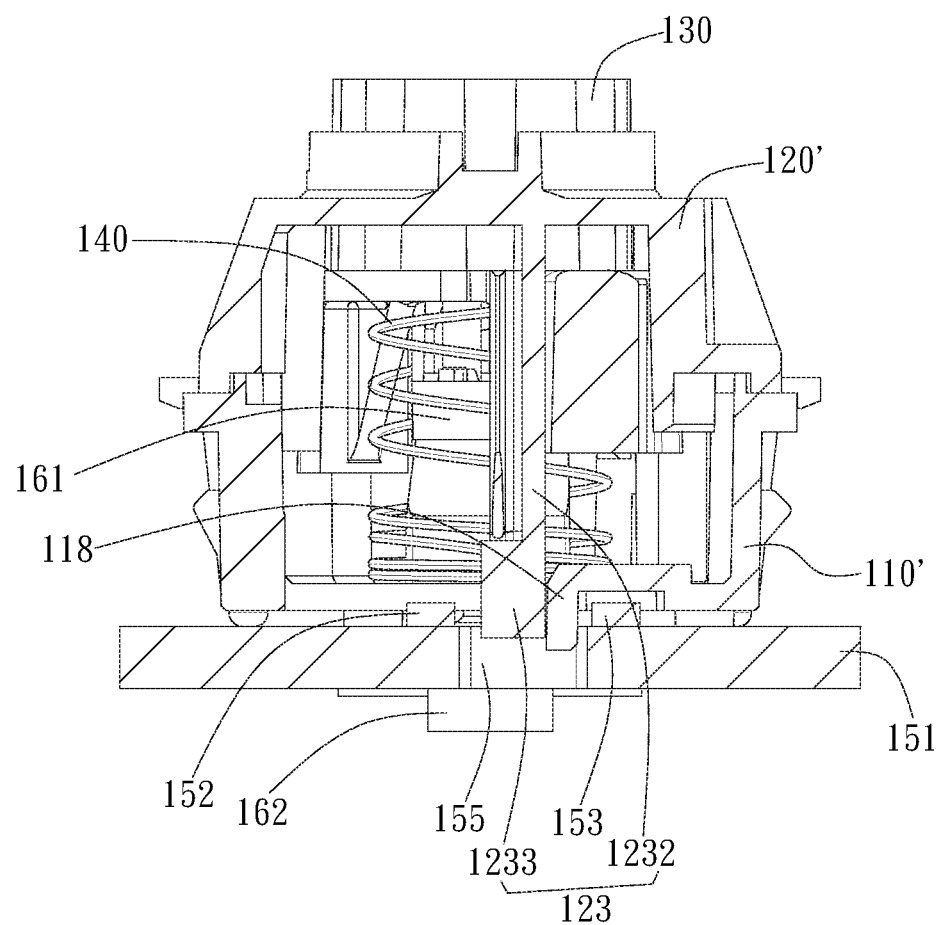
FIG. 4C is a cross-sectional view of the optical keyswitch of the second embodiment.

FIGS. 4A to 5D are schematic views of a second embodiment of the invention. FIGS. 4A and 4B are exploded views of the optical keyswitch from different viewing angles, and FIG. 4C is a cross-sectional view of the optical keyswitch. As shown in FIGS. 4A to 4C, the optical keyswitch 10' of the second embodiment includes a casing 100', the shaft 130, the resilient member 140, and the switch module 150. The optical keyswitch 10' may further include the backlight unit 160. The optical keyswitch 10' of FIG. 4A is different from the optical keyswitch 10 of FIG. 1A in that the lower casing 110' does not have the movable portion 111, and a movable portion 123 is disposed on the upper casing 120'. Therefore, the structure and the connection of the rest components of the optical keyswitch 10', such as the shaft 130, the resilient member 140, the switch module 150, and the backlight unit 160, as well as the corresponding structure of the casing 100', can refer to the related descriptions of the optical keyswitch 10 of the first embodiment, and will not elaborate again. Hereinafter, the difference of this embodiment from the first embodiment will be illustrated.

In this embodiment, the casing 100' includes an upper casing 120' and a lower casing 110'. The movable portion 123 is preferably a flexible arm extending downward from the lower surface of the upper casing 120' and corresponds to the opening 117 of the lower casing 110'. Specifically, the movable portion 123 is preferably an L-shape flexible arm including a connection portion 1232 and a shielding portion 1233. One end of the connection portion 1232 is connected to the upper casing 120', and the other end of the connection portion 1232 is connected to the shielding portion 1233. Specifically, the connection portion 1232 preferably extends parallel to the up-down path without interfering with the up-down path, and the shielding portion 1233 is a free end of the movable portion 123. The shielding portion 1233 preferably extends parallel to the bottom of the lower casing 110' from the distal end of the connection portion 1232. The shielding portion 1233 preferably corresponds to the activating portion 131 and located in the opening 117 (or above the opening 117) of the lower casing 110'. Moreover, the size (e.g. width and length) of shielding portion 1233 of the movable portion 123 is preferably equal to or larger than the size of the slit 1181, so that the movable portion 123 deforms or shifts in response to the movement of the activating portion 131, the shielding portion 1233 can selectively block the slit 1181. It is noted that the movable portion 123 is illustrated as the L-shape flexible arm including the connection portion 1232 and the shielding portion 1233 in this embodiment, but not limited thereto. In other embodiments, according to practical applications, the movable portion 123 can be a flexible arm of any suitable shape, so that the movable portion 123 has a free end corresponding to the activating portion 131 and a connection end connected to the upper casing 120', and the free end is movable or deformable relative to the connection end in response to the pushing force of the activating portion 131.

Moreover, the movable portion 123 preferably has a second inclined surface 1231 corresponding to the first inclined surface 1311 of the activating portion 131. Specifically, the second inclined surface 1231 is preferably an inner surface of the shielding portion 1233, i.e. a lateral surface facing the shaft 130, and the second inclined surface 1231 extends downward along the Z axis direction and inclines outward, so that the second inclined surface 1231 corresponds to the first inclined surface 1311.

Figure 5A:
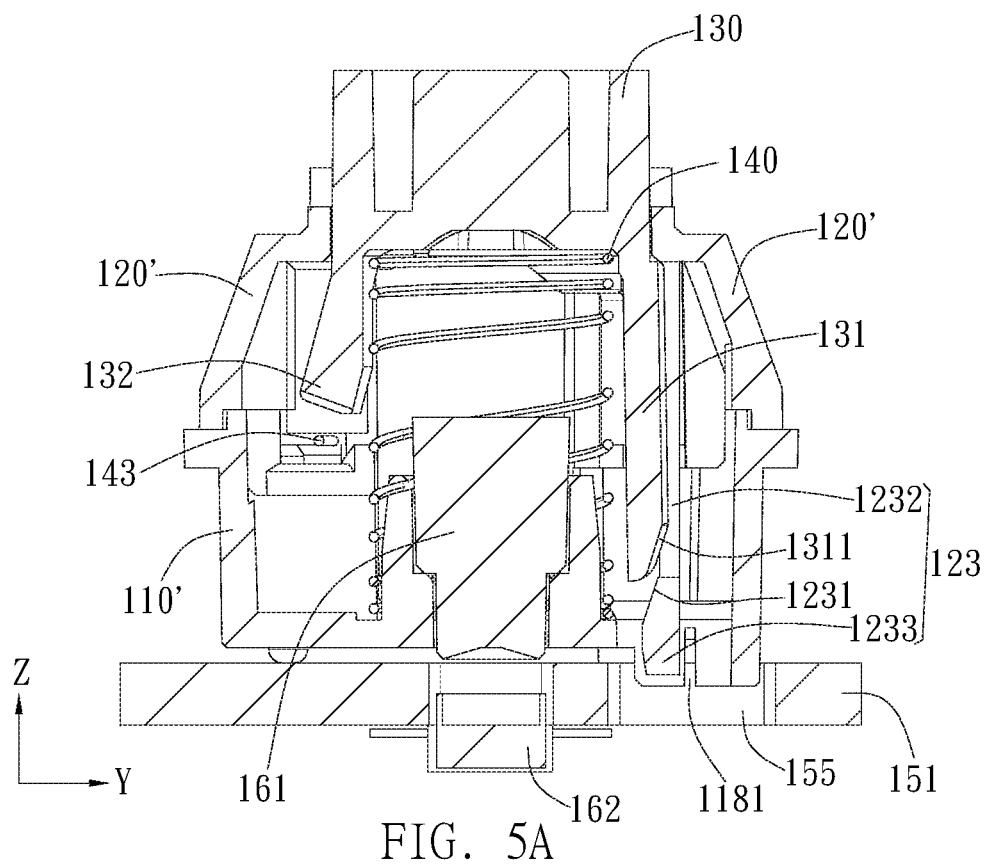
FIGS. 5A to 5D are cross-sectional views of FIG. 4A at different positions during the stroke.

Referring to FIGS. 5A to 5D, the operation of the optical keyswitch 10' of FIG. 4A will be illustrated. FIGS. 5A to 5D are cross-sectional views showing the optical keyswitch 10' at the non-pressed position, the contact position of the activating portion 131 contacting the movable portion 123, the triggering position, and the lowest position, respectively. As shown in FIG. 5A, when the shaft 130 is at the non-pressed position, the activating portion 131 at least partially overlaps the movable portion 123 in a direction parallel to the up-down path. For example, when the shaft 130 is at the non-pressed position, the activating portion 131 and the shielding portion 1233 of the movable portion 123 preferably at least partially overlap with each other in the Z axis direction, i.e. the vertical projections of the activating portion 131 and the movable portion 123 on the lower casing 110' at least partially overlap with each other. Moreover, when the shaft 130 is at the non-pressed position, the movable portion 123 has a first relation with the optical path, and the optical signal received by the receiver 153 has the first intensity. In this embodiment, when the shaft 130 is at the non-pressed position, the shielding portion 1233 of the movable portion 123 has a less portion entering the optical path, so the movable portion 123 blocks a less amount of the optical signal, and the first intensity of the optical signal received by the receiver 153 is stronger. For example, when the shaft 130 is at the non-pressed position, the horizontal extension axis of the shielding portion 1233, which is substantially parallel to the optical path, preferably does not pass through the slit 1811. That is, the movable portion 123 is preferably located at one side of the virtual connecting line (i.e. the optical path) of the emitter 152, the slits 1811, and the receiver 153, so that the optical signal emitted by the emitter 152 is received by the receiver 153 without being interfered by the movable portion 123, and the first intensity is stronger, i.e. the optical signal is not blocked or attenuated.

Figure 5B:
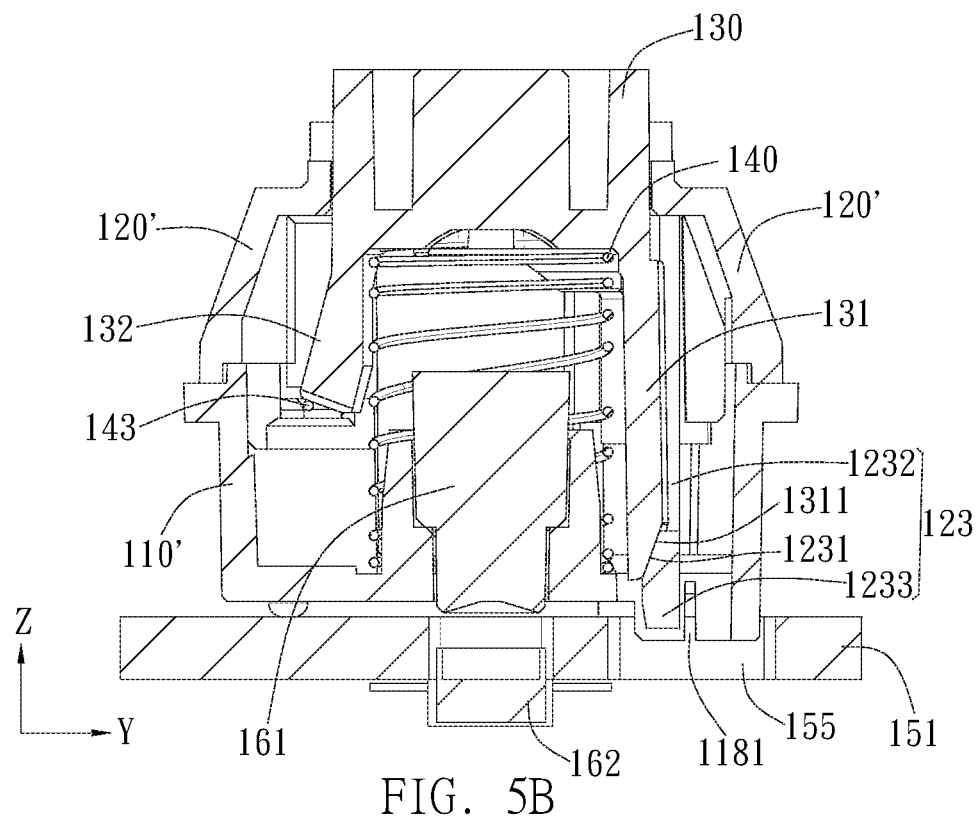
Figure 5C:
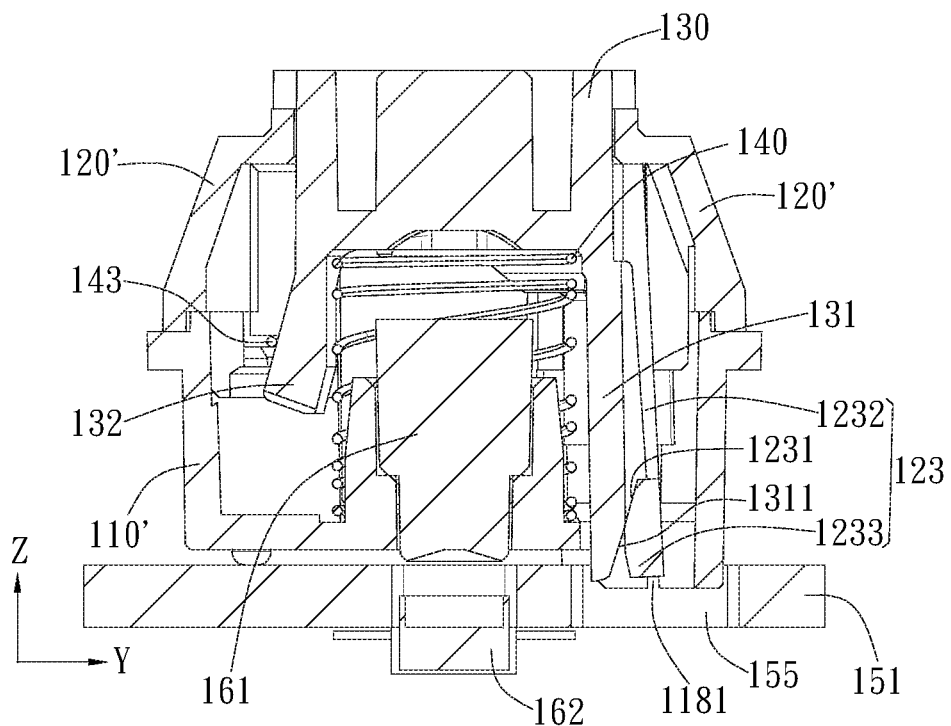
Figure 5D:
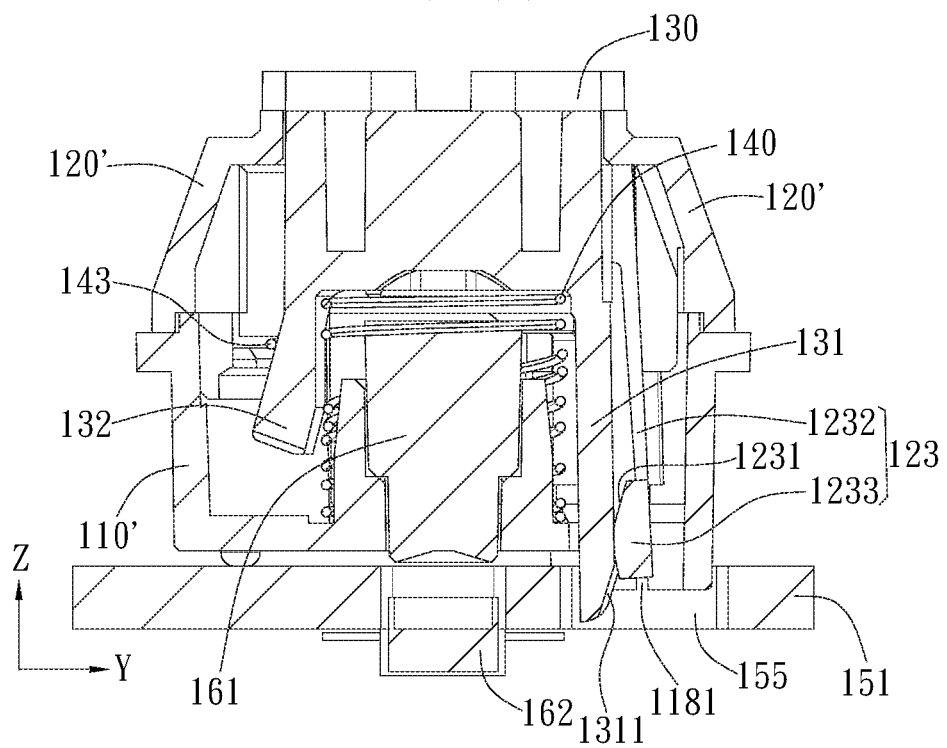

As shown in FIGS. 5B to 5D, when the shaft 130 moves, in response to the pressing force, from the non-pressed position to the pressed position along the up-down path, the shaft 130 compresses the resilient member 140 and pushes the movable portion 123 to move, so that the movable portion 123 no longer has the first spatial relation with the optical path, the optical signal received by the receiver 153 has a second intensity different from the first intensity, and the switch module 150 is triggered to generate the triggering signal. In other words, when the shaft 130 moves along the up-down path toward the lower casing 110' to the pressed position, the activating portion 131 pushes the movable portion 123 to move and changes the spatial relation of the movable portion 123 and the optical path, so that the intensity of the optical signal received by the receiver 153 is changed, and the switch module 150 is triggered to generate the triggering signal. In this embodiment, the first spatial relation refers that the shielding portion 1233 of the movable portion 123 is away from the optical path, and the movable portion 123 substantially does not change the intensity of the optical signal received by the receiver 153. When the movable portion 123 no longer has the first spatial relation with the optical path, it means that the shielding portion 1233 of the movable portion 123 enters the optical path and at least partially blocks the optical signal received by the receiver 153, i.e. the intensity of the optical signal is attenuated, so that the second intensity is smaller than the first intensity, and the switch module 150 is triggered to generate the triggering signal.

Specifically, as shown in FIG. 5B, when the shaft 130 is driven by the keycap to move toward the lower casing 110' along the up-down path, the activating portion 131 moves downward along with the shaft 130, so that the distal end (i.e. the lower end) of the activating portion 131 contacts the shielding portion 1233 of the movable portion 123. For example, the activating portion 131 at least partially overlaps the movable portion 123 in the direction parallel to the up-down path (e.g. the Z axis direction), i.e. the shielding portion 1233 of the movable portion 123 is at least partially located at the up-down path of the activating portion 131, so that when the activating portion 131 moves downward, the lower end of the activating portion 131 (e.g. the first inclined surface 1311) contacts the top end of the movable portion 123 (e.g. the second inclined surface 1111 of the shielding portion 1231).

As shown in FIG. 5C, when the shaft 130 continuously moves toward the lower casing 110' along the up-down path to the triggering position, the first inclined surface 1311 of the activating portion 131 moves relative to the second inclined surface 1231 of the movable portion 123 to push the movable portion 123 to laterally move and to change the spatial relation of the movable portion 123 and the optical path, so that the intensity of the optical signal received by the receiver 153 is changed, and the switch module 150 is triggered to generate the triggering signal. For example, when the shaft 130 moves toward the lower casing 110' along the up-down path to the triggering position, the shielding portion 1233 of the movable portion 123 laterally moves away from the up-down path and has a larger portion entering the optical path, so that the movable portion 123 blocks a larger amount of the optical signal, and the second intensity of the optical signal received by the receiver 153 is smaller, i.e. smaller than the first intensity. As such, the switch module 150 is triggered to generate the triggering signal. Specifically, when the shaft 130 moves along the up-down path and pushes the movable portion 123 to laterally move, the activating portion 131 at least partially contacts the shielding portion 1233 of the movable portion 123 in a direction perpendicular to the up-down path, e.g. the Y axis direction. That is, the first inclined surface 1311 contacting the second inclined surface 1231 moves downward to generate a lateral dividing force and push the movable portion 123 to laterally move in a direction away from the activating portion 131, i.e. toward the optical path. In an embodiment, when the movable portion 123 laterally moves away from the up-down path, the horizontal extension axis of the shielding portion 1233 preferably passes through the slit 1811, so that the movable portion 123 substantially completely blocks the optical signal emitted from the emitter 152, so the optical signal cannot be received by the receiver 153, i.e. the second intensity is zero.

As shown in FIG. 5D, when the shaft 130 is at the pressed position, the distal end of the activating portion 131 extends beyond the movable portion 123 into the receiving space 155 of the circuit board 151. Specifically, when the shaft 130 continuously moves from the triggering position to the lowest portion, the activating portion 131 passes through the opening 117 and protrudes from the bottom of the lower casing 110' into the receiving space 155 of the circuit board 151, so that the stroke distance can be increased and the operation feeling is enhanced. When the pressing force is released, by means of the restoring force provided by the resilient member 140 (i.e. the spring portion 141), the shaft 130 returns to the non-pressed position shown in FIG. 5A, and the movable portion 123 bounces back to its original position.

It is noted that in the previous embodiments, the movable portion 111 or 123 is pushed by the activating portion 131 into the optical path, but not limited thereto. In other embodiments, the design of the movable portion 111 or 123 can be modified, so that when the shaft 130 is at the non-pressed position, the movable portion 111 or 123 has a larger portion entering the optical path to block a larger amount of the optical signal, and when the shaft 130 is at the pressed position, the movable portion 111 or 123 is pushed by the activating portion 131 to laterally move away from the optical path, so that the movable portion 111 or 123 blocks a less amount of the optical signal, i.e. the second intensity is larger than the first intensity, and the switch module 150 is triggered to generate the triggering signal. Moreover, in the previous embodiments, the movable portion 111 or 123 is preferably integrally formed with the lower casing 110 or the upper casing 120', but not limited thereto. In other embodiments, the movable portion 111 or 123 can be attached to the lower casing 110 or the upper casing 120' by suitable connecting techniques, such as adhering, engaging, or securing.

Figure 6A:
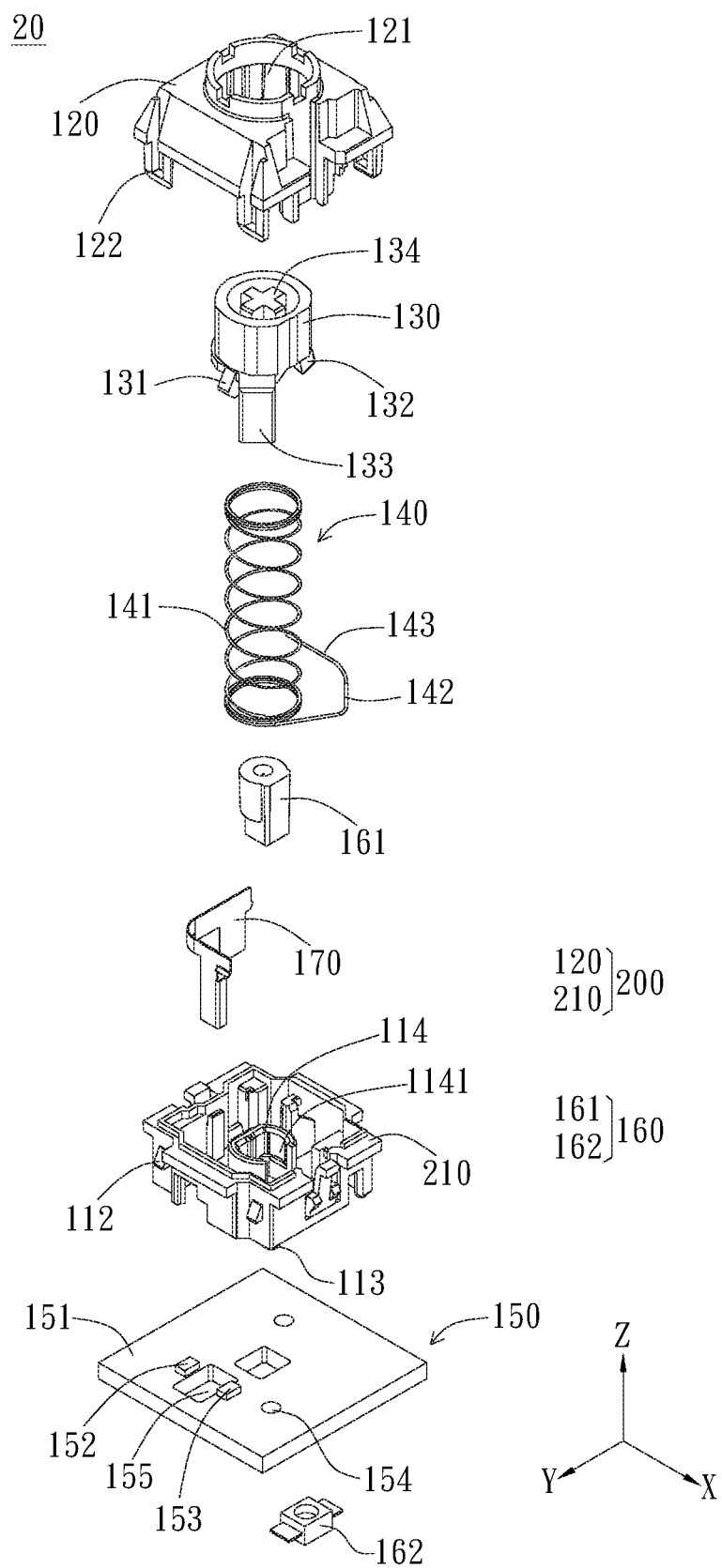
FIGS. 6A and 6B are exploded views of a third embodiment of the optical keyswitch of the invention from different viewing angles.
Figure 6B:
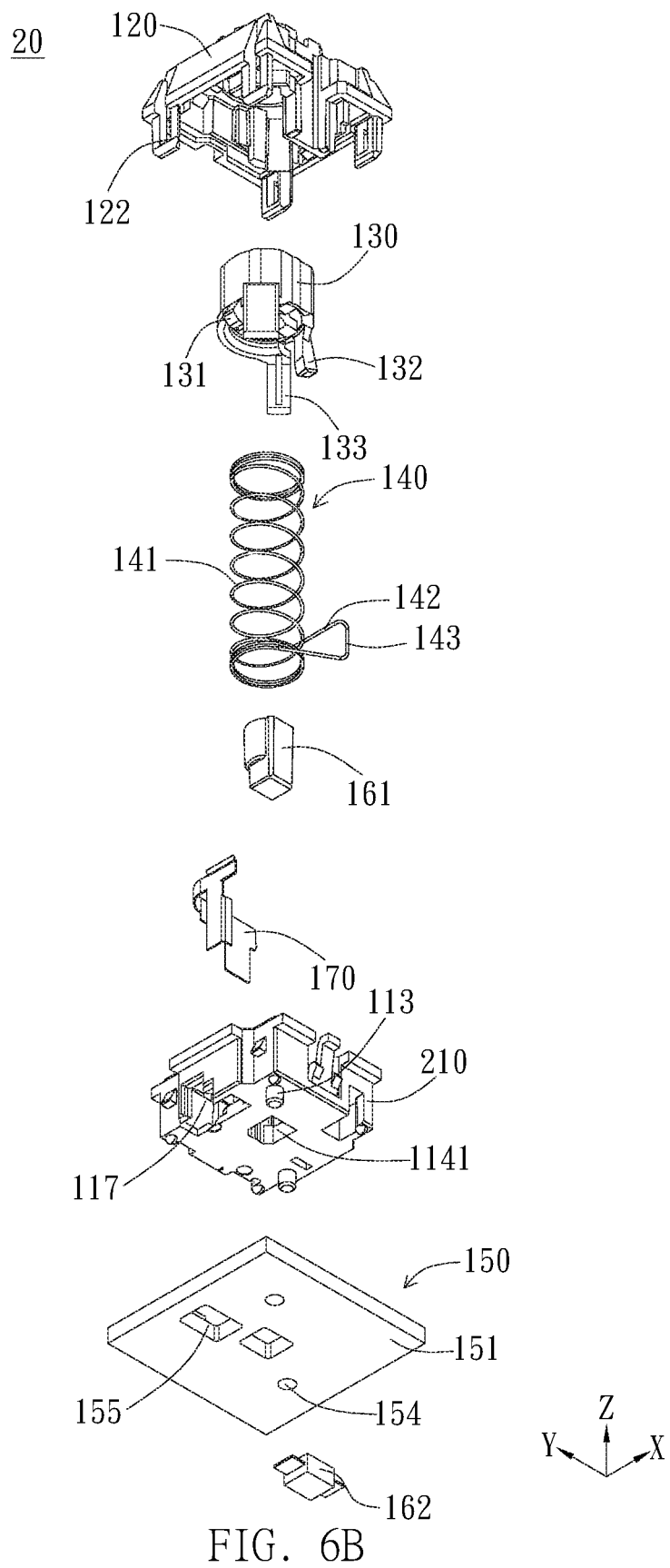

FIGS. 6A to 8B are schematic views of a third embodiment of the invention. FIGS. 6A and 6B are exploded views of the optical keyswitch from different viewing angles, FIG. 6C is a schematic top view of the optical keyswitch of FIG. 6A without the upper casing, and FIG. 6D is a partially cutout view of the optical keyswitch of FIG. 6A without the upper casing. As shown in FIGS. 6A to 6D, the optical keyswitch 20 of the third embodiment includes a casing 200, the shaft 130, the resilient member 140, the switch module 150, and a shielding baffle 170. The shaft 130 is movably disposed on the casing 200. In response to a pressing force, the shaft 130 moves along an up-down path from a non-pressed position to a pressed position. The resilient member 140 is accommodated in the casing 200. The resilient member 140 couples the shaft 130 and enables the shaft 130 to return to the non-pressed position when the pressing force is released. The switch module 150 includes a circuit board 151, an emitter 152, and a receiver 153. The emitter 152 and the receiver 153 are electrically connected to the circuit board 151, and the emitter 152 emits an optical signal along an optical path to the receiver 153. The shielding baffle 170 is disposed on the casing 200. When the shaft 130 is at the non-pressed position, the shielding baffle 170 has a first spatial relation with the optical path, and the receiver 153 receives the optical signal of a first intensity. When the shaft 130 moves, in response to the pressing force, from the non-pressed position to the pressed position along the up-down path, the shaft 130 compresses the resilient member 140 and drives the shielding baffle 170 to move, so the shielding baffle 170 no longer has the first spatial relation with the optical path, the optical signal received by the receiver 153 has a second intensity different from the first intensity, and the switch module 150 is triggered to generate a triggering signal.

It is noted that similar to the previous embodiments, the optical keyswitch 20 of the embodiment may optionally include the backlight unit 160 including the light guiding rod 161 and the backlight source 162. The structure and the connection of the rest components of the optical keyswitch 20, such as the shaft 130, the resilient member 140, the switch module 150, and the backlight unit 160 can refer to the related descriptions of the optical keyswitch 10 or 10' of the previous embodiments, and will not elaborate again.

Figure 6C:
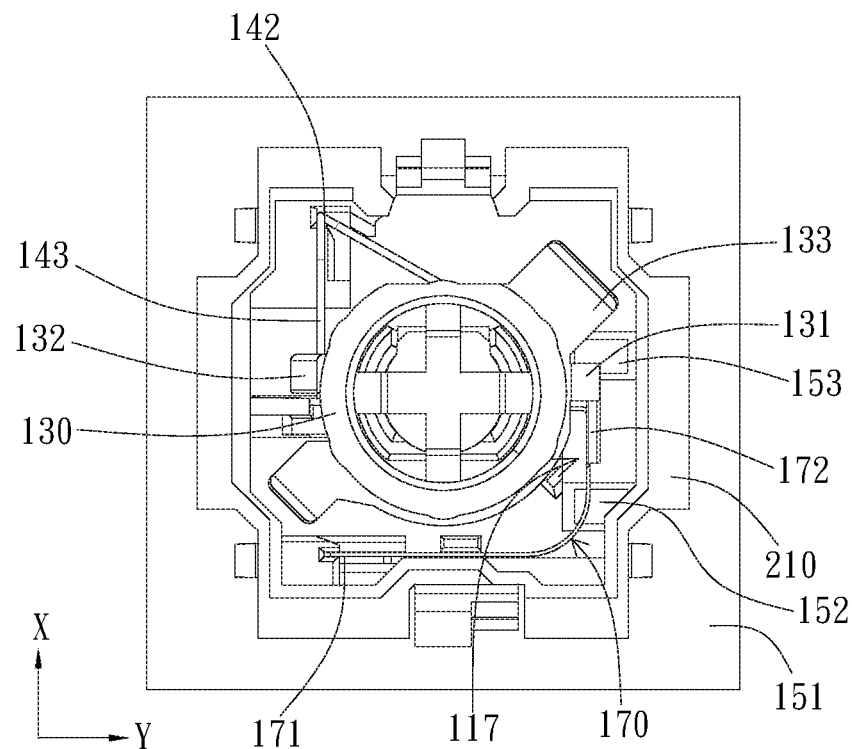
FIG. 6C is a schematic top view of the optical keyswitch of FIG. 6A without the upper casing.
Figure 6D:
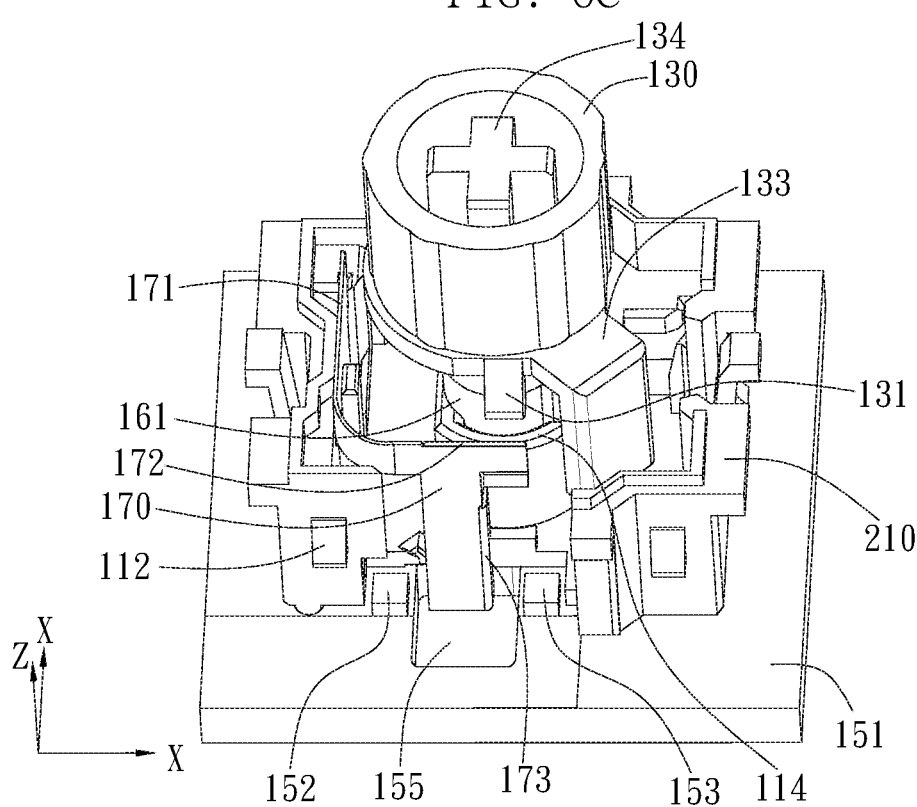
FIG. 6D is a partially cutout view of the optical keyswitch of FIG. 6A without the upper casing
Figure 7:
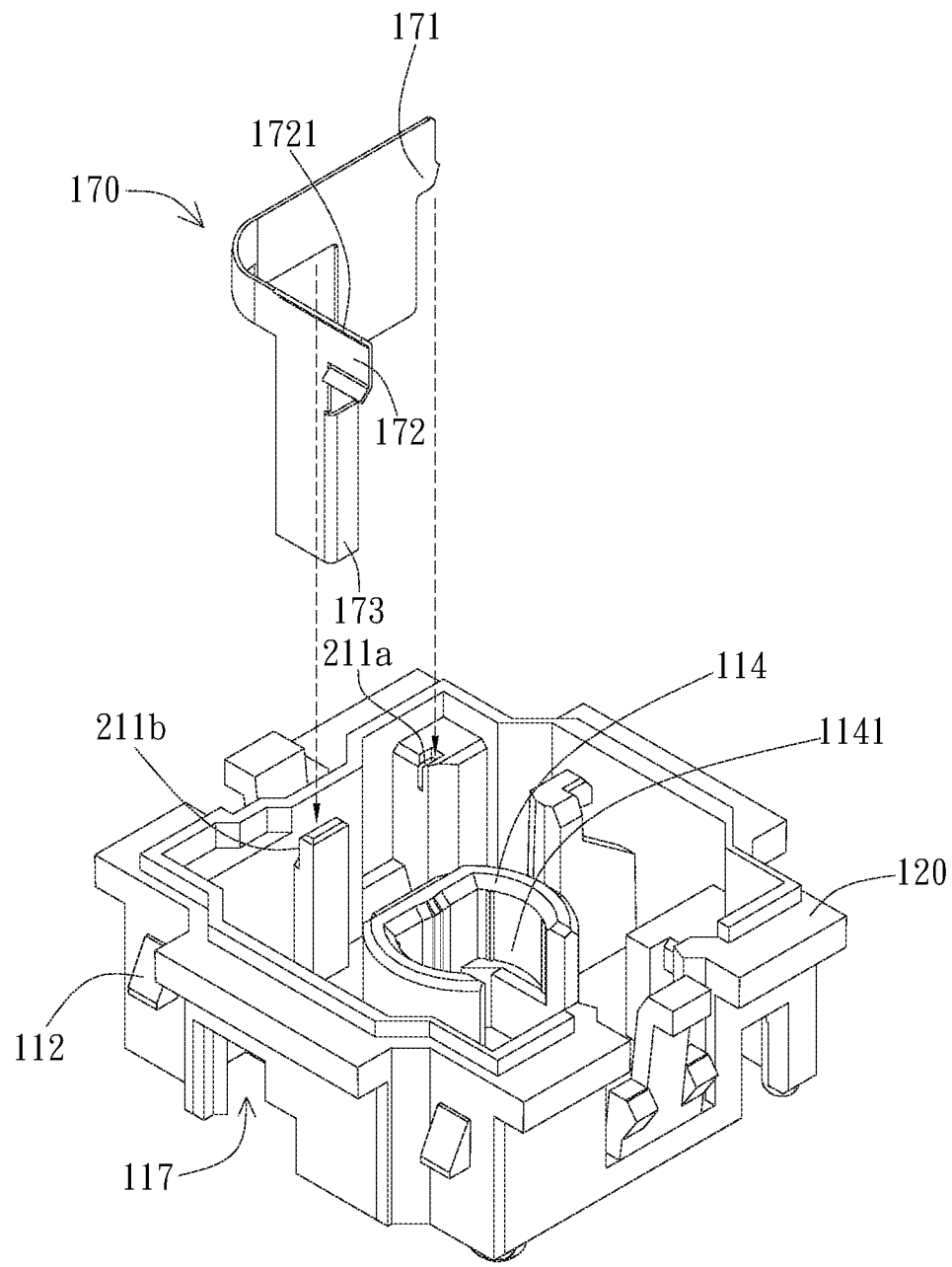
FIG. 7 is an assembly view of the lower casing and the shielding baffle in an embodiment of the invention.

In this embodiment, the casing 200 includes the upper casing 120 and a lower casing 210, and the shielding baffle 170 is disposed in the lower casing 210. It is noted that the structure detail of the upper casing 120, such as the through hole 121 and the upper engaging portion 122, and the partial structure detail of the lower casing 210, such as the lower engaging portion 112, the positioning portion 113, the coupling portion 114, the limiting portion 115, the opening 117, can be referred to the related descriptions of the embodiment of FIG. 1A and will not elaborate again. Also referring to FIG. 7, the structure of the shielding baffle 170 and the connection of the shielding baffle 170 and the lower casing 210 will be illustrated. As shown in FIGS. 6C-6D and FIG. 7, the shielding baffle 170 is preferably a flexible piece, such as metal baffle or plastic baffle. In an embodiment, the shielding baffle 170 includes a positioning portion 171, a passive portion 172, and a shielding portion 173. The positioning portion 171 and the passive portion 172 are disposed on two opposite sides of the shielding baffle 170, and the shielding portion 173 is connected to the passive portion 172. The positioning portion 171 is configured to connect the lower casing 210, so that the shielding baffle 170 can be positioned on the lower casing 210. Specifically, the positioning portion 171 is located at the connecting end of the shielding baffle 170, and the passive portion 172 and the shielding portion 173 are located at the free end of the shielding baffle 170. The passive portion 172 corresponds to the activating portion 131 of the shaft 130 and moves in response to the movement the activating portion 131 of the shaft 130, so that the spatial relation (or relative position) of the shielding portion 173 with the optical path can be changed. For example, in this embodiment, the shielding baffle 170 can be formed by bending a T-shaped metal sheet. The horizontal upper portion of the T-shaped metal sheet can be bent to have an L shape, and the positioning portion 171 and the passive portion 173 are located at the two ends of the L shape upper portion to correspond to two adjacent sides of the lower casing 210. In other words, the positioning portion 171 and the passive portion 172 are connected to have an L shape or an arch shape. The vertical lower portion of the T shape metal sheet can serve as the shielding portion 173, and the shielding portion 173 is preferably connected to the lower side of the passive portion 172.

Corresponding to the positioning portion 171 of the shielding baffle 170, the lower casing 210 has grooves 211a and 211b. The shielding baffle 170 can be fixed on the lower casing 210 by inserting the positioning portion 171 into the grooves 211a, and 211b. As such, the passive portion 172 and the shielding portion 173 are located at the free end of the shielding baffle 170 and can move or deform relative to the positioning portion 171. Corresponding to the activating portion 131, the passive portion 172 preferably has an inclined surface 1721, so that the activating portion 131 can move along the inclined surface 1721 to push the passive portion 172 and the shielding portion 173 to move. In this embodiment, the inclined surface 1721 is preferably disposed on top of the passive portion 172. The inclined surface 1721 extends downward and inclines toward the activating portion 131. Moreover, the shielding portion 173 is preferably bent with respect to the passive portion 172 and extends outward, so that at least a portion of the shielding portion 173 can selectively interfere with the optical path. For example, the shielding portion 173 is partially bent toward the activating portion 131, so that when the passive portion 172 is driven by the activating portion 131 to move, the shielding portion 173 moves along with the passive portion 172 into or away from the optical path. In another embodiment, according to practical applications, the shielding portion 173 can be designed to partially bend and extend away from the activating portion 131. In addition, in this embodiment, the shielding baffle 170 is bent to have the positioning portion 171 and the passive portion 172 corresponding to two adjacent sides of the lower casing 210, but not limited thereto. In other embodiments, the positioning portion 171 and the passive portion 172 of the shielding baffle 170 can be disposed linearly, i.e. the positioning portion 171 and the passive portion 172 can be connected along a straight line to corresponding to a same side of the lower casing 210. For example, the shielding baffle 170 can be a T-shaped flexible sheet without bending the horizontal top portion.

Moreover, similar to the previous embodiments, the shielding portion 173 of the shielding baffle 170 preferably corresponds to the opening 117 of the lower casing 210, such as in the opening 117. When the shaft 130 moves, in response to the pressing force, from the non-pressed position to the pressed position, the activating portion 131 of the shaft 130 drives the shielding portion 173 of the shielding baffle 170 to move in the opening 117 by pushing the passive portion 172, so as to change the position of the shielding portion 173 relative to the optical path.

Figure 8A:
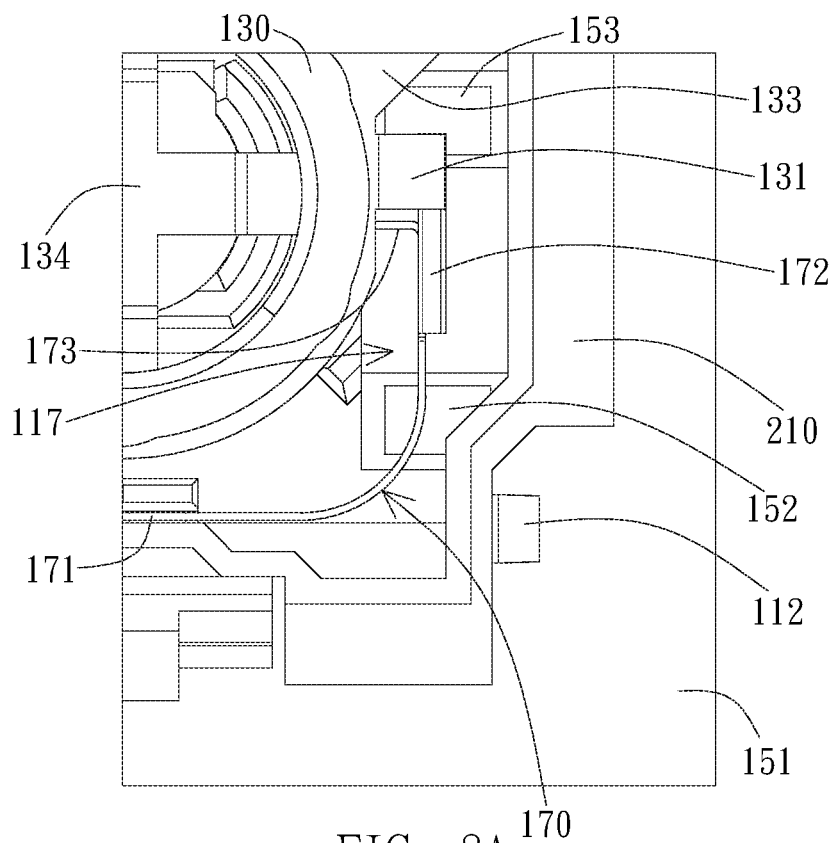
FIGS. 8A and 8B are partial top views of the optical keyswitch at the non-pressed position and the pressed position, respectively.
Figure 8B:
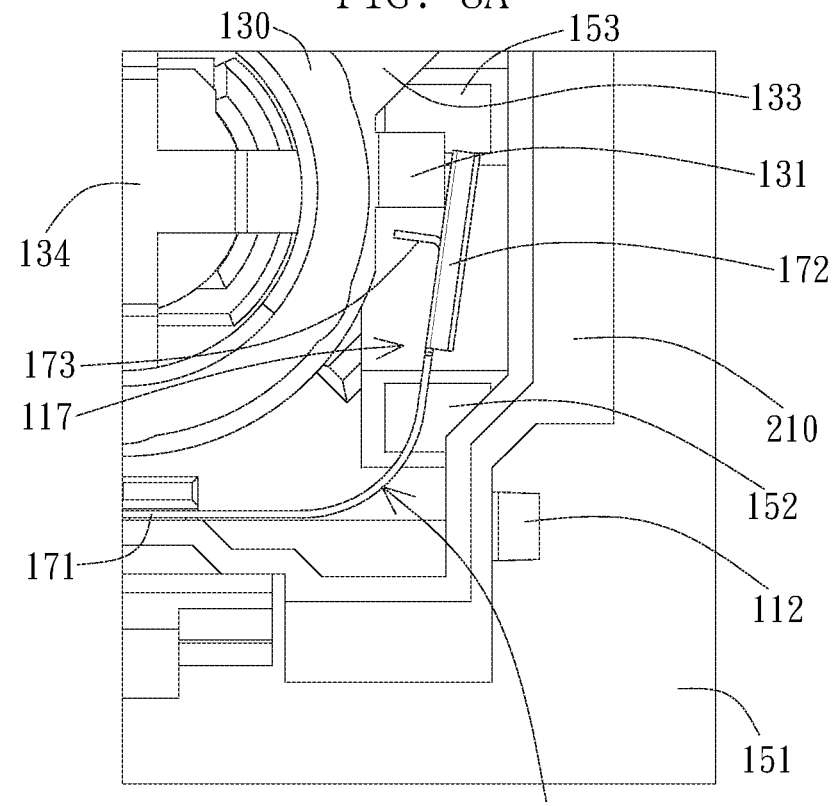

Referring to FIGS. 8A and 8B, the operation of the optical keyswitch 20 of FIG. 6A will be illustrated. FIGS. 8A and 8B are partial top views of the optical keyswitch 20 at the non-pressed position and the pressed position, respectively. As shown in FIG. 8A, when the shaft 130 is at the non-pressed position, the activating portion 131 preferably at least partially overlaps the shielding baffle 170 in a direction parallel to the up-down path. The shielding baffle 170 has the first spatial relation with the optical path, and the receiver 153 receives the optical signal of first intensity. For example, when the shaft 130 is at the non-pressed position, the activating portion 131 and the passive portion 172 preferably at least partially overlap with each other in the Z axis direction, i.e. the vertical projections of the activating portion 131 and the passive portion 172 on the lower casing 210 at least partially overlap with each other. More specifically, the passive portion 172 is preferably partially located on the up-down path. In this embodiment, when the shaft 130 is at the non-pressed position, the shielding baffle 170 has a less portion entering the optical path, so the shielding baffle 170 blocks a less amount of the optical signal, and the first intensity of the optical signal received by the receiver 153 is stronger. In other words, when the shaft 130 is at the non-pressed position, the shielding portion 173 has a less portion entering the optical path and blocks a less amount of the optical signal, so the first intensity of the optical signal received by the receiver 153 is relatively stronger. In an embodiment, when the shaft 130 is at the non-pressed position, the shielding portion 173 preferably substantially does not enter the optical path (or not block the slit 1181 of the grating portion 118 as described above). That is, the shielding portion 173 is preferably located at one side of the optical path of the emitter 152 and the receiver 153, so that the optical signal emitted by the emitter 152 is received by the receiver 153 without being interfered by the shielding portion 173, and the optical signal is not blocked or attenuated.

As shown in FIG. 8B, when the shaft 130 moves, in response to the pressing force, from the non-pressed position to the pressed position along the up-down path, the shaft 130 compresses the resilient member 140 and drives the shielding baffle 170 to move, so the shielding baffle 170 no longer has the first spatial relation with the optical path, the optical signal received by the receiver 153 has a second intensity different from the first intensity, and the switch module 150 is triggered to generate a triggering signal. In this embodiment, the first spatial relation refers that the passive portion 172 of the shielding baffle 170 has no substantial interference (or no contact) with the activating portion 131, and the shielding portion 173 of the shielding baffle 170 substantially does not change the intensity of the optical signal received by the receiver 153. When the shielding baffle 170 no longer has the first spatial relation with the optical path, it means that the passive portion 172 is driven by the activating portion 131 to move, so that the shielding portion 173 enters the optical path and at least partially blocks the optical signal. Therefore, the optical signal received by the receiver 153 is blocked or attenuated, i.e. the second intensity is smaller than the first intensity, and the switch module 150 is triggered to generate the triggering signal.

Specifically, when the shaft 130 moves to the pressed position, the shielding baffle 170 laterally moves away from the up-down path and has a larger portion entering the optical path, so the shielding baffle 170 blocks a larger amount of the optical signal, and the intensity of the optical signal received by the receiver 153 is smaller, i.e. the second intensity is smaller than the first intensity. In other words, when the shaft 130 moves along the up-down path from the non-pressed position toward the lower casing 210 to the pressed position, the activating portion 131 pushes the passive portion 172 to laterally move away from the up-down path, so the shielding portion 173 connected to the lower side of the passive portion 172 moving along with the passive portion 172 has a larger portion entering the optical path and blocks a larger amount of the optical signal. As such, the second intensity of the optical signal received by the receiver 153 is relatively smaller, and the switch module 150 is triggered to generate the triggering signal. In an embodiment, when the activating portion 131 moves downward to push the passive portion 172, the first inclined surface 1311 of the activating portion 131 contacts and moves relative to the inclined surface 1721 of the passive portion 172 to generate a lateral dividing force, so that the passive portion 172 along with the shielding portion 173 is driven to laterally move or deform with respect to the positioning portion 171, and the shielding portion 173 substantially completely blocks the optical signal emitted by the emitter 152 or blocks the slit 1181. As such, the receiver 153 cannot receive the optical signal, i.e. the second intensity is zero. Moreover, when the shaft 130 is at the pressed position, the distal end of the activating portion 131 can pass through the opening 117 of the lower casing 210 and protrudes from the bottom of the lower casing 210 into the receiving space 155 of the circuit board 151, so that the stroke distance can be increased and the operation feeling is enhanced. When the pressing force is released, by means of the restoring force provided by the resilient member 140 (i.e. the spring portion 141), the shaft 130 returns to the non-pressed position shown in FIG. 8A, and the shielding baffle 170 bounces back to its original position (or shape).

Figure 9A:
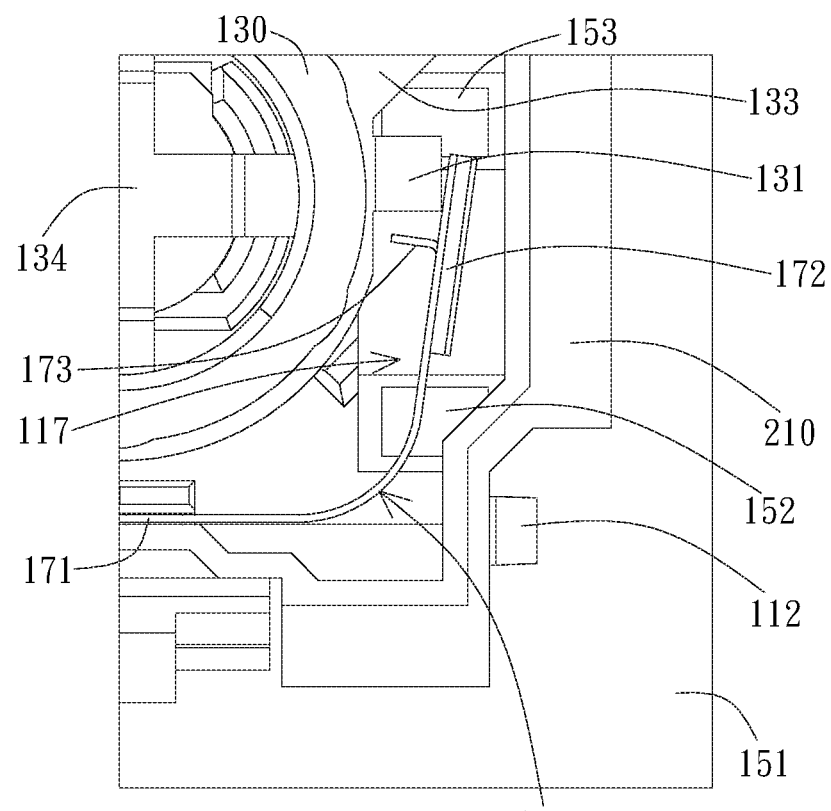
FIGS. 9A and 9B are partial top views of the optical keyswitch of a fourth embodiment at the non-pressed position and the pressed position, respectively.
Figure 9B:
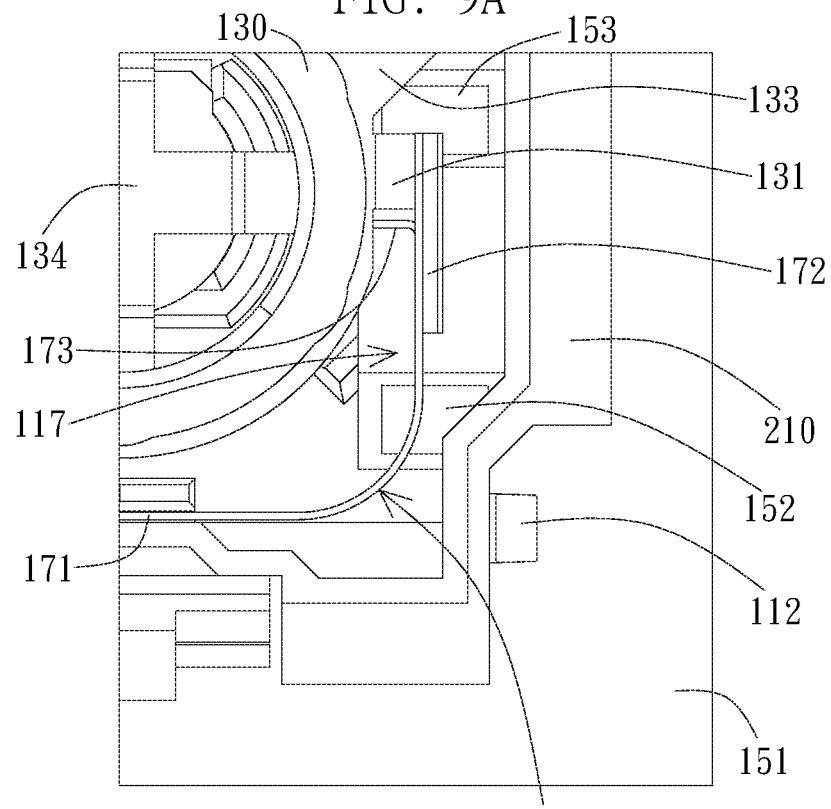

It is noted that in the third embodiment, the shielding baffled 170 is illustrated as being pushed by the activating portion 131 to block the optical signal, but not limited thereto. In other embodiments, by modifying the design of the shielding baffle 170 and the activating portion 131, the shielding baffle 170 can be driven by the activating portion 131 to move away from the optical path. FIGS. 9A and 9B are partial top views of the optical keyswitch of a fourth embodiment at the non-pressed position and the pressed position, respectively. As shown in FIG. 9A, when the shaft 130 is at the non-pressed position, the shielding baffle 170 is located at the optical path and at least partially blocks the optical signal, so the first intensity of the optical signal received by the receiver 153 is relatively smaller. Specifically, when the shaft 130 is at the non-pressed position, the activating portion 131 pushes the passive portion 172 of the shielding baffle 170, so that the passive portion 172 moves or deforms relative to the positioning portion 171 toward a direction away from the activating portion 131, and the shielding portion 173 moves along with the passive portion 172 into the optical path to substantially block the slit 1181. As such, the receiver 153 cannot receive the optical signal, i.e. the second intensity is zero. As shown in FIG. 9B, when the shaft 130 moves to the pressed position, the shielding baffle 170 moves away from the optical path, and the second intensity of the optical signal received by the receiver 153 is relatively stronger, i.e. the second intensity is stronger than the first intensity to trigger the switch module 150 to generate the triggering signal. Specifically, when the shaft 130 moves from the non-pressed to the pressed position, the activating portion 131 moves relative to the passive portion 172 and passes the passive portion 172, e.g. moves across the passive portion 172 to below the passive portion 172, so that passive portion 172 is no longer pushed by the activating portion 131 and bounces back relative to the positioning portion 171 toward the shaft 130, and the shielding portion 173 moves along with the passive portion 172 away from the optical path to have a less portion entering the optical path or substantially do not block the slit 1181. As such, the optical signal emitted by the emitter 152 along the optical path can be received by the receiver 153, and the switch module 150 is triggered to generate the triggering signal.

It is noted that in the embodiment of FIGS. 9A and 9B, the inclined surface of the passive portion 172 is preferably disposed at the lower side of the passive portion 172. The inclined surface extends downward and inclines toward a direction away from the activating portion 131. As such, when the pressing force is released, by means of the restoring force provided by the resilient member 140, the shaft 130 can move upward along the inclined surface of the passive portion 172 to the non-pressed position, and the activating portion 131 pushes the passive portion 172 to block the optical signal, as shown in FIG. 9A. Moreover, in the embodiments of FIGS. 8A-8B and FIGS. 9A-9B, the optical keyswitch generates the triggering signal by changing the intensity of the optical signal received by the optical receiver 153 by using the shielding baffle 170 disposed in the casing 200, so that only the shielding effect of the shielding baffle 170 needs to be considered, and the material and color of the casing 200 is not limited to the shielding requirements.

Figure 11A:
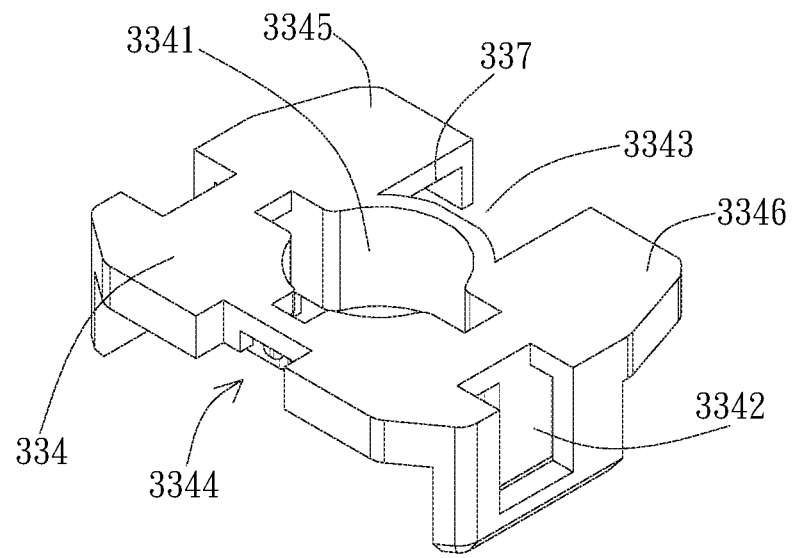
FIGS. 11A and 11B are schematic views of the upper casing and the lower casing of FIG. 10, respectively.
Figure 11B:
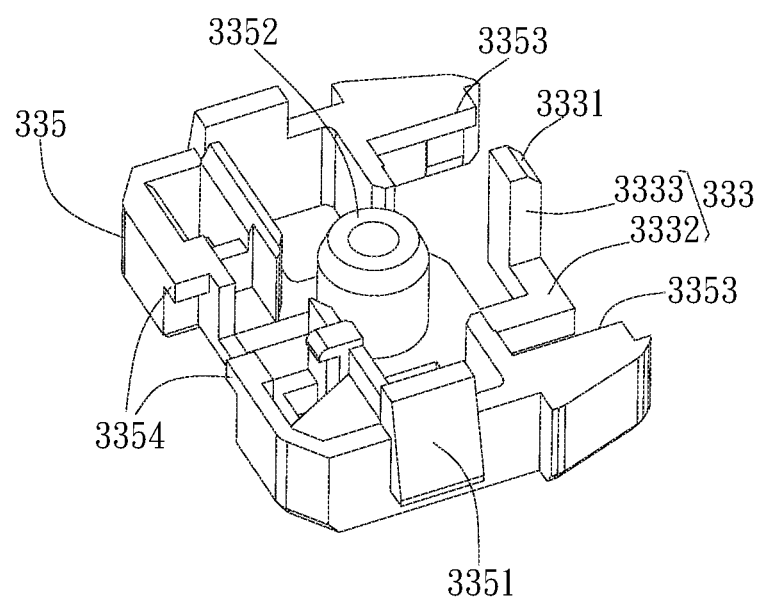
Figure 12A:
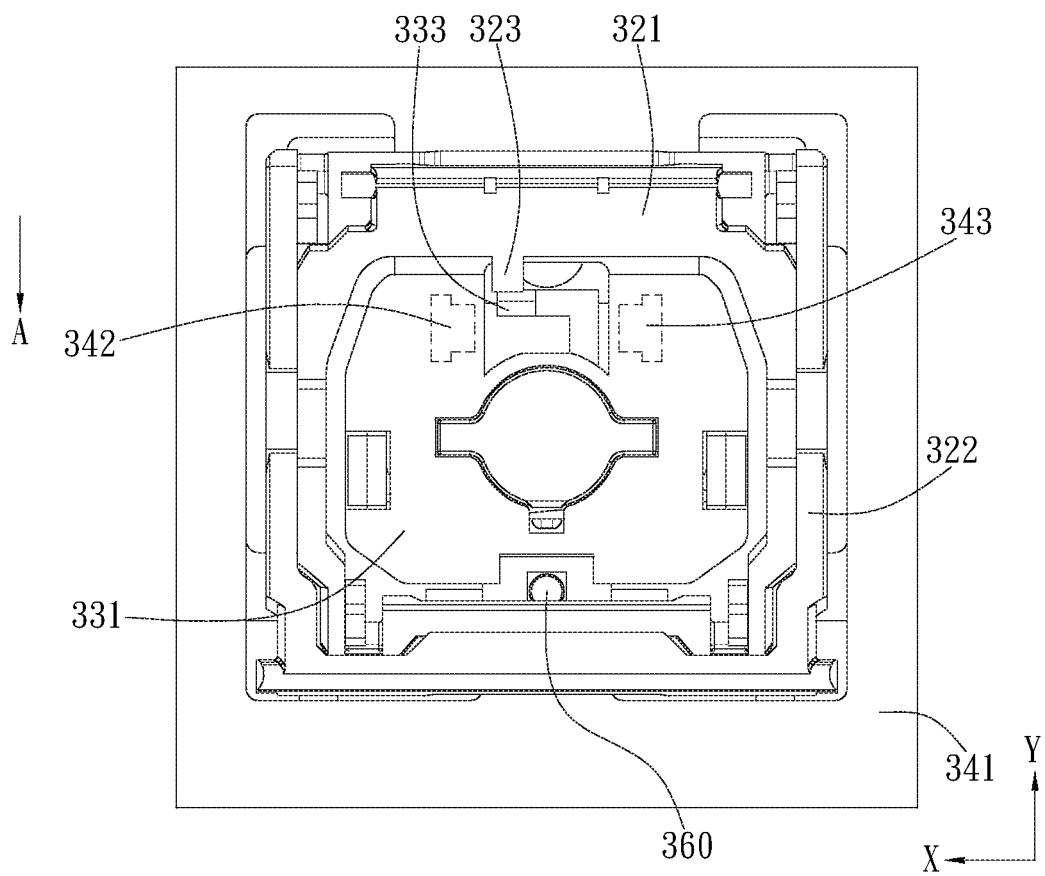
FIGS. 12A and 12B are a top view and a perspective view of the optical keyswitch of FIG. 10 without the keycap.
Figure 12B:
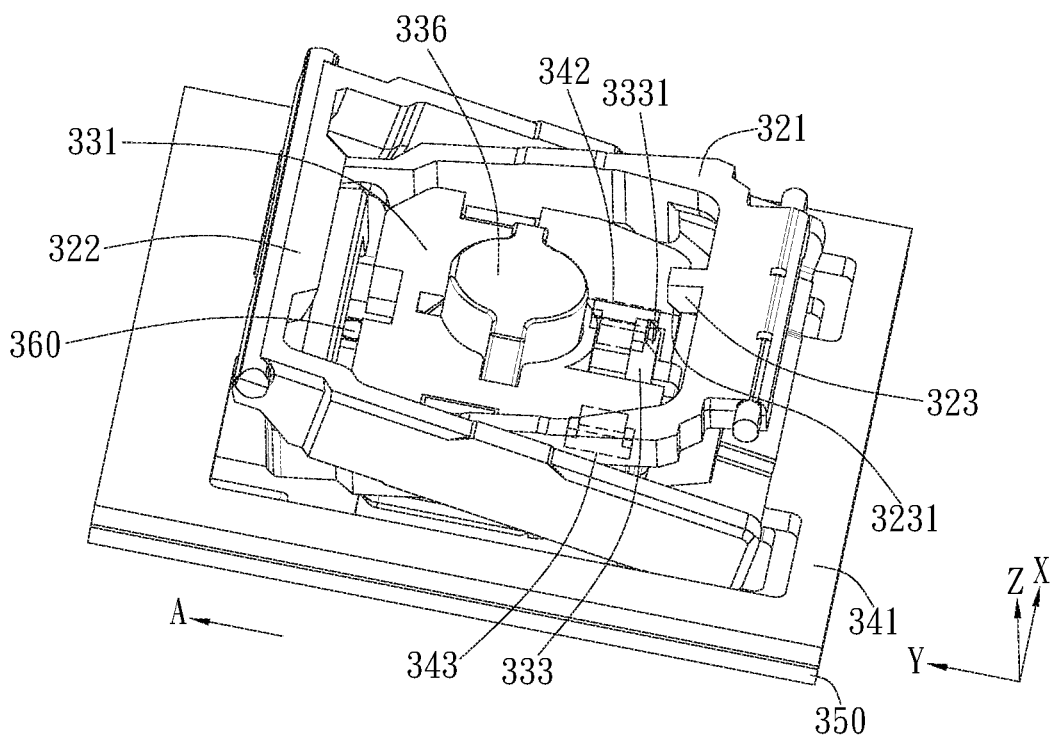

FIGS. 10 to 12B are schematic views of a fifth embodiment of the invention. FIG. 10 is an exploded view of the optical keyswitch, FIGS. 11A and 11B are respectively schematic views of the upper casing and the lower casing of FIG. 10, and FIGS. 12A and 12B are respectively a top view and a perspective view of the optical keyswitch of FIG. 10 without the keycap. As shown in FIGS. 10 to 12B, the optical keyswitch 30 of the fifth embodiment includes a keycap 310, a support mechanism 320, a restoring mechanism 330, a switch module 340, and a baseplate 350. The support mechanism 320 is disposed below the keycap 310 and configured to support the keycap 310 moving upward and downward. The support mechanism 320 has a protrusion 323. The restoring mechanism 330 is disposed below the keycap 310 and configured to provide a restoring force to enable the keycap 310 to return to a non-pressed position. The restoring mechanism 330 includes a casing 331 and a resilient member 332. The casing 331 has a movable portion 333, and the resilient member 332 is accommodated in the casing 331. The switch module 340 includes a circuit board 341, an emitter 342, and a receiver 343. The emitter 342 and the receiver 343 are electrically connected to the circuit board 341, and the emitter 342 emits an optical signal to the receiver 343. When the keycap 310 is not pressed, the receiver 343 receives the optical signal of a first intensity. When the keycap 310 is pressed, the resilient member 140 is compressed, and the support mechanism 320 is driven to move along with the keycap 310 to push the movable portion 333 to change the optical signal received by the receiver 343 to have a second intensity different from the first intensity, so that the switch module 340 is triggered to generate a triggering signal.

Specifically, the keycap 310 can be, for example, a rectangular keycap made by injection molding, and the keycap 310 has coupling members (not shown) on its lower surface to couple the support mechanism 320. The coupling members can be a coupling structure with pivotal hole or sliding groove. Mover, according to practical applications, the keycap 310 may have a transparent portion for luminous keyboard applications. For example, the transparent portion can be in form of alphabets, numerals, or symbols to indicate the instruction inputted through the optical keyswitch.

The baseplate 350 can be a support plate for enhancing the structural strength of the optical keyswitch 30. The baseplate 350 has connection members 351 and 352 to connect the support mechanism 320. In an embodiment, the baseplate 350 is preferably a metal plate formed by stamping. The connection members 351 and 352 are preferably hook-like portions bending from the baseplate 350 toward the keycap 310. It is noted that when the circuit board 341 has sufficient structural strength, the connection members 351 and 352 can be optionally disposed on the circuit board 341, so that the baseplate 350 can be omitted.

The support mechanism 320 preferably includes an inner frame 321 and an outer frame 322. The inner frame 321 is pivotally connected to an inner side of the outer frame 322 to form a scissor-like support mechanism. For example, the inner frame 321 and the outer frame 322 are injection-molded rectangular frames, and the inner frame 321 and the outer frame 322 are rotatably connected to each other by a combination of pivotal rod and pivotal hole. For example, the inner frame 321 has pivotal rods, which are located at two opposite outer sides of its middle section and protrude outward. The outer frame 322 has pivotal holes, which are located at two opposite inner sides and correspond to the pivotal rods, respectively. Therefore, the inner frame 321 and the outer frame 322 rotatably couple with each other at the middle section. Moreover, two ends of the inner frame 321 and the outer frame 322 are movably connected to the keycap 310 and the baseplate 350, respectively. For example, the keycap end of the inner frame 321 is rotatably connected to the coupling member of the keycap 310, and the baseplate end of the inner frame 321 is movably connected to the connection member 351 of the baseplate 350. Similarly, the keycap end of the outer frame 322 is movably connected to the coupling member of the keycap 310, and the baseplate end of the outer frame 322 is movably connected to the connection member 352 of the baseplate 350. As such, the support mechanism 320 is connected to the keycap 310 and the baseplate 350 and supports the keycap 310 stably moving upward and downward relative to the baseplate 350.

The protrusion 323 is disposed on the inner frame 321 and extends from an inner side of the inner frame 321 toward an inner direction of the inner frame 321. For example, the protrusion 323 is preferably disposed on the inner side of the keycap end of the inner frame 321. The protrusion 323 preferably has a first inclined surface 3231 (shown in FIG. 12B). In this embodiment, the first inclined surface 3231 is disposed on the distal end of the protrusion 323, i.e. a free end away from the inner frame 321. The inclined surface 3231 preferably extends downward and inclines toward where the protrusion 323 and the inner frame 321 are connected, so as to face the movable portion 333 of the casing 331.

The circuit board 341 is preferably disposed on the baseplate 350. The circuit board 341 has an opening 3411 allowing the connection members 351 and 352 to pass therethrough to couple the support mechanism 320. The emitter 342 and the receiver 343 are disposed on the circuit board 341 and electrically connected to the circuit board 341. Specifically, the circuit board 341 has a switch circuit, and the emitter 342 and the receiver 343 are electrically connected to the switch circuit, so that the emitter 342 can emit the optical signal toward the receiver 343. When the intensity of the optical signal received by the receiver 343 changes, the switch module 340 is triggered to generate the triggering signal. In other words, the switch module 340 is operated in a manner similar to the switch module 150. The circuit board 341 preferably has a receiving space 3412 for receiving at least a portion of the protrusion 333, such as the distal end of the protrusion 333. For example, the receiving space 3412 can be a receiving groove (or hole) opened on the circuit board 341, and the emitter 342 and the receiver 343 are disposed on two opposite sides of the receiving groove.

Moreover, the optical keyswitch 30 can optionally have a backlight source 360. The circuit board 341 preferably has a light source circuit for driving the backlight source 360. The backlight source 360 can be disposed on the circuit board 341 and electrically connected to the light source circuit of the circuit board 341 to emit light out of the transparent portion of the keycap 310. In an embodiment, the backlight source 360 is preferably disposed on an opposite side with respect to the emitter 342 and the receiver 343, and the backlight source 360, the emitter 342, and the receiver 343 are preferably all located within the vertical projection of the inner frame 321 on the baseplate 350. For example, the emitter 342 and the receiver 343 are preferably disposed corresponding to the protrusion 323 close to the keycap end of the inner frame 321, and the backlight source 360 is disposed close to the baseplate end of the inner frame 321.

The restoring mechanism 330 is disposed between the keycap 310 and the baseplate 350 (or the circuit board 341). The restoring mechanism 330 includes a casing 331 and a resilient member 332. In this embodiment, the resilient member 332 is a spring to provide a mechanical tactile feedback, but not limited thereto. In another embodiment, the resilient member 332 can be an elastomer or rubber for providing the restoring force. The casing 331 includes an upper casing 334 and a lower casing 335, which are combined to enclose an accommodation space for accommodating the resilient member 332. The restoring mechanism 330 further includes a movable part 336, and the movable part 336 movably couple with the upper casing 334. Specifically, the restoring mechanism constructed by the resilient member 332, the upper casing 334, the lower casing 335, and the movable part 336 has a structure and connections similar to those of the casing 100 (or 110', 200), the shaft 130, and the resilient member 140. For example, the upper casing 334 has a through hole 3341 and an upper engaging portion 3342 (e.g. slots). The movable part 336 is movably inserted into the through hole 3341 to position the resilient member 332 and functions as an actuator when the keycap 310 is pressed. The lower casing 335 has a lower engaging portion 3351 (e.g. protrudent portions) for engaging the upper engaging portion 3342 to combine the upper casing 334 and the lower casing 335.

In this embodiment, the upper casing 334 is preferably a rectangular cover with an open region 3343. The upper engaging portions 3342 are preferably disposed on two sides with respect to the open region 3343, so that a left arm portion 3345 is formed between the left upper engaging portion 3342 and the open region 3343, and a right arm portion 3346 is formed between the right upper engaging portion 3342 and the open region 3343. When the restoring mechanism 330 is disposed on the circuit board 341, the emitter 342 and the receiver 343 are preferably covered by the casing 331 for dust-protection and interference reduction. For example, the emitter 342 and the receiver 343 are respectively located on two opposite sides with respect to the open region 3343 and covered by the upper casing 334. In an embodiment, the lower casing 335 preferably has a substantially U-shaped horizontal cross section. The left arm portion 3345 and the right arm portion 3346 of the upper casing 334 protrude toward each other, from two sides of the substantially U-shaped horizontal cross section, beyond the lower casing 335. In other words, the vertical projections of the left arm portion 3345 and the right arm portion 3346 of the upper casing 334 at least partially exceed the vertical projection of the lower casing 335, so as to form the open region 3343 between the left arm portion 3345 and the right arm portion 3346. The emitter 342 and the receiver 343 are respectively positioned beneath the left arm portion 3345 and the right arm portion 3346 for dust-protection, but not limited thereto. When the keycap 310 is pressed, the protrusion 323 preferably moves outside the accommodation space, which is enclosed by the upper casing 334 and the lower casing 335. That is, when the keycap 310 is pressed, the protrusion 323 preferably moves in the open region 3343.

In an embodiment, the movable part 336 is preferably a barrel-like object. The movable part 336 has a restricting portion 3361 and an acting portion 3362 on two opposite sides of the barrel-like object. The restricting portion 3361 is configured to restrict the movement of the movable part 336 relative to the upper casing 334. The acting portion 3362 is configured to work with the tactile resilient member, such as the extending arm 143 of the resilient member 140 in the previous embodiments, to provide tactile feedback. It is noted that the structure of the restricting portion 3362 and the acting portion 3362 and the operations thereof with the upper casing 334 and the tactile resilient member can refer to the descriptions related to the restricting portion 133 and the acting portion 132 of the shaft 130 and will not elaborate again.

The lower casing 335 further has a coupling portion 3352 configured to position the resilient member 332. In an embodiment, the coupling portion 3352 protrudes corresponding to the movable part 336 from the surface of the lower casing 335 toward the upper casing 334. When assembling the restoring mechanism 330, the spring-type resilient member 332 is sleeved on the outer side of the coupling portion 3352 of the lower casing 335, so that the resilient member 332 is positioned between the movable part 336 and the lower casing 335. When the keycap 310 is pressed, the movable part 336 moves downward relative to the upper casing 334, so as to compress the resilient member 332. When the keycap 310 is released, the resilient member 332 provides the resilient force, so that the movable part 336 as well as the keycap 310 are driven by the resilient force to move upward relative to the upper casing 334 and positioned at the non-pressed position by the restricting portion 3361.

In this embodiment, the restoring mechanism 330 can be positioned on the circuit board 341 by means of the lower casing 335. Specifically, the lower casing 335 may have wing portions 3353 and 3354. The wing portions 3353 and 3354 are preferably disposed on two opposite sides of the lower casing 335. For example, the wing portion 3353 is leaned on the circuit board 341 neighboring the emitter 342 and the receiver 343, and the wing portion 3355 is leaned on the circuit board 341 neighboring the backlight source 360. In an embodiment, the wing portion 3353 can be a pair of supporting arms of the lower casing 334, which protrude toward each other and are respectively located corresponding to the emitter 342 and the receiver 343 below the left arm portion 3345 and the right arm portion 3346. The wing portion 3354 can be a pair of protruding blocks with concaves of the lower casing 335. For example, the protruding blocks protrude horizontally form the lower casing 335 toward each other and recess from the bottom surface of the lower casing 335 to form the concaves. The upper casing 334 has an opening 3344 corresponding to the wing portion 3354, and the backlight source 360 is disposed corresponding to the opening 3344. As such, the light emitted from the backlight source 360 can be blocked by the restoring mechanism 330 and less likely to influence the intensity of the optical signal received by the receiver 343, so as to reduce the possibility that the switch module 340 is triggered to generate a false triggering signal.

In this embodiment, the restoring mechanism 330 further includes a tactile resilient member 370 for providing a tactile feedback when the keycap 310 is pressed. For example, the tactile resilient member 370 can be a torsion spring, wherein one end of the torsion spring can function as a positioning portion (similar to the positioning portion 371 indicated in FIG. 13), and the other end of the torsion spring functions as the extending arm 372. The lower casing 335 correspondingly has a positioning hole. When the tactile resilient member 370 is disposed on the lower casing 335, the positioning portion is inserted into the positioning hole, and the extending arm 372 is disposed corresponding to the acting portion 3362 of the movable part 336. When the keycap 310 is pressed, the acting portion 3362 moves downward along with the keycap 310 to generate a relative displacement with respect to the extending arm 372, so that the finger of the user firstly feels larger resistance, and then the resistance is greatly reduced when the extending arm 372 escapes from the downward pressing of the acting portion 3362 and hits the upper casing 334 or the lower casing 335 to generate a sound. When the keycap 310 is released, the resilient member 332 provides the restoring force to enable the keycap 310 and the movable part 336 including the acting portion 3362 driven by the keycap 310 to move upward, the extending arm 372 slides downward relative to the acting portion 3362 back to its original position.

It is noted that similar to the previous embodiments, the casing 331 can further have a grating portion 337. In an embodiment, the grating portion 337 is preferably disposed on the upper casing 334. For example, the grating portion 337 can be disposed on the left arm portion 3345 or the right arm portion 3346 of the upper casing 334 near the emitter 342, but not limited thereto. According to practical applications, the grating portion 337 can be disposed near the receiver 343, so that the optical signal at the receiver 343 is less interfered by external light, and the possibility of generating a false triggering signal is effectively reduced.

As shown in FIG. 11B, in this embodiment, the movable portion 333 of the casing 331 is disposed on the lower casing 335 and corresponds to the protrusion 323 of the support mechanism 320. Specifically, the movable portion 333 is a flexible arm, which is disposed on the lower casing 335 and extends toward the keycap 310, i.e. extends upward, so that the movable portion 333 can move or deform in response to the movement of the protrusion 323, and the spatial relation (or the relative position) of the movable portion 333 with respect to the optical path between the emitter 342 and the receiver 343 can be changed to trigger the switch module 340 to generate the triggering signal. In this embodiment, the movable portion 333 is preferably integrally formed with the lower casing 335, but not limited thereto. In other embodiments, the movable portion 333 can be attached to the lower casing 335 by any suitable connection mechanism. In this embodiment, the movable portion 333 can extend from the lower end of the U-shaped horizontal cross section of the lower casing 335 toward the opening of the U-shaped horizontal cross section. In other words, one end of the movable portion 333 is connected to the lower casing 335, so that the other end of the movable portion 333 can be a free end located in the open region 3343 of the upper casing 334. In this embodiment, the moveable portion 333 is preferably a flexible arm including a connection portion 3332 and a shielding portion 3333. The connection portion 3332 is preferably a connection arm extending horizontally parallel to the bottom surface of the lower casing 335 to connect the lower casing 335 and the shielding portion 3333. The shielding portion 3333 extends from the connection portion 3332 toward the keycap 310, i.e. extends upward along the Z axis direction, to be located in the open region 3343 of the upper casing 334 and corresponds to the protrusion 323 of the support mechanism 320.

Moreover, the movable portion 333 preferably has a second inclined surface 3331 corresponding to the first inclined surface 3231 of the protrusion 323. When the support mechanism 320 is driven to move along with the keycap 310, the first inclined surface 3231 moves relative to the second inclined surface 3331 to push the movable portion 333 to laterally move. Specifically, the second inclined surface 3331 is preferably an outer lateral surface of the shielding portion 3333, i.e. the lateral surface facing the protrusion 323. The second inclined surface 3331 extends downward along the Z axis direction and inclines outward, so that the second inclined surface 3331 corresponds to the first inclined surface 3231.

Referring to FIGS. 12A and 12B, the operation of the optical keyswitch 30 of the fifth embodiment will be illustrated. As shown in FIGS. 12A and 12B, when the keycap 310 is not pressed, the protrusion 323 at least partially overlaps the movable portion 333 in a direction parallel to a moving direction of the keycap 310, such as the Z axis direction, the movable portion 333 has the first spatial relation with the optical path, and the receiver 343 receives the optical signal of first intensity. When the keycap 310 is pressed, the resilient member 332 is compressed, and the support mechanism 320 is driven to move along with the keycap 310, so that the protrusion 323 pushes the movable portion 333 to move, the movable portion 333 no longer has the first spatial relation with the optical path, and the optical signal received by the receiver 343 has the second intensity different from the first intensity. As such, the switch module 340 is triggered to generate the triggering signal.

In this embodiment, the first spatial relation refers that the movable portion 333 is away from the optical path, and the movable portion 333 substantially does not change the intensity of the optical signal received by the receiver 343. When the movable portion 333 no longer has the first spatial relation with the optical path, it means that the movable portion 333 enters the optical path and at least partially blocks the optical signal received by the receiver 343, i.e. the intensity of the optical signal is attenuated, so that the second intensity is smaller than the first intensity, and the switch module 340 is triggered to generate the triggering signal.

Specifically, when the support mechanism 320 is driven to move along with the keycap 310, the protrusion 323 pushes the movable portion 333 to at least partially block the optical signal, so that the second intensity is smaller than the first intensity. In an embodiment, when the keycap 310 is pressed, the protrusion 323 pushes the movable portion 333 to laterally move, and the protrusion 323 at least partially contacts the movable portion 333 in a direction perpendicular to the moving direction (e.g. Z axis direction) of the keycap 310, i.e. the protrusion 323 and the movable portion 333 at least partially contact each other in the Y axis direction. Specifically, when the support mechanism 320 is driven to move along with the keycap 310, the first inclined surface 3231 of the protrusion 323 moves along the second inclined surface 3331 of the movable portion 333 to generate a lateral dividing force and push the movable portion 333 to laterally move into the optical path. For example, the lateral dividing force enables the movable portion 333 to laterally move toward the bottom of the U-shaped horizontal cross section of the lower casing 335, i.e. away from where the protrusion 323 and the inner frame 321 are connected. The moving direction of the movable portion 333 is indicated by the arrow A. As such, the relative position of the movable portion 333 and the grating portion 337 is changed. For example, the movable portion 333 at least partially blocks the slit of the grating portion 337, so that the second intensity is smaller than the first intensity, and the switch module 340 is triggered to generate the triggering signal.

In an embodiment, when the protrusion 323 is driven to move along with the keycap 310, the movable portion 333 preferably completely blocks the optical signal, so that the receiver 343 cannot receive the optical signal, i.e. the second intensity is zero. It is noted that by modifying the circuit design of the circuit board 341, the switch module 340 can generate the triggering signal based on the variation in intensity of the optical signal received by the receiver 343, or based on whether the receiver 343 receives the optical signal.

Figure 13:
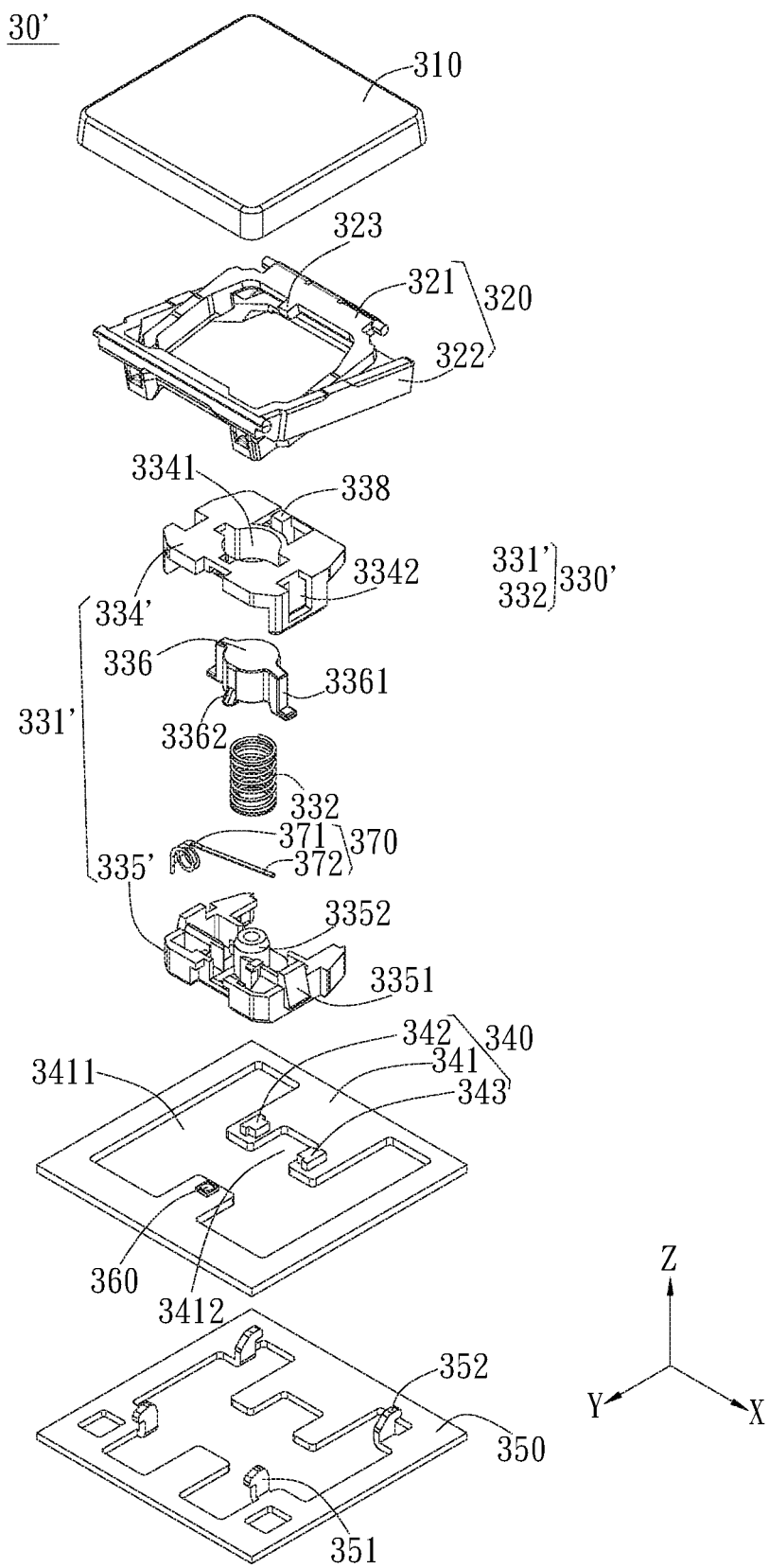
FIG. 13 is an exploded view of the optical keyswitch of a sixth embodiment of the invention.
Figure 14A:
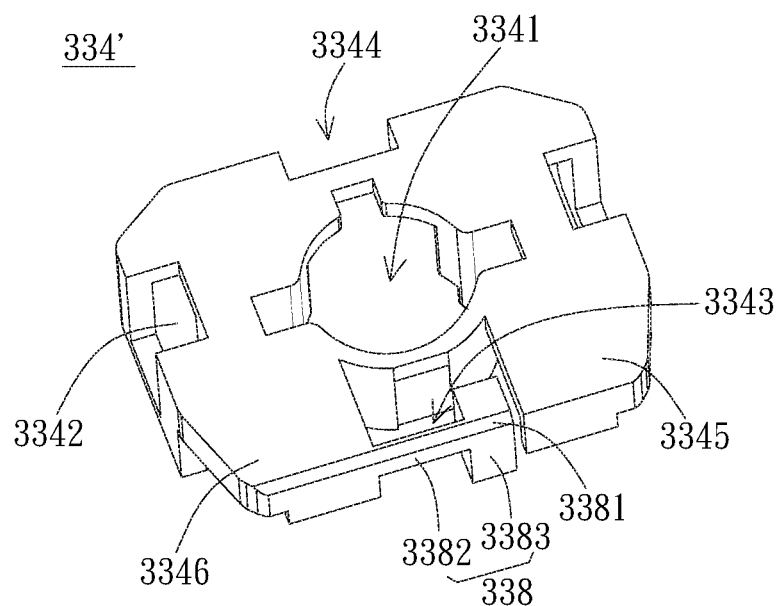
FIGS. 14A and 14B are schematic views of the upper casing of FIG. 13 from different viewing angles.
Figure 14B:
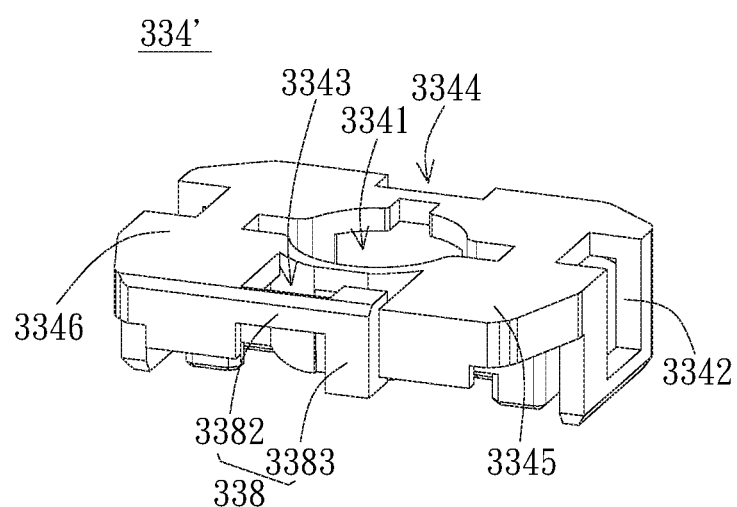
Figure 15A:
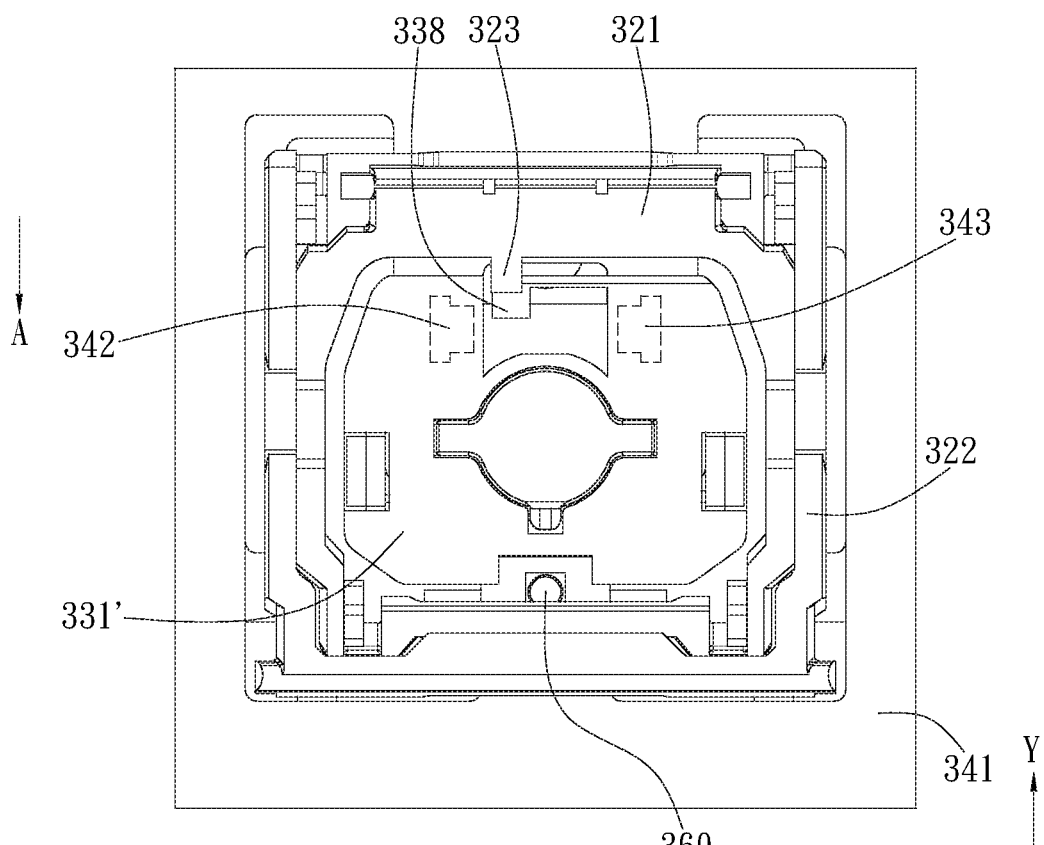
FIGS. 15A and 15B are a top view and a perspective view of the optical keyswitch of FIG. 13 without the keycap, respectively.
Figure 15B:
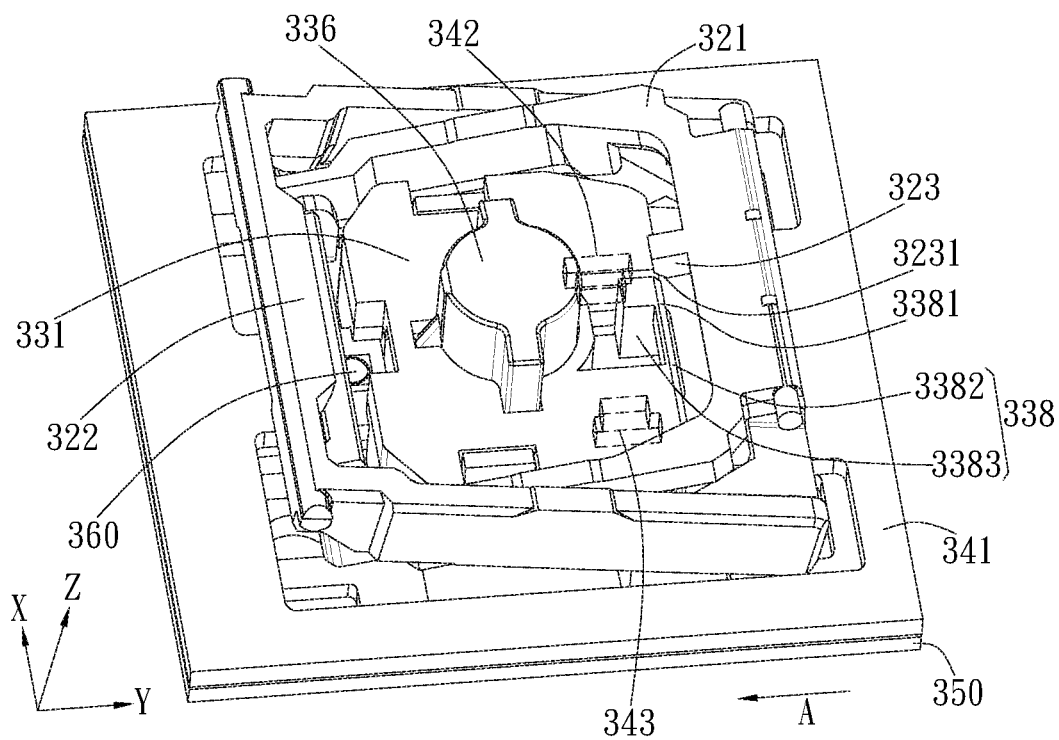

FIGS. 13 to 15B are schematic views of a sixth embodiment of the invention. FIG. 13 is an exploded view of the optical keyswitch FIGS. 14A and 14B are schematic views of the upper casing of FIG. 13 from different viewing angles, and FIGS. 15A and 15B are respectively a top view and a perspective view of the optical keyswitch of FIG. 13 without the keycap. As shown in FIGS. 13 to 15B, the optical keyswitch 30' of the sixth embodiment includes the keycap 310, the support mechanism 320, a restoring mechanism 330', the switch module 340, and the baseplate 350. The optical keyswitch 30' may optionally further include the backlight source 360. The optical keyswitch 30' of FIG. 13 is different from the optical keyswitch 30 of FIG. 10 in that the lower casing 335' does not have the movable portion 333, and a movable portion 338 is disposed on the upper casing 334'. Therefore, the structure and the connection of the rest components of the optical keyswitch 30', such as the keycap 310, the support mechanism, 320, the switch module 340, the baseplate 360, and the backlight source 360, as well as the corresponding structure of the casing 331', can refer to the related descriptions of the optical keyswitch 30 of the fifth embodiment, and will not elaborate again.

In this embodiment, the casing 331' includes an upper casing 334' and a lower casing 335', and the movable portion 338 is preferably a flexible arm extending from the upper casing 334'. Specifically, the movable portion 338 is preferably an L-shaped flexible arm including a connection portion 3382 and a shielding portion 3383 and disposed corresponding to the open region 3343. One end of the connection portion 3382 is connected to the upper casing 334', and the other end of the connection portion 3382 is connected to the shielding portion 3383. The connection portion 3382 can be a rod or an arm of any suitable shape with one end connected to one of the right arm portion 3346 and the left arm portion 3345 and the other end extending to the other one of the right arm portion 3346 and the left arm portion 3345 and connecting the shielding portion 3383 to be a free end. For example, one end of the connection portion 3382 of the movable portion 338 is connected to the right arm portion 3346, and the other end of the connection portion 3382 extends toward the left arm portion 3345 and partially corresponds to the opening of the open region 3343. The shielding portion 3383 preferably extends downward from the connection portion 3382 along the Z axis direction and corresponds to the protrusion 323. It is noted that in this embodiment, the shielding portion 3383 is illustrated extending downward from the connection portion 3332, but not limited thereto. In other embodiments, according to practical applications, the shielding portion 3383 can extend upward from the connection portion 3382. Moreover, the movable portion 338 can be a flexible arm of any suitable shape, so that the movable portion 338 can have a free end corresponding to the protrusion 323 and a connection portion connected to the upper casing 334', and the free end is movable or deformable in response to the pushing of the protrusion 323.

Similarly, the movable portion 338 preferably has a second inclined surface 3381, which corresponds to the first inclined surface 3231 of the protrusion 323. Specifically, the second inclined surface 3381 is preferably an outer lateral surface of the shielding portion 3383, i.e. the lateral surface facing the protrusion 323. The second inclined surface 3381 extends downward along the Z axis direction and inclines outward, so that the second inclined surface 3331 corresponds to the first inclined surface 3231.

Referring to FIGS. 15A and 15B, the operation of the optical keyswitch 30' of the sixth embodiment will be illustrated. As shown in FIGS. 15A and 15B, when the keycap 310 is not pressed, the protrusion 323 at least partially overlaps the movable portion 338 in a direction parallel to a moving direction of the keycap 310, such as the Z axis direction, the movable portion 338 has the first spatial relation with the optical path, and the receiver 343 receives the optical signal of first intensity. When the keycap 310 is pressed, the resilient member 332 is compressed, and the support mechanism 320 is driven to move along with the keycap 310, so that the protrusion 323 pushes the movable portion 338 to move, the movable portion 338 no longer has the first spatial relation with the optical path, and the optical signal received by the receiver 343 has the second intensity different from the first intensity. As such, the switch module 340 is triggered to generate the triggering signal. Similarly, in this embodiment, the first spatial relation refers that the movable portion 338 is away from the optical path, and the movable portion 338 substantially does not change the intensity of the optical signal received by the receiver 343. When the movable portion 338 no longer has the first spatial relation with the optical path, it means that the movable portion 338 enters the optical path and at least partially blocks the optical signal received by the receiver 343, i.e. the intensity of the optical signal is attenuated, so that the second intensity is smaller than the first intensity, and the switch module 340 is triggered to generate the triggering signal.

Specifically, when the support mechanism 320 is driven to move along with the keycap 310, the protrusion 323 pushes the movable portion 338 to at least partially block the optical signal, so that the second intensity is smaller than the first intensity. In an embodiment, when the keycap 310 is pressed, the protrusion 323 pushes the movable portion 338 to laterally move, and the protrusion 323 at least partially contacts the movable portion 338 in a direction perpendicular to the moving direction of the keycap 310, i.e. the protrusion 323 and the movable portion 338 at least partially contact each other in the Y axis direction. Specifically, when the support mechanism 320 is driven to move along with the keycap 310, the first inclined surface 3231 of the protrusion 323 moves along the second inclined surface 3381 of the movable portion 338 to generate a lateral dividing force and push the movable portion 338 to laterally move into the optical path. For example, the lateral dividing force enables the movable portion 338 to laterally move toward the bottom of the open region 3343 of the upper casing 334', i.e. away from where the protrusion 323 and the inner frame 321 are connected. The moving direction of the movable portion 338 is indicated by the arrow A. As such, the optical signal is at least partially blocked, so that the second intensity is smaller than the first intensity, and the switch module 340 is triggered to generate the triggering signal.

In an embodiment, when the protrusion 323 is driven to move along with the keycap 310, the movable portion 338 preferably completely blocks the optical signal, so that the receiver 343 cannot receive the optical signal, i.e. the second intensity is zero. It is noted that by modifying the circuit design of the circuit board 341, the switch module 340 can generate the triggering signal based on the variation in intensity of the optical signal received by the receiver 343, or based on whether the receiver 343 receives the optical signal.

It is noted that in the first to sixth embodiments, the optical keyswitch utilizes the activating portion 131 of the shaft 130 or the protrusion 323 of the support mechanism to push the movable portion 111, 123, 333, or 338, or the shielding baffle 170 disposed in the casing to laterally (or horizontally) move with respect to the pressing direction, so as to change the intensity of the optical signal received by the receiver 153 or 343. As such, the switch module 150 or 340 is triggered to generate the triggering signal, and the space requirement in the Z axis direction is reduced, effectively reducing the keyswitch height, but not limited thereto. In other embodiments, the optical keyswitch can utilize the activating portion 131 of the shaft 131 or the protrusion 323 of the support mechanism 320 to push the movable portion to move in a direction substantially parallel to the pressing direction (i.e., to move vertically along the Z axis direction), so as to trigger the switch module 150 or 340 to generate the triggering signal.

Figure 16A:
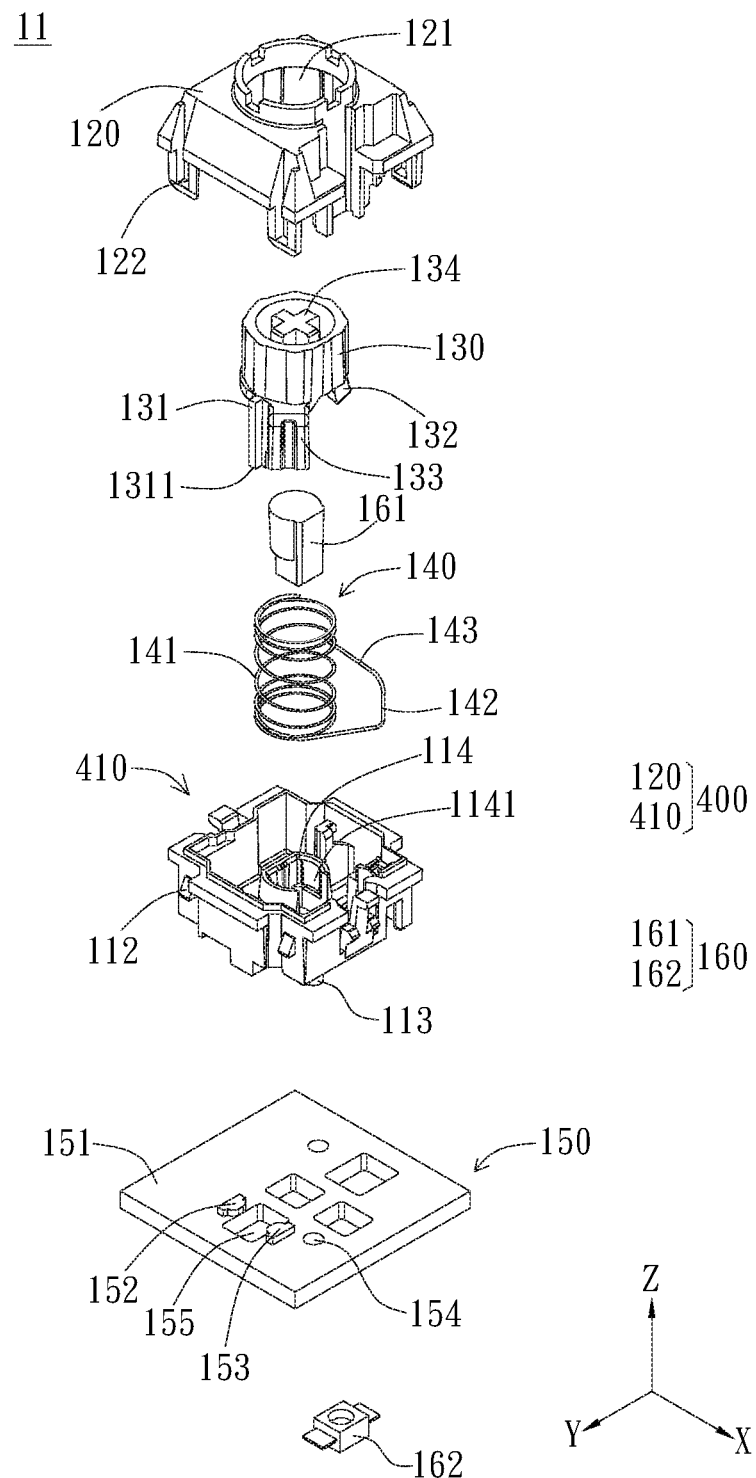
FIGS. 16A and 16B are exploded views of the optical keyswitch of a seventh embodiment from different viewing angles.
Figure 16B:
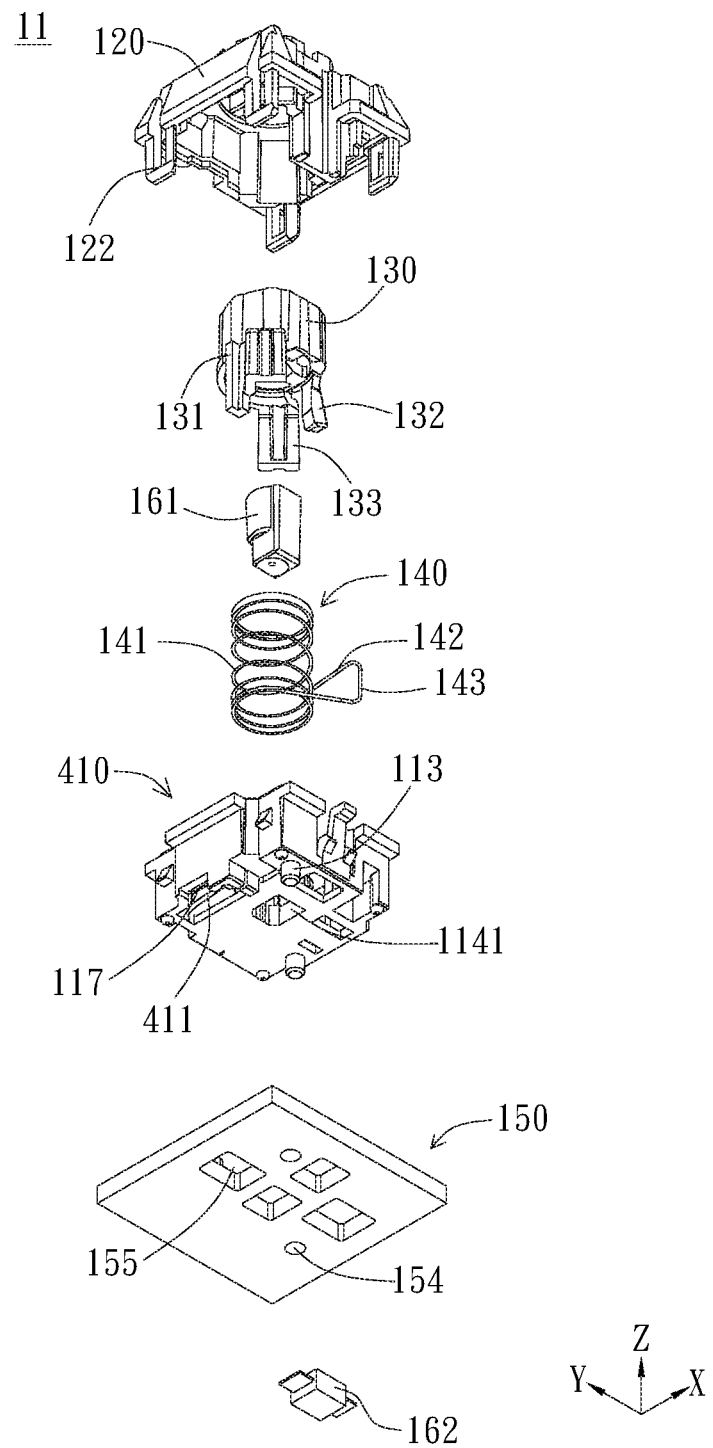
Figure 16C:
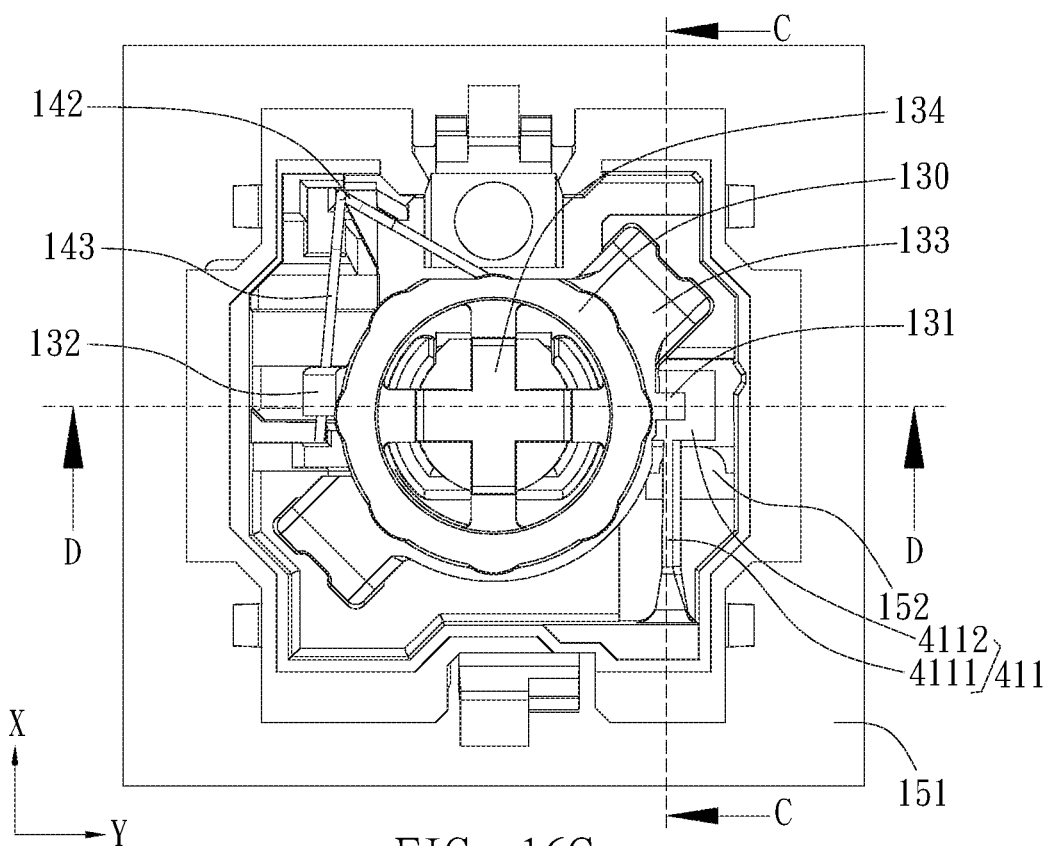
FIG. 16C is a schematic top view of the optical keyswitch of FIG. 16A without the upper casing.
Figure 16D:
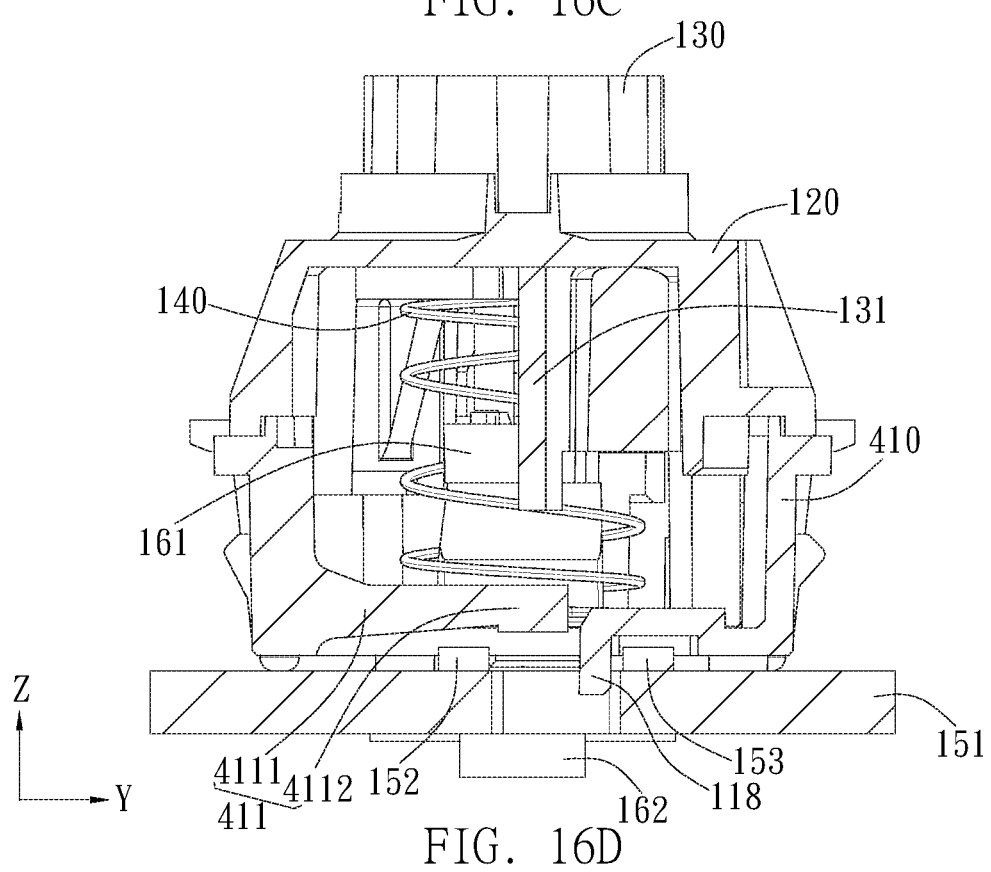
FIG. 16D is a cross-sectional view of FIG. 16C along the cutting line CC with the upper casing.

FIGS. 16A to 18B are schematic views of a seventh embodiment of the invention. FIGS. 16A and 16B are exploded views of the optical keyswitch from different viewing angles, FIG. 16C is a schematic top view of the optical keyswitch of FIG. 16A without the upper casing, and FIG. 16D is a cross-sectional view of FIG. 16C along the cutting line CC with the upper casing. As shown in FIGS. 16A to 16D, the optical keyswitch 11 of the seventh embodiment includes a casing 400, the shaft 130, the resilient member 140, and the switch module 150. The optical keyswitch 11 may optionally further have the backlight unit 160. The optical keyswitch 11 of FIG. 16A is different from the optical keyswitch 10 of FIG. 1A in the configuration of a movable portion 411 on the lower casing 410. Therefore, the structure and the connection of the rest components of the optical keyswitch 11, such as the shaft 130, the resilient member 140, the switch module 150, and the backlight source 160, as well as the corresponding structure of the casing 400, can refer to the related descriptions of the optical keyswitch 10 of the first embodiment, and will not elaborate again.

Figure 17A:
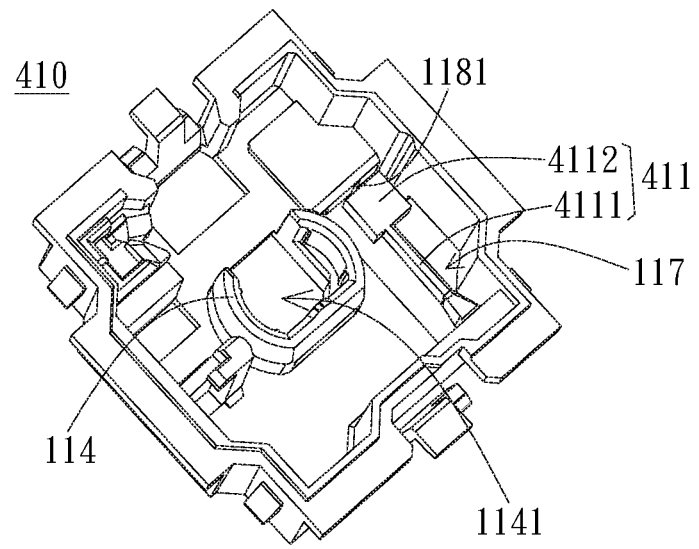
FIGS. 17A and 17B are schematic views of the lower casing of an embodiment of the invention from different viewing angles.
Figure 17B:
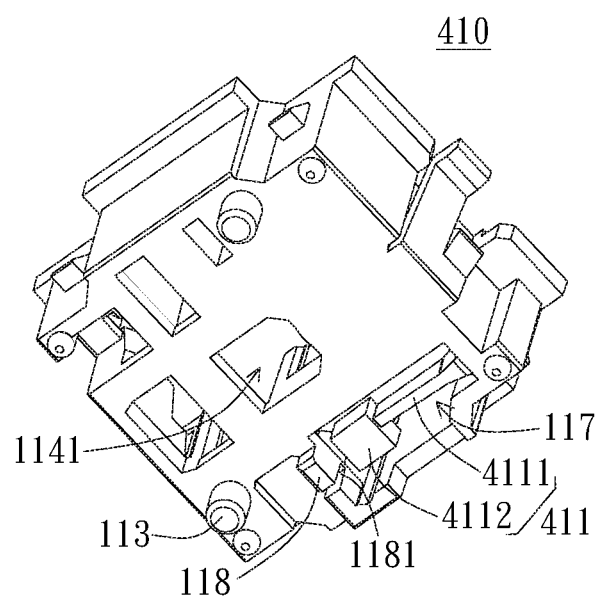

In this embodiment, the casing 400 includes the upper casing 120 and a lower casing 410. The movable portion 411 is preferably a flexible arm extending from the lower casing 410 in the opening 117. As shown in FIGS. 17A and 17B, the movable portion 411 is preferably a flexible arm including a connection portion 4111 and a shielding portion 4112. The connection portion 4111 is preferably a connection arm extending horizontally parallel to the bottom of the lower casing 410 to connect the lower casing 410 and the shielding portion 4112. The shielding portion 4112 is located at the free end of the movable portion 411 and corresponds to the activating portion 131 of the shaft 130. The shielding portion 4112 is pushed by the activating portion 131, so that the movable portion 411 is bent downward. When the shielding portion 4112 is pushed by the activating portion 131, the connection portion 4111 moves along with the shielding portion 4112 to deform with respect to the lower casing 410. In an embodiment, the shielding portion 4112 of the movable portion 411 preferably has a size capable of substantially completely blocking the optical signal, but not limited thereto. In other embodiments, the shielding portion 4112 of the movable portion 411 can at least partially block the optical signal.

Figure 18A:
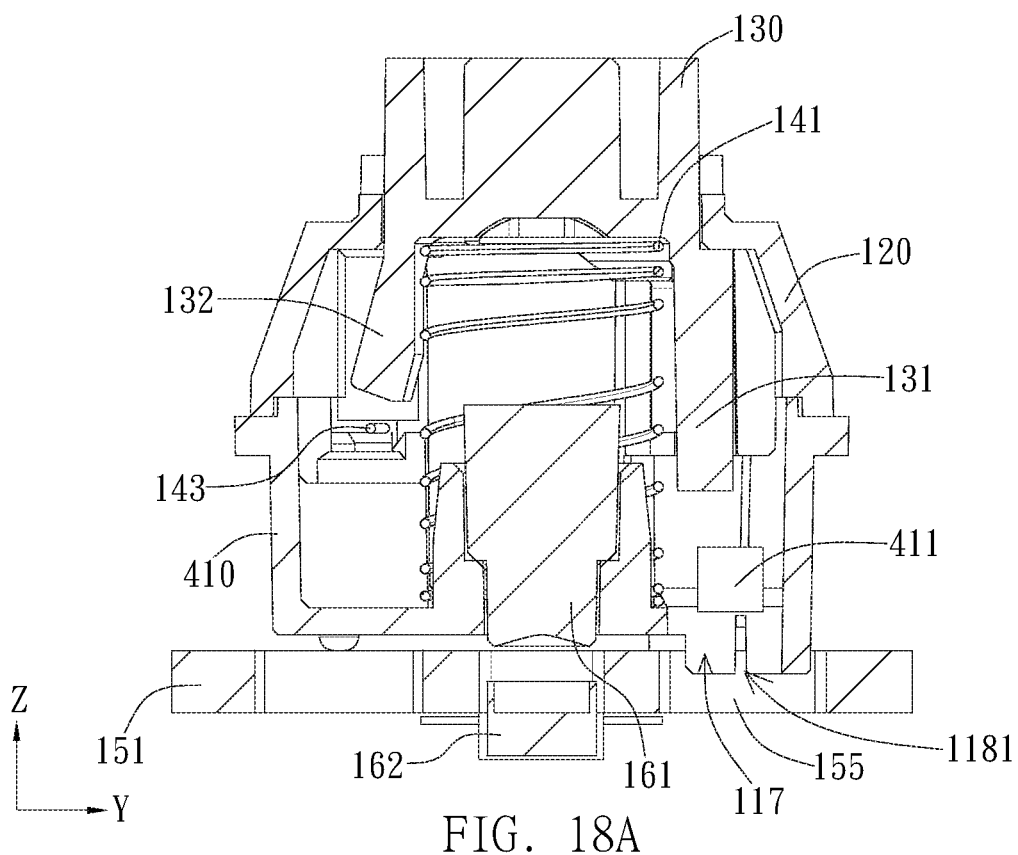
FIGS. 18A and 18B are cross-sectional views of the optical keyswitch of FIG. 16C along the cutting line DD with the upper casing at the non-pressed position and the pressed position, respectively.
Figure 18B:
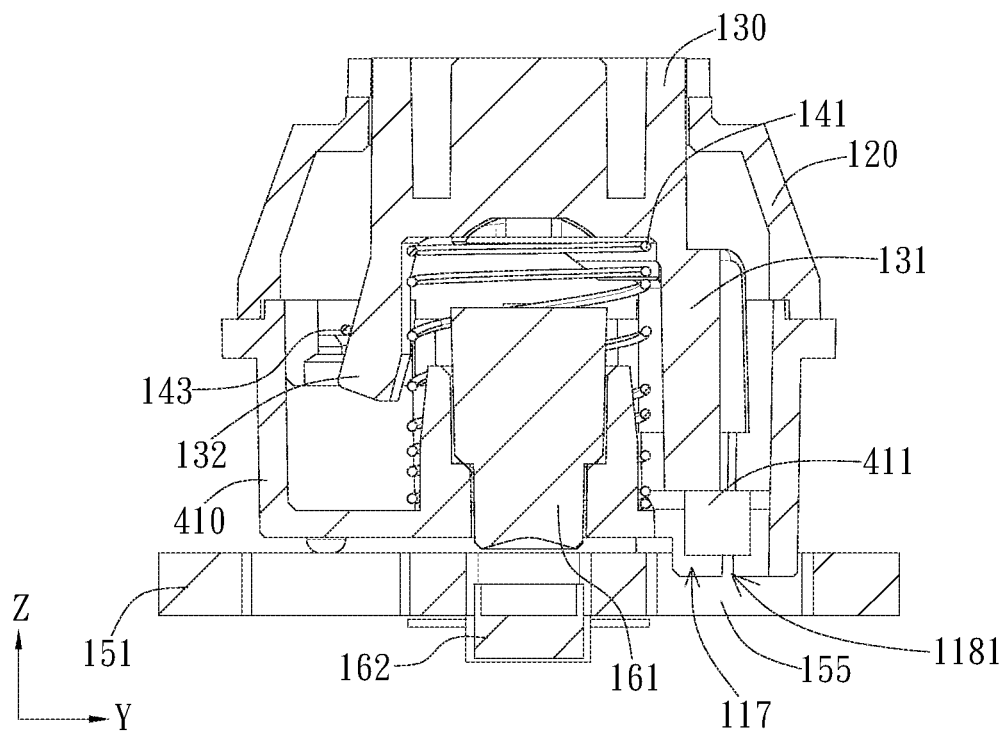

Referring to FIGS. 18A and 18B, the operation of the optical keyswitch 11 of the seventh embodiment will be illustrated. FIGS. 18A and 18B are cross-sectional views of the optical keyswitch 11 of FIG. 16C along the cutting line DD with the upper casing at the non-pressed position and the pressed position, respectively. As shown in FIG. 18A, when the shaft 130 is at the non-pressed position, the activating portion 131 preferably at least partially overlaps the movable portion 411 in a direction parallel to the up-down path. For example, when the shaft 130 is at the non-pressed position, the activating portion 131 preferably at least partially overlaps the movable portion 411 in the Z axis direction, i.e. the vertical projections of the activating portion 131 and the movable portion 411 on the lower casing 410 at least partially overlap with each other. Moreover, when the shaft 130 is at the non-pressed position, the movable portion 411 has a first spatial relation with the optical path, and the receiver 153 receives the optical signal of the first intensity. In this embodiment, when the shaft 130 is at the non-pressed position, the movable portion 411 has a less portion entering the optical path, and the movable portion 411 blocks a less amount of the optical signal, so that the first intensity of the optical signal received by the receiver 152 is relatively stronger. For example, when the shaft 130 is at the non-pressed position, the movable portion 411 is preferably located above the optical path, so that the optical signal emitted by the emitter 152 can be received by the receiver 153 without being interfered by the movable portion 411. Therefore, the optical signal received by the receiver 153 when the shaft 130 is at the non-pressed position is relatively stronger, i.e. the optical signal is not blocked or attenuated.

As shown in FIG. 18B, when the shaft 130 moves, in response to the pressing force, from the non-pressed position to the pressed position along the up-down path, the shaft 130 compresses the resilient member 140 and drives the movable portion 411 to move, so the movable portion 411 no longer has the first spatial relation with the optical path, the optical signal received by the receiver 153 has a second intensity different from the first intensity, and the switch module 150 is triggered to generate a triggering signal. In other words, when the shaft 130 moves along the up-down path toward the lower casing 410 to the pressed position, the activating portion 131 pushes the movable portion 411 to move downward, so that the spatial relation of the movable portion 411 and the optical path is changed and the intensity of the optical signal received by the receiver 153 is changed to trigger the switch module 150 to generate the triggering signal. In this embodiment, the first spatial relation refers that the movable portion 411 is away from the optical path, and the movable portion 411 substantially does not change the intensity of the optical signal received by the receiver 153. When the movable portion 411 no longer has the first spatial relation with the optical path, it means that the movable portion 411 driven by the activating portion 131 moves into the optical path and at least partially blocks the optical signal. Therefore, the optical signal received by the receiver 153 is blocked or attenuated, i.e. the second intensity is smaller than the first intensity, and the switch module 150 is triggered to generate the triggering signal.

Specifically, when the shaft 130 is driven by pressing the keycap to move toward the lower casing 410, the activating portion 131 moves downward along with the shaft 130, and the distal end of the activating portion 131 (i.e. the lower end) contacts and pushes the shielding portion 4112 of the movable portion 411, so that the movable portion 411 elastically deforms downwardly with the connection end of the connection portion 4111 as a pivot point, and the shielding portion 4112 at least partially blocks the optical signal, i.e. at least partially blocks the slit 1181. Therefore, the second intensity is smaller than the first intensity, and the switch module 150 is triggered to generate the triggering signal.

Figure 19A:
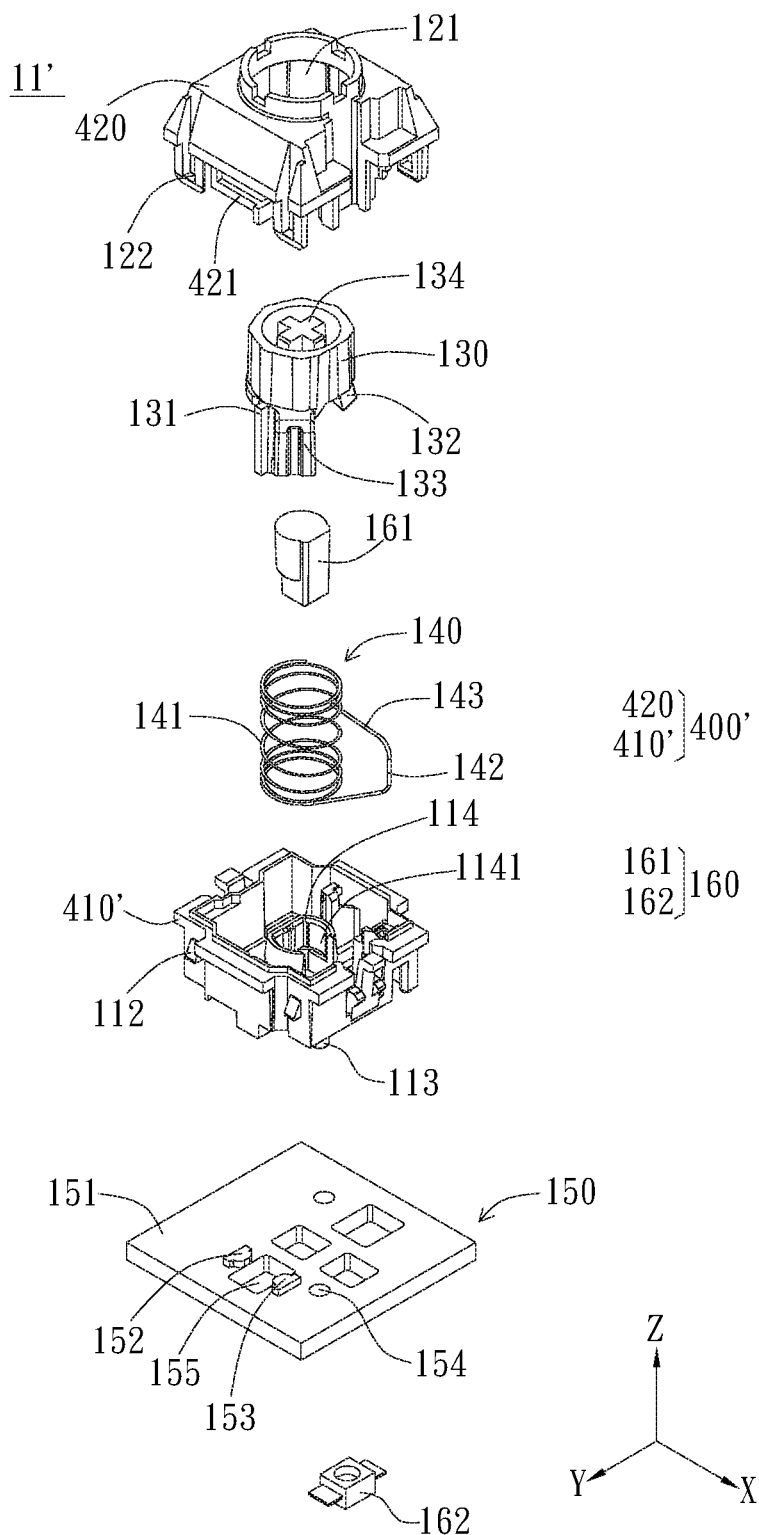
FIGS. 19A and 19B are exploded views of the optical keyswitch of an eighth embodiment of the invention from different viewing angles.
Figure 19B:
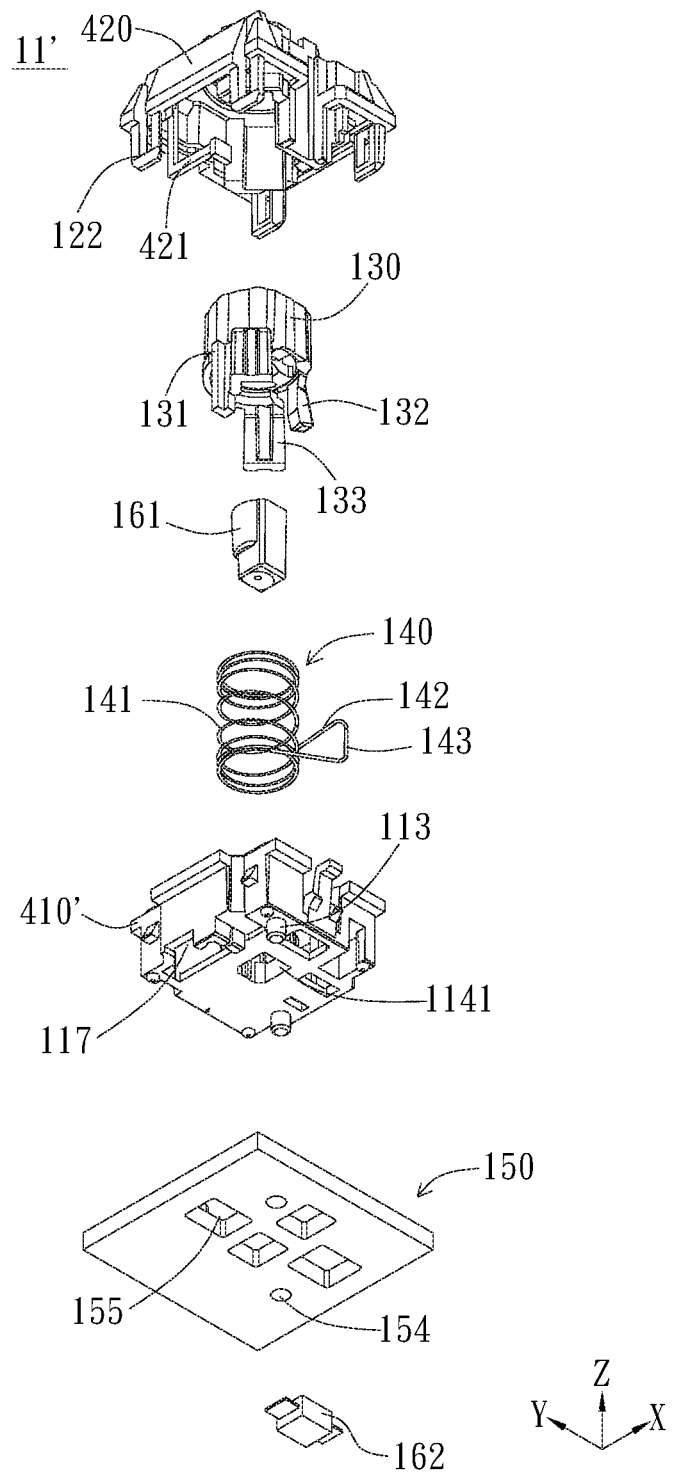
Figure 19C:
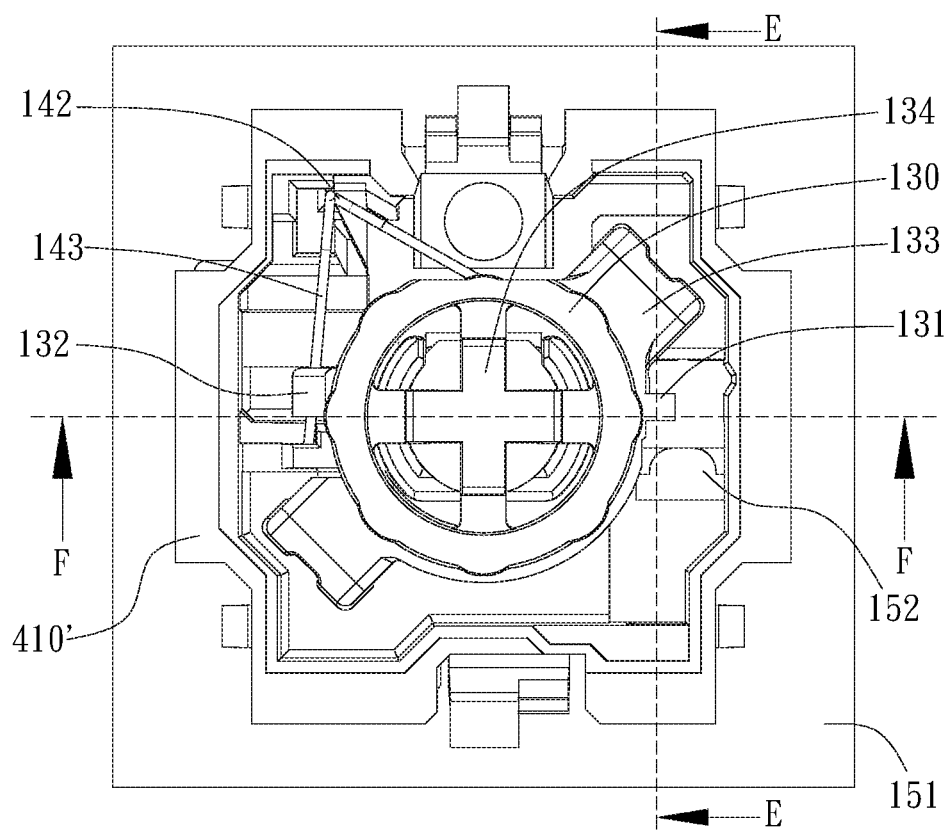
FIG. 19C is a schematic top view of the optical keyswitch of FIG. 19A without the upper casing.
Figure 19D:
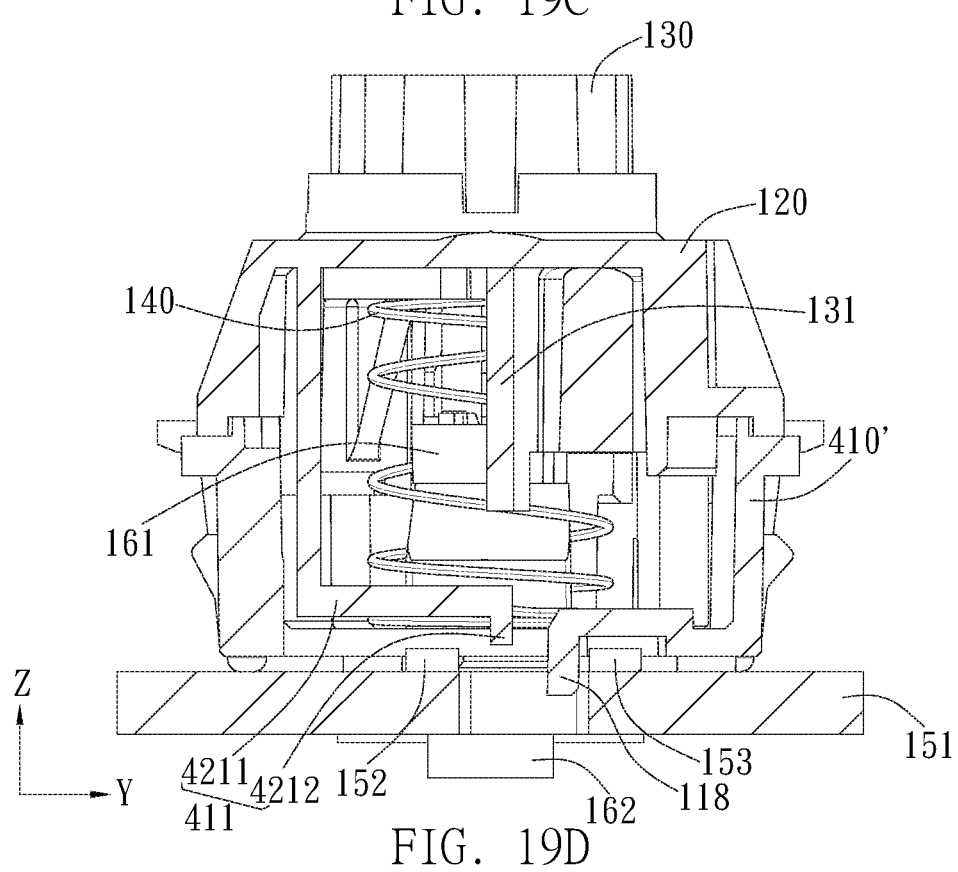
FIG. 19D is a cross-sectional view of FIG. 19C along the cutting line EE.

FIGS. 19A to 21B are schematic views of an eighth embodiment of the invention. FIGS. 19A and 19B are exploded views of the optical keyswitch from different viewing angles, FIG. 19C is a schematic top view of the optical keyswitch of FIG. 19A without the upper casing, and FIG. 19D is a cross-sectional view of FIG. 19C along the cutting line EE. As shown in FIGS. 19A to 19D, the optical keyswitch 11' of the eighth embodiment includes a casing 400', the shaft 130, the resilient member 140, and the switch module 150. The optical keyswitch 11' may optionally further include the backlight unit 160. The optical keyswitch 11' of FIG. 19A is different from the optical keyswitch 10' of FIG. 4A in the configuration of the movable portion 421 of the upper casing 420. Therefore, the structure and the connection of the rest components of the optical keyswitch 11', such as the shaft 130, the resilient member 140, the switch module 150, and the backlight unit 160, as well as the corresponding structure of the casing 400', can refer to the related descriptions of the optical keyswitch 10 or 10' of the first or second embodiment, and will not elaborate again.

Figure 20A:
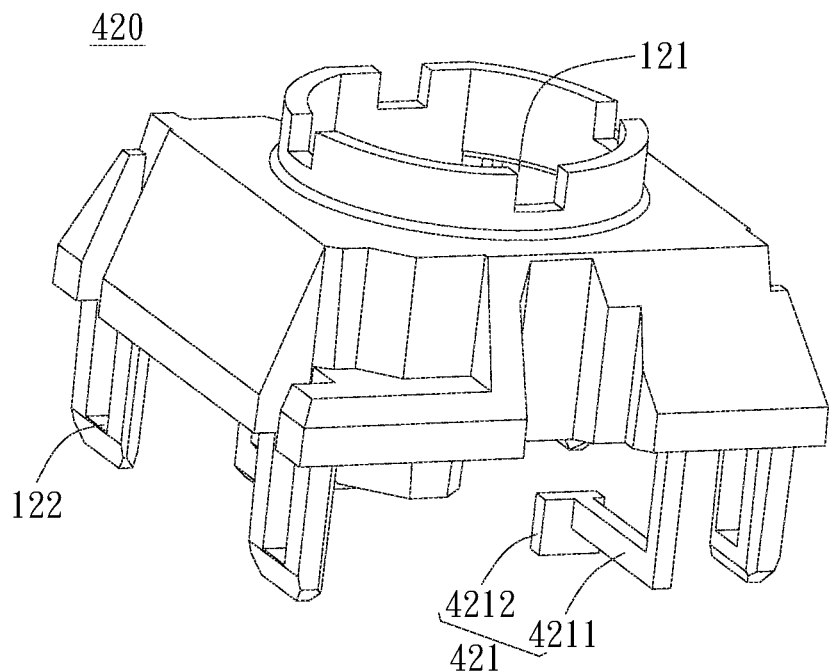
FIGS. 20A and 20B are schematic views of the upper casing of an embodiment from different viewing angles.
Figure 20B:
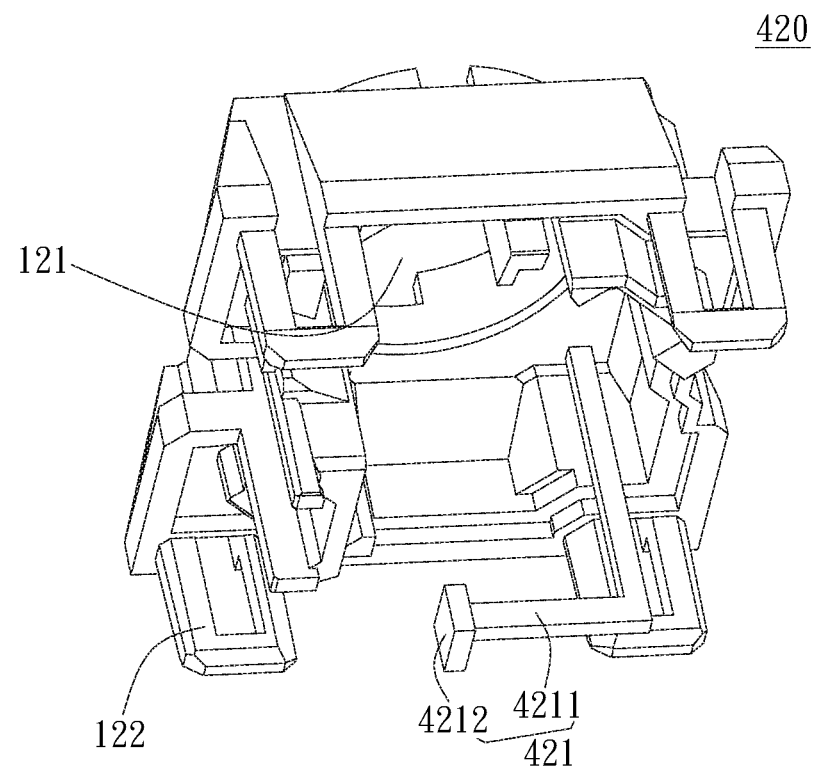

In this embodiment, the casing 400' includes an upper casing 420 and a lower casing 410'. The movable portion 421 is preferably a flexible arm extending from the upper casing 420. As shown in FIGS. 20A and 20B, the movable portion 421 is a flexible arm including a connection portion 4211 and a shielding portion 4212. For example, the connection portion 4211 is an L-shaped connection arm, which extends vertically from the lower surface of the upper casing 420 toward the lower casing 410' and then extends horizontally to connect the shielding portion 4212 and correspond to the activating portion 131 of the shaft 130. In other words, the length of the connection portion 4211 extending vertically from the upper casing 420 is preferably long enough to ensure that the connection portion 4212 can be partially horizontally located beneath the activating portion 131. The shielding portion 4212 is a free end of the movable portion 421. The shielding portion 4212 preferably has a size larger than the connection portion 4211, so the connection portion 4211 has a larger flexibility with respect to the shielding portion 4212. When the horizontal section of the connection portion 4211 is pushed by the activating portion 131, the shielding portion 4212 is driven to move downward toward the lower casing 410'. In an embodiment, the shielding portion 4212 of the movable portion 421 preferably has a size large enough to substantially completely block the optical signal, but not limited thereto. In other embodiments, the shielding portion 4212 at least partially blocks the optical signal.

Figure 21A:
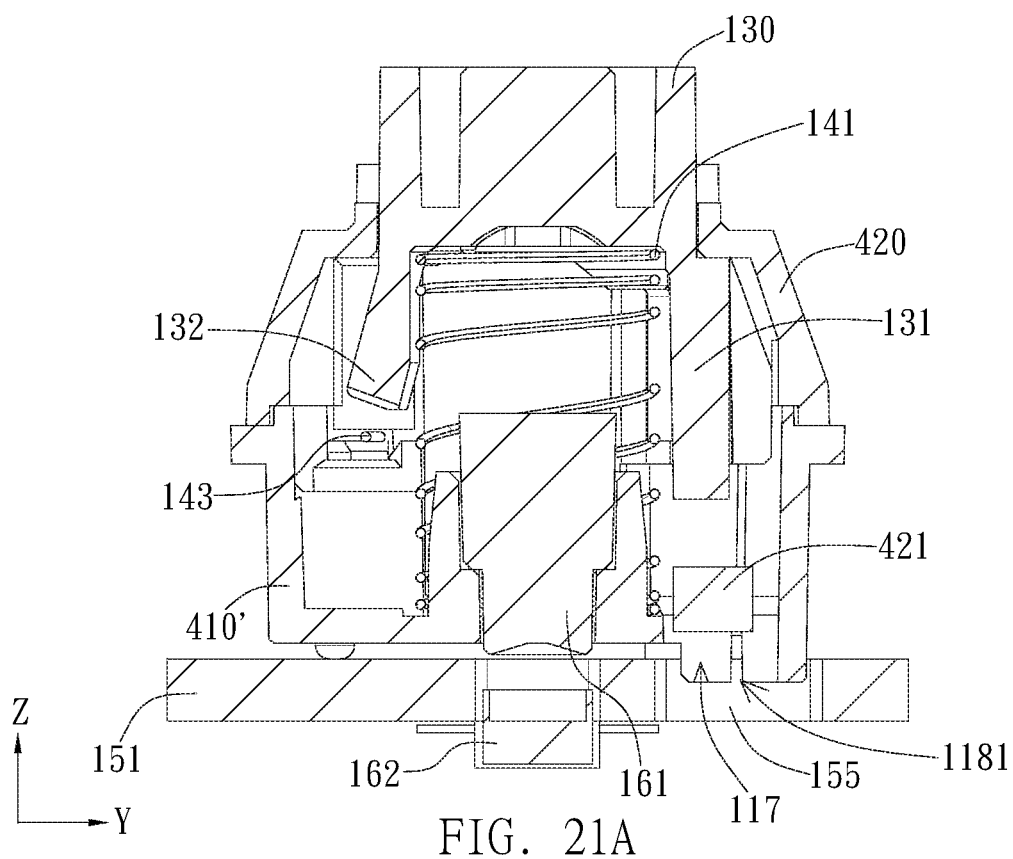
FIGS. 21A and 21B are cross-sectional views of the optical keyswitch of FIG. 19C along the cutting line FF with the upper casing at the non-pressed position and the pressed position, respectively.
Figure 21B:
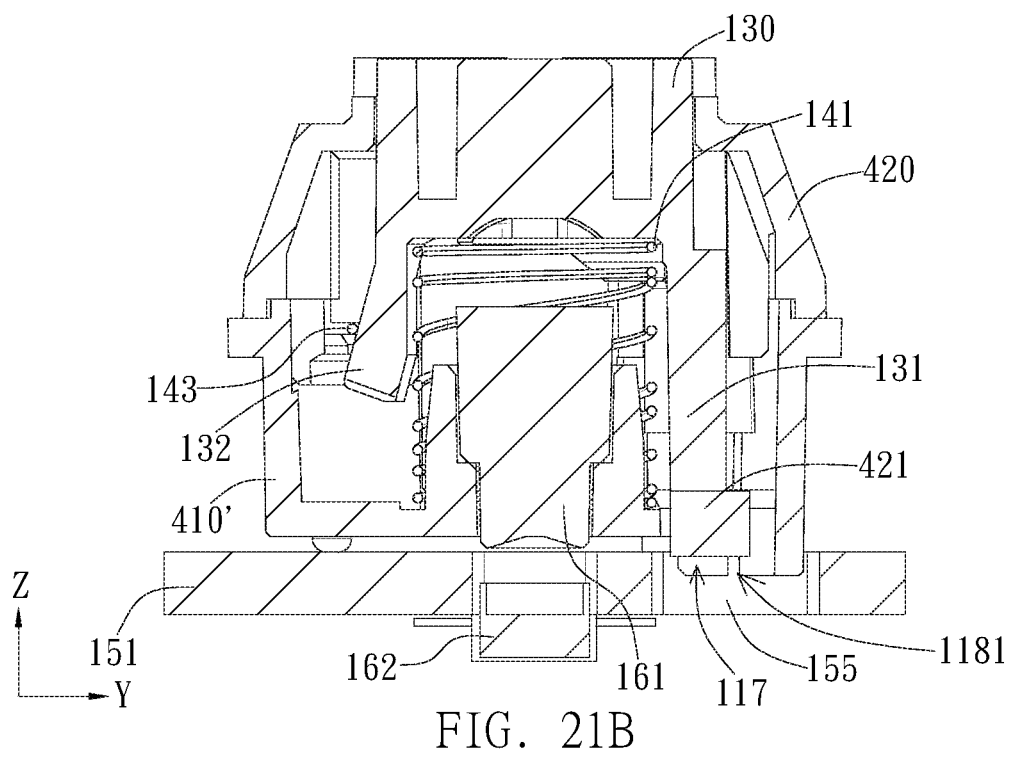

Referring to FIGS. 21A and 21B, the operation of the optical keyswitch 11' of the eighth embodiment will be illustrated. FIGS. 21A and 21B are cross-sectional views of the optical keyswitch 11' of FIG. 19C along the cutting line FF with the upper casing at the non-pressed position and the pressed position, respectively. As shown in FIG. 21A, when the shaft 130 is at the non-pressed position, the activating portion 131 at least partially overlaps the movable portion 421 in a direction parallel to the up-down path. For example, when the shaft 130 is at the non-pressed position, the activating portion 131 and the movable portion 421 preferably at least partially overlap with each other in the Z axis direction, i.e. the vertical projections of the activating portion 131 and the movable portion 421 on the lower casing 410' at least partially overlap with each other. Moreover, when the shaft 130 is at the non-pressed position, the movable portion 421 has a first relation with the optical path, and the optical signal received by the receiver 153 has the first intensity. In this embodiment, when the shaft 130 is at the non-pressed position, the movable portion 421 has a less portion entering the optical path, so the movable portion 421 blocks a less amount of the optical signal, and the first intensity of the optical signal received by the receiver 153 is stronger. For example, when the shaft 130 is at the non-pressed position, the movable portion 421 is preferably located above the optical path, so that the optical signal emitted by the emitter 152 is received by the receiver 153 without being interfered by the movable portion 421, and the first intensity is stronger, i.e. the optical signal is not blocked or attenuated.

As shown in FIG. 21B, when the shaft 130 moves, in response to the pressing force, from the non-pressed position to the pressed position along the up-down path, the shaft 130 compresses the resilient member 140 and pushes the movable portion 421 to move, so that the movable portion 421 no longer has the first spatial relation with the optical path, the optical signal received by the receiver 153 has a second intensity different from the first intensity, and the switch module 150 is triggered to generate the triggering signal. In other words, when the shaft 130 moves along the up-down path toward the lower casing 410' to the pressed position, the activating portion 131 pushes the movable portion 421 to move and changes the spatial relation of the movable portion 421 and the optical path, so that the intensity of the optical signal received by the receiver 153 is changed, and the switch module 150 is triggered to generate the triggering signal. In this embodiment, the first spatial relation refers that the movable portion 421 is away from the optical path, and the movable portion 421 substantially does not change the intensity of the optical signal received by the receiver 153. When the movable portion 421 no longer has the first spatial relation with the optical path, it means that the movable portion 421 enters the optical path and at least partially blocks the optical signal received by the receiver 153, i.e. the intensity of the optical signal is attenuated, so that the second intensity is smaller than the first intensity, and the switch module 150 is triggered to generate the triggering signal.

Specifically, when the shaft 130 is driven by the keycap to move toward the lower casing 410' along the up-down path, the activating portion 131 moves downward along with the shaft 130, so that the distal end (i.e. the lower end) of the activating portion 131 contacts the movable portion 421 (i.e. the horizontal section of the connection portion 4211 or the shielding portion 4212). Therefore, the movable portion 421 elastically deforms downwardly with the connection end of the connection portion 4211 as a pivot point to at least partially block the optical signal, i.e. at least partially block the slit 1181, so the second intensity is smaller than the first intensity, and the switch module 150 is triggered to generate the triggering signal.

Figure 22:
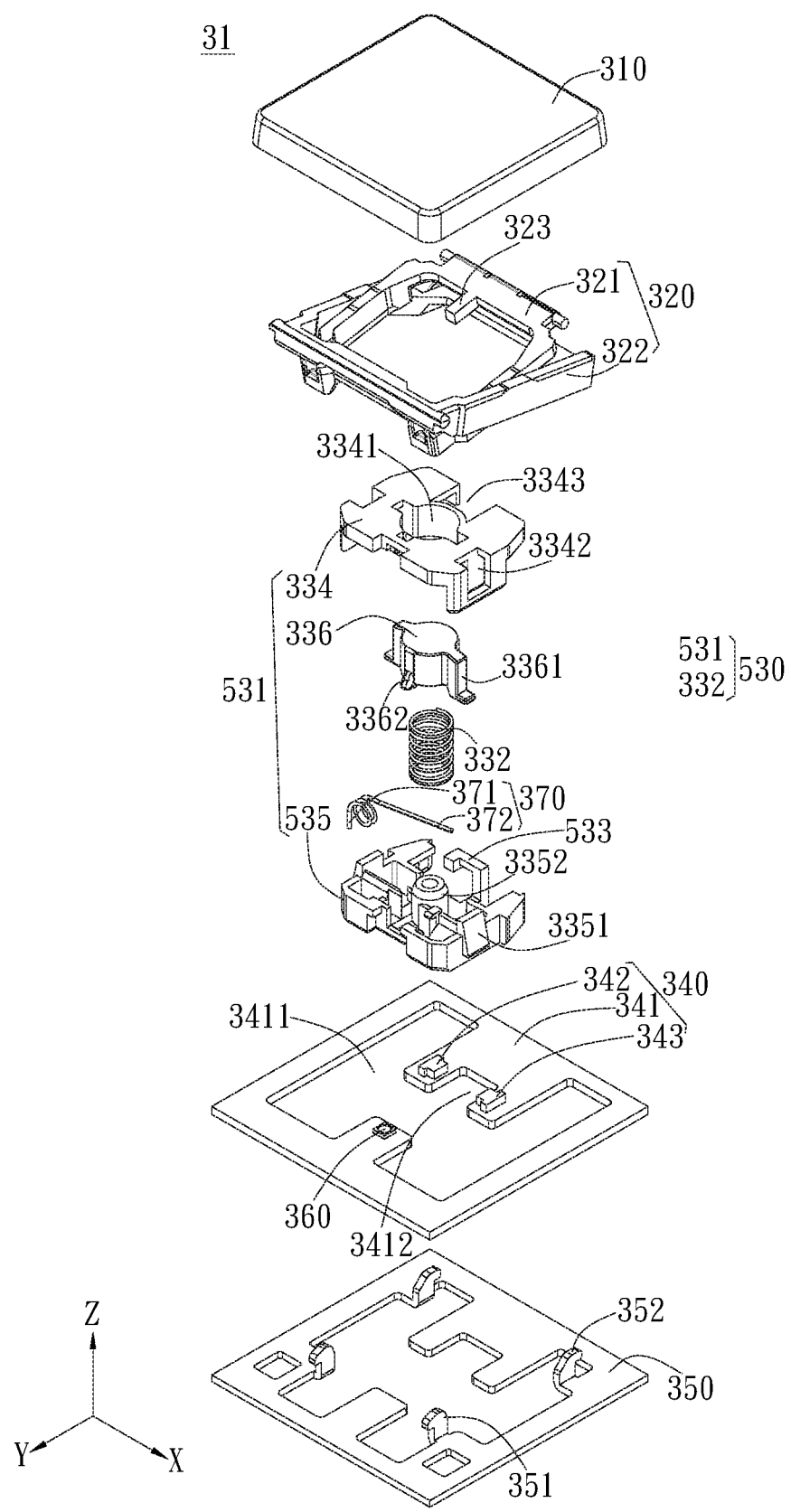
FIG. 22 is an exploded view of the optical keyswitch of a ninth embodiment of the invention.
Figure 23:
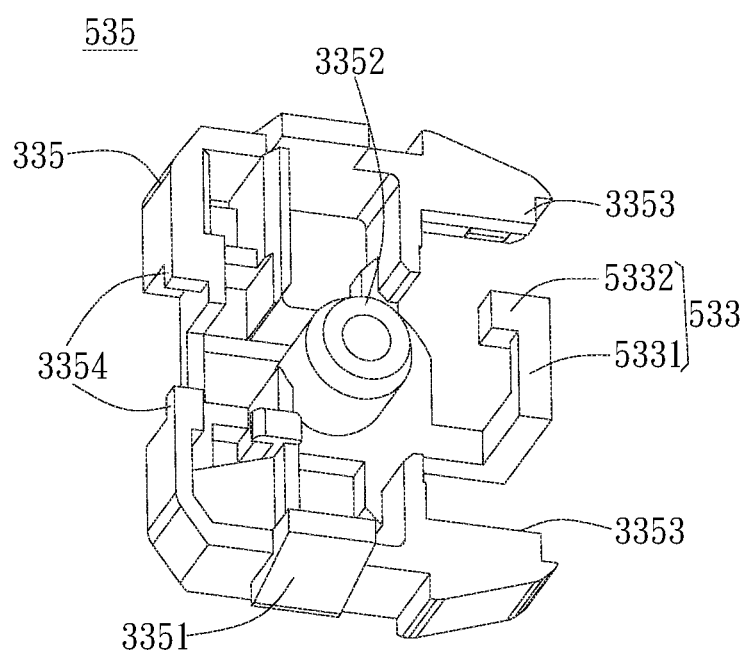
FIG. 23 is a schematic view of the lower casing of FIG. 22.
Figure 24A:
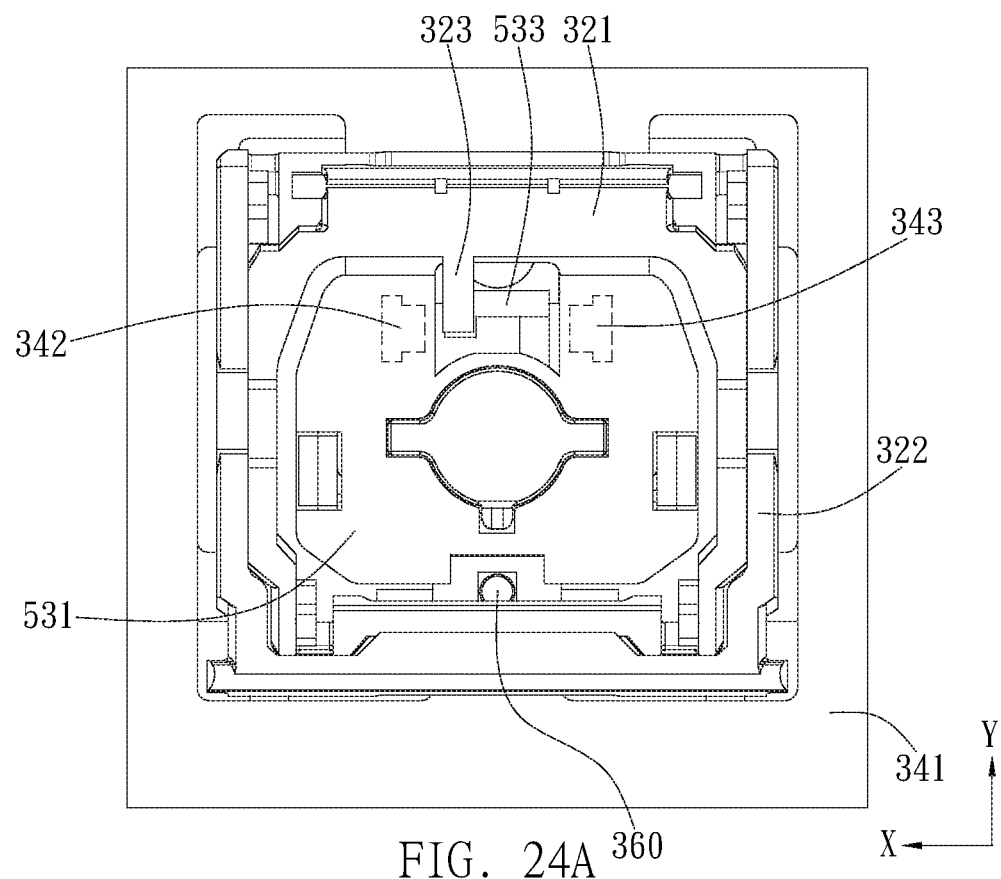
FIGS. 24A and 24B are a schematic top view and a perspective view of the optical keyswitch of FIG. 22 without the keycap, respectively.
Figure 24B:
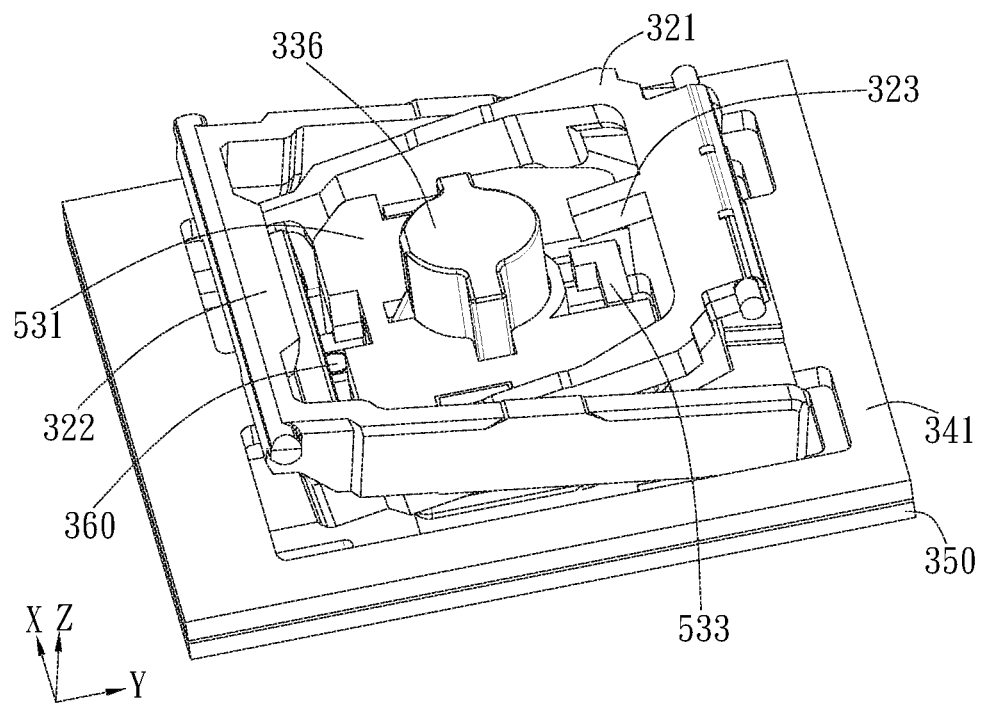

FIGS. 22 to 24B are schematic views of a ninth embodiment of the invention. FIG. 22 is an exploded view of the optical keyswitch, FIG. 23 is a schematic view of the lower casing of FIG. 22, and FIGS. 24A and 24B are a schematic top view and a perspective view of the optical keyswitch of FIG. 22 without the keycap, respectively. As shown in FIGS. 22 to 24B, the optical keyswitch 31 of the ninth embodiment includes the keycap 310, the support mechanism 320, a restoring mechanism 530, the switch module 340, and the baseplate 350. The optical keyswitch 31 may optionally further include the backlight source 360. The optical keyswitch 31 of FIG. 22 is different from the optical keyswitch 30 of FIG. 10 in the configuration of the movable portion 533 of the lower casing 535. Therefore, the structure and the connection of the rest components of the optical keyswitch 31, such as the keycap 310, the support mechanism 320, the switch module 340, the baseplate 350, and the backlight source 360, as well as the corresponding structure of the restoring mechanism 530, can refer to the related descriptions of the optical keyswitch 30 of the fifth embodiment, and will not elaborate again.

In this embodiment, the casing 531 includes the upper casing 334 and a lower casing 535. The movable portion 533 is preferably a flexible arm extending from the lower casing 535 toward the open region 3343 of the upper casing 334. As shown in FIG. 23, the movable portion 535 is a flexible arm including a connection portion 5331 and a shielding portion 5332. For example, the connection portion 5331 preferably extends from the bottom of the U-shaped horizontal cross section of the lower casing 535 toward the opening of the U-shaped horizontal cross section, extends upward toward the upper casing 334, and then extends horizontally beneath the protrusion 323. In this embodiment, the length of the connection portion 5331 extending upward is preferably long enough to ensure that a section of the connection portion 5331 extends horizontally above the optical path. The shielding portion 5332 is located at a free end of the movable portion 533. When the horizontal section of the connection portion 5331 is pushed by the protrusion 323, the shielding portion 5332 is driven to move downward toward the lower casing 535. In an embodiment, the shielding portion 5332 of the movable portion 533 preferably has a size large enough to substantially completely block the optical signal, but not limited thereto. In other embodiments, the shielding portion 5332 at least partially blocks the optical signal.

Referring to FIGS. 24A and 24B, the operation of the optical keyswitch 31 of the ninth embodiment will be illustrated. As shown in FIGS. 24A and 24B, when the keycap 310 is not pressed, the protrusion 323 at least partially overlaps the movable portion 533 in a direction parallel to a moving direction of the keycap 310, such as the Z axis direction, the movable portion 533 has the first spatial relation with the optical path, and the receiver 343 receives the optical signal of first intensity. When the keycap 310 is pressed, the resilient member 332 is compressed, and the support mechanism 320 is driven to move along with the keycap 310, so that the protrusion 323 pushes the movable portion 533 to move, the movable portion 533 no longer has the first spatial relation with the optical path, and the optical signal received by the receiver 343 has the second intensity different from the first intensity. As such, the switch module 340 is triggered to generate the triggering signal.

In this embodiment, the first spatial relation refers that the movable portion 533 is away from the optical path, and the movable portion 533 substantially does not change the intensity of the optical signal received by the receiver 343. When the movable portion 533 no longer has the first spatial relation with the optical path, it means that the movable portion 533 enters the optical path and at least partially blocks the optical signal received by the receiver 343, i.e. the intensity of the optical signal is attenuated, so that the second intensity is smaller than the first intensity, and the switch module 340 is triggered to generate the triggering signal.

Specifically, when the support mechanism 320 is driven to move along with the keycap 310, the protrusion 323 pushes the connection portion 5331 or the shielding portion 5332 of the movable portion 533, so that the movable portion 533 elastically deforms downward, with the connection end of the connection portion 5331 and the lower casing 535 as a pivot, the shielding portion 5332 at least partially blocks the optical signal, and the second intensity is smaller than the first intensity. In an embodiment, when the protrusion 323 is driven to move along with the keycap 310, the movable portion 533 preferably completely blocks the optical signal, so that the receiver 343 cannot receive the optical signal, i.e. the second intensity is zero. It is noted that by modifying the circuit design of the circuit board 341, the switch module 340 can generate the triggering signal based on the variation in intensity of the optical signal received by the receiver 343, or based on whether the receiver 343 receives the optical signal.

Figure 25:
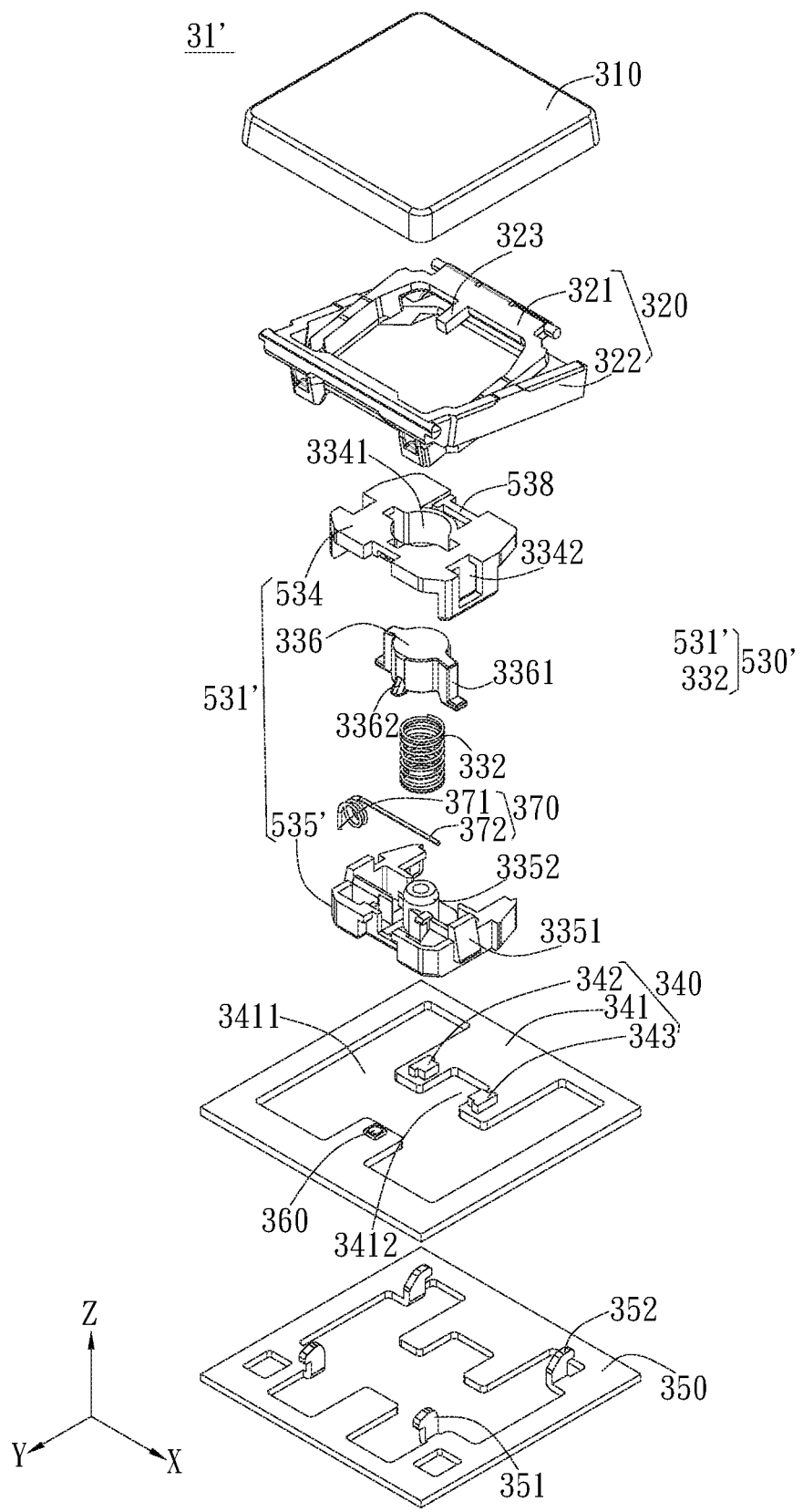
FIG. 25 is an exploded view of the optical keyswitch of a tenth embodiment of the invention.
Figure 26:
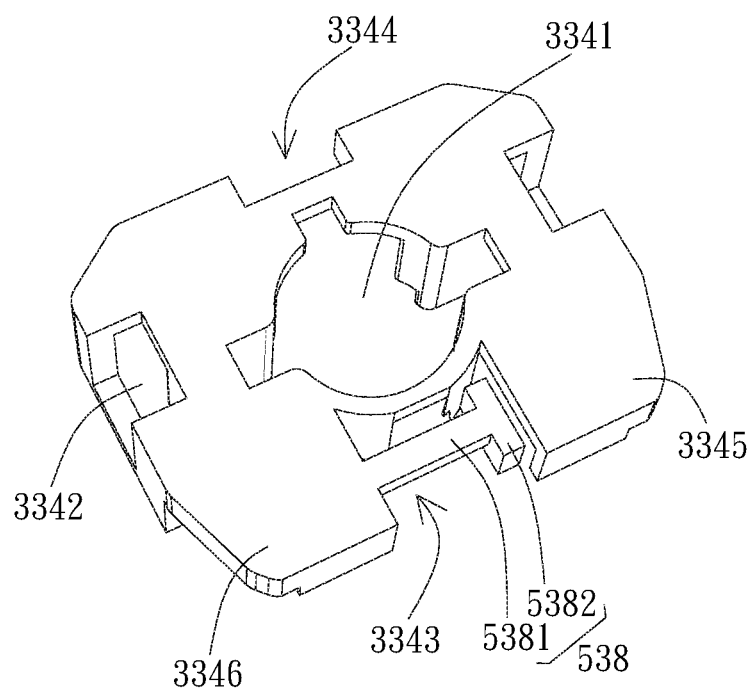
FIG. 26 is a schematic view of the upper casing of FIG. 25.
Figure 27A:
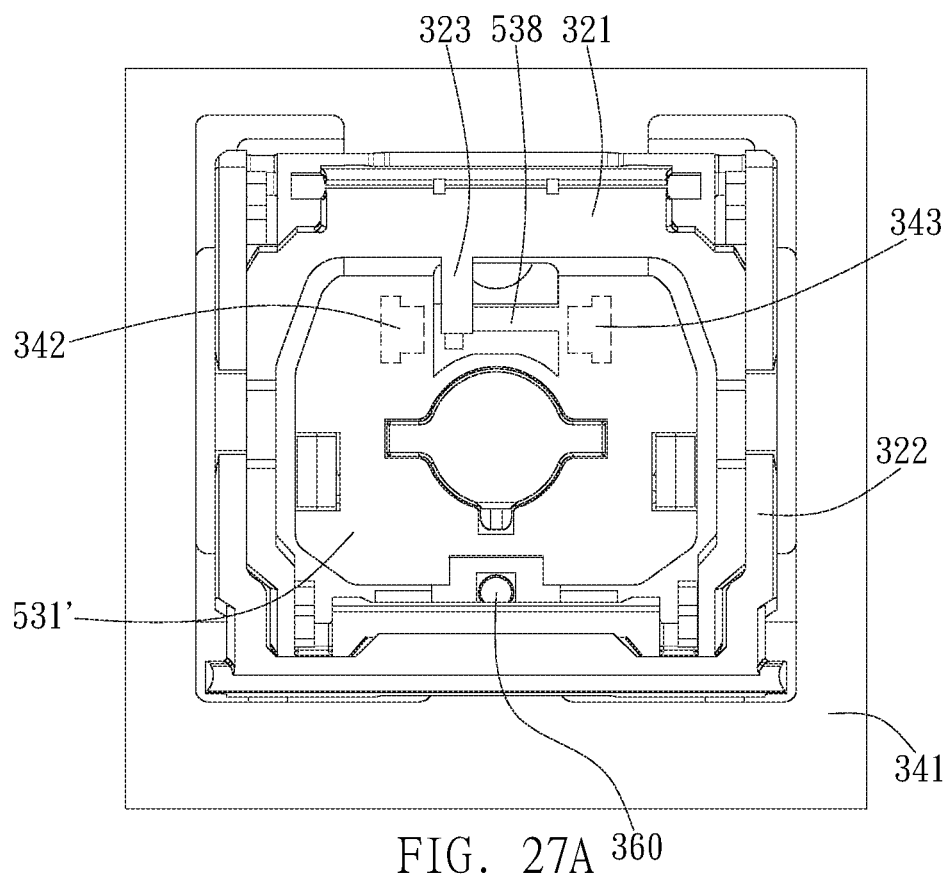
FIGS. 27A and 27B are a schematic top view and a perspective view of the optical keyswitch of FIG. 25 without the keycap, respectively.
Figure 27B:
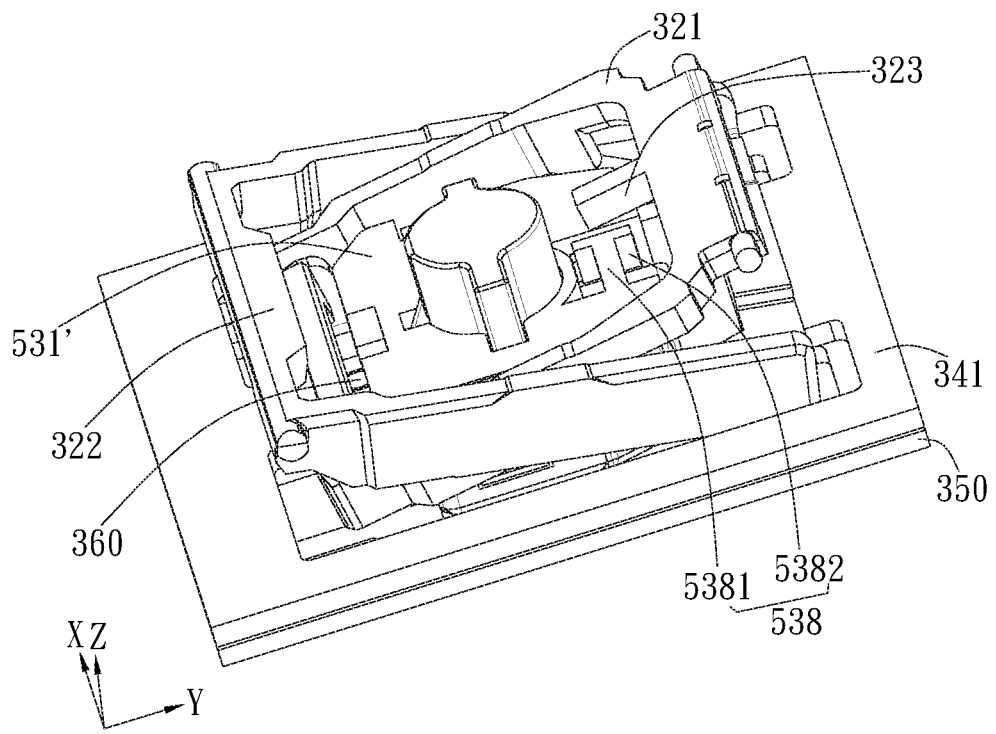

FIGS. 25 to 27B are schematic views of a tenth embodiment of the invention. FIG. 25 is an exploded view of the optical keyswitch, FIG. 26 is a schematic view of the upper casing of FIG. 25, and FIGS. 27A and 27B are a schematic top view and a perspective view of the optical keyswitch of FIG. 25 without the keycap, respectively. As shown in FIGS. 25 to 27B, the optical keyswitch 31' of the tenth embodiment includes the keycap 310, the support mechanism 320, a restoring mechanism 530', the switch module 340, and the baseplate 350. The optical keyswitch 31' may optionally further include the backlight source 360. The optical keyswitch 31' of FIG. 25 is different from the optical keyswitch 30' of FIG. 13 in the configuration of the movable portion 538 of the upper casing 534. Therefore, the structure and the connection of the rest components of the optical keyswitch 31', such as the keycap 310, the support mechanism 320, the switch module 340, the baseplate 350, and the backlight source 360, as well as the corresponding structure of the restoring mechanism 530', can refer to the related descriptions of the optical keyswitch 30 or 30' of the fifth or sixth embodiment, and will not elaborate again.

In this embodiment, the casing 531' includes the upper casing 534 and a lower casing 535'. The movable portion 538 is preferably a flexible arm extending from the upper casing 534 toward the open region 3343 of the upper casing 534. As shown in FIG. 26, the movable portion 538 is a flexible arm including a connection portion 5381 and a shielding portion 5382. For example, one end of the connection portion 5381 is connected to the upper casing 534, and the other end of the connection portion 5381 is connected to the shielding portion 5382. The connection portion 5381 can be a rod or an arm of any suitable shape with one end connected to one of the right arm portion 3346 and the left arm portion 3345, and the other end extending to the other one of the right arm portion 3346 and the left arm portion 3345 and connecting the shielding portion 5382 to be a free end. For example, one end of the connection portion 5381 of the movable portion 538 is connected to the right arm portion 3346, and the other end of the connection portion 5381 extends toward the left arm portion 3345 and partially corresponds to the opening of the open region 3343. The shielding portion 5382 preferably extends downward from the connection portion 5381 along the Z axis direction. Moreover, according to practical applications, the movable portion 538 can be a flexible arm of any suitable shape, so that the movable portion 538 can have a free end corresponding to the protrusion 323 and a connection portion connected to the upper casing 534, and the free end is movable or deformable in response to the pushing of the protrusion 323. In an embodiment, the shielding portion 5382 of the movable portion 538 preferably has a size large enough to substantially completely block the optical signal, but not limited thereto. In other embodiments, the shielding portion 5382 at least partially blocks the optical signal.

Referring to FIGS. 27A and 27B, the operation of the optical keyswitch 31' of the tenth embodiment will be illustrated. As shown in FIGS. 27A and 27B, when the keycap 310 is not pressed, the protrusion 323 at least partially overlaps the movable portion 538 in a direction parallel to a moving direction of the keycap 310, such as the Z axis direction, the movable portion 538 has the first spatial relation with the optical path, and the receiver 343 receives the optical signal of first intensity. When the keycap 310 is pressed, the resilient member 332 is compressed, and the support mechanism 320 is driven to move along with the keycap 310, so that the protrusion 323 pushes the movable portion 538 to move, the movable portion 538 no longer has the first spatial relation with the optical path, and the optical signal received by the receiver 343 has the second intensity different from the first intensity. As such, the switch module 340 is triggered to generate the triggering signal.

In this embodiment, the first spatial relation refers that the movable portion 538 is away from the optical path, and the movable portion 538 substantially does not change the intensity of the optical signal received by the receiver 343. When the movable portion 538 no longer has the first spatial relation with the optical path, it means that the movable portion 538 enters the optical path and at least partially blocks the optical signal received by the receiver 343, i.e. the intensity of the optical signal is attenuated, so that the second intensity is smaller than the first intensity, and the switch module 340 is triggered to generate the triggering signal.

Specifically, when the support mechanism 320 is driven to move along with the keycap 310, the protrusion 323 pushes the connection portion 5381 or the shielding portion 5382 of the movable portion 538, so that the movable portion 538 elastically deforms downward, with the connection end of the connection portion 5381 and the upper casing 534 as a pivot point, the shielding portion 5382 at least partially blocks the optical signal, and the second intensity is smaller than the first intensity. In an embodiment, when the protrusion 323 is driven to move along with the keycap 310, the movable portion 538 preferably completely blocks the optical signal, so that the receiver 343 cannot receive the optical signal, i.e. the second intensity is zero. It is noted that by modifying the circuit design of the circuit board 341, the switch module 340 can generate the triggering signal based on the variation in intensity of the optical signal received by the receiver 343, or based on whether the receiver 343 receives the optical signal.

It is noted that in the embodiments of FIGS. 1A to 15B, the activating portion 131 (or the protrusion 323) and the movable portion have the corresponding first inclined surface and second inclined surface, so the movable portion can laterally move when being pushed by the activating portion 131 or the protrusion 323, but not limited thereto. In other embodiments, by modifying the design of the activating portion 131 (or the protrusion 323) and the movable portion, even if only one of the activating portion 131 (or the protrusion 323) and the movable portion has an inclined surface, the activating portion 131 (or the protrusion 323) and the movable portion can move relative to each other along the inclined surface, and the movable portion is pushed to laterally move. In the embodiments of FIGS. 16A to 27B, the activating portion 131 (or the protrusion 323) and the movable portion do not have corresponding inclined surfaces, so that when the movable portion is pushed by the activating portion 131 (or the protrusion 323), the movable portion moves or deforms along the up-down path along with the activating portion 131 (or the protrusion 323). Moreover, In the embodiments of FIGS. 16A to 27B, the movable portion is pushed by the activating portion 131 (or the protrusion 323) to block the optical signal, but not limited thereto. In other embodiments, by modifying the design of the activating portion 131 (or the protrusion 323) and the movable portion, when the optical keyswitch is at the non-pressed position, the movable portion can have a larger portion entering the optical path and block a larger amount of the optical signal; when the optical keyswitch is at the pressed position, the movable portion can have a less portion entering the optical path and block a less amount of the optical signal, and the optical signal received by the receiver 153 has a larger intensity, i.e. the second intensity is larger than the first intensity. As such, the switch module 150 is triggered to generate the triggering signal.

In the fifth, sixth, ninth or tenth embodiment, the movable portion is pushed by the protrusion 323 of the support mechanism 320, but not limited thereto. In other embodiments, by modifying the movable portion, the support mechanism 320 can push the movable portion without using the protrusion. Specifically, when the keycap is not pressed, the movable portion preferably extends beneath under the support mechanism 320, so that when the keycap is pressed, the support mechanism 320 moves downward and pushes the movable portion to move, so as to change the intensity of the optical signal received by the receiver. For example, when the keycap is not pressed, the vertical projections of the movable portion and the keycap end of the inner frame 321 of the support mechanism 320 on the baseplate preferably at partially overlap with each other, i.e. the movable portion extends beneath the keycap end of the inner frame 321. As such, when the support mechanism 320 is driven by the keycap to move downward, the keycap end of the inner frame 321 can push the movable portion to move, so as to change the intensity of the optical signal received by the receiver. Moreover, according to practical applications, the inner edge of the keycap end of the inner frame 321 and the movable portion can be designed with or without corresponding inclined surfaces, so that when the keycap is pressed, the inner frame 321 can push the movable portion to laterally move with respect to the up-down path or to move along the up-down path.

Although the preferred embodiments of the present invention have been described herein, the above description is merely illustrative. The preferred embodiments disclosed will not limit the scope of the present invention. Further modification of the invention herein disclosed will occur to those skilled in the respective arts and all such modifications are deemed to be within the scope of the invention as defined by the appended claims.

What is claimed is:

1. An optical keyswitch, comprising:
   a casing having a movable portion;
   a shaft movably disposed on the casing, in response to a pressing force, the shaft moving along an up-down path from a non-pressed position to a pressed position;
   a resilient member accommodated in the casing, the resilient member coupling the shaft and enabling the shaft to return to the non-pressed position when the pressing force is released; and
   a switch module comprising a circuit board, an emitter, and a receiver, the emitter and the receiver electrically connected to the circuit board, the emitter emitting an optical signal along an optical path to the receiver,
   wherein when the shaft is at the non-pressed position, the movable portion has a first spatial relation with the optical path, and the receiver receives the optical signal of a first intensity;
   when the shaft moves, in response to the pressing force, from the non-pressed position to the pressed position along the up-down path, the shaft compresses the resilient member and pushes the movable portion to move, so the movable portion no longer has the first spatial relation with the optical path, the optical signal received by the receiver has a second intensity different from the first intensity, and the switch module is triggered to generate a triggering signal.

2. The optical keyswitch of claim 1, wherein when the shaft is at the non-pressed position, the movable portion has a less portion entering the optical path and blocks a less amount of the optical signal; when the shaft moves to the pressed position, the movable portion laterally moves away from the up-down path and has a larger portion entering the optical path, so the movable portion blocks a larger amount of the optical signal, and the second intensity is smaller than the first intensity.

3. The optical keyswitch of claim 1, wherein the shaft has an activating portion protruding along the up-down path and corresponding to the movable portion; when the shaft is at the non-pressed position, the activating portion at least partially overlaps the movable portion in a direction parallel to the up-down path; when the shaft moves along the up-down path and pushes the movable portion to laterally move, the activating portion at least partially contacts the movable portion in a direction perpendicular to the up-down path.

4. The optical keyswitch of claim 3, wherein the activating portion has a first inclined surface, and the movable portion has a second inclined surface corresponding to the first inclined surface; when the shaft moves along the up-down path, the first inclined surface moves relative to the second inclined surface to push the movable portion to laterally move.

5. The optical keyswitch of claim 3, wherein the circuit board further has a receiving space; when the shaft is at the pressed position, a distal end of the activating portion extends beyond the movable portion into the receiving space.

6. The optical keyswitch of claim 1, wherein the casing comprises an upper casing and a lower casing; the upper casing has a through hole and an upper engaging portion; the shaft is movably inserted into the through hole to position the resilient member; the movable portion is disposed on the lower casing; the lower casing has a lower engaging portion engaging the upper engaging portion to combine the upper casing and the lower casing.

7. The optical keyswitch of claim 1, wherein the casing comprises an upper casing and a lower casing; the upper casing has a through hole and an upper engaging portion; the shaft is movably inserted into the through hole to position the resilient member; the movable portion is disposed on the upper casing; the lower casing has a lower engaging portion engaging the upper engaging portion to combine the upper casing and the lower casing.

8. The optical keyswitch of claim 7, wherein the casing further has a grating portion disposed between the emitter and the receiver; the grating portion has a slit; the movable portion has a horizontal extension axis; when the shaft is at the non-pressed position, the horizontal extension axis does not pass through the slit; when the movable portion laterally moves away from the up-down path, the horizontal extension axis passes through the slit.

9. The optical keyswitch of claim 7, wherein the circuit board further has a positioning hole, and the lower casing has a positioning post for being inserted into the positioning hole to position the casing on the circuit board.

10. The optical keyswitch of claim 7, further comprising a light guiding rod and a backlight source, wherein the light guiding rod is disposed corresponding to the resilient member in the casing, and the backlight source is electrically connected to the circuit board and disposed corresponding to the light guiding rod to provide a light toward the shaft.

11. An optical keyswitch, comprising:
    a casing;
    a shaft movably disposed on the casing, in response to a pressing force, the shaft moving along an up-down path from a non-pressed position to a pressed position;
    a resilient member accommodated in the casing, the resilient member coupling the shaft and enabling the shaft to return to the non-pressed position when the pressing force is released;
    a switch module comprising a circuit board, an emitter, and a receiver, the emitter and the receiver electrically connected to the circuit board, the emitter emitting an optical signal along an optical path to the receiver; and
    a shielding baffle disposed on the casing, wherein when the shaft is at the non-pressed position, the shielding baffle has a first spatial relation with the optical path, and the receiver receives the optical signal of a first intensity;

when the shaft moves, in response to the pressing force, from the non-pressed position to the pressed position along the up-down path, the shaft compresses the resilient member and drives the shielding baffle to move, so the shielding baffle no longer has the first spatial relation with the optical path, the optical signal received by the receiver has a second intensity different from the first intensity, and the switch module is triggered to generate a triggering signal.

12. The optical keyswitch of claim 11, wherein when the shaft is at the non-pressed position, the shielding baffle has a less portion entering the optical path and blocks a less amount of the optical signal; when the shaft moves to the pressed position, the shielding baffle laterally moves away from the up-down path and has a larger portion entering the optical path, so the shielding baffle blocks a larger amount of the optical signal, and the second intensity is smaller than the first intensity.

13. The optical keyswitch of claim 11, wherein when the shaft is at the non-pressed position, the shielding baffle is located in the optical path and blocks the optical signal; when the shaft moves to the pressed position, the shielding baffle is pushed by the shaft to laterally move away from the optical path, so the second intensity is larger than the first intensity.

14. The optical keyswitch of claim 11, wherein the casing comprises an upper casing and a lower casing; the upper casing has a through hole and an upper engaging portion; the shaft is movably inserted into the through hole to position the resilient member; the lower casing has a lower engaging portion engaging the upper engaging portion to combine the upper casing and the lower casing; the casing further has a grating portion disposed between the emitter and the receiver; the grating portion has a slit; the shielding baffle has a shielding portion; in response to the movement of the shaft, the shielding portion selectively blocks or exposes the slit with respect to the emitter.

15. An optical keyswitch, comprising:
a keycap;
a support mechanism disposed below the keycap and configured to support the keycap moving upward and downward;
a restoring mechanism disposed below the keycap and configured to provide a restoring force to enable the keycap to return to a non-pressed position, the restoring mechanism comprising a casing having a movable portion and a resilient member accommodated in the casing; and
a switch module comprising a circuit board, an emitter, and a receiver, the emitter and the receiver electrically connected to the circuit board, the emitter emitting an optical signal to the receiver, wherein when the keycap is not pressed, the receiver receives the optical signal of a first intensity;

when the keycap is pressed, the resilient member is compressed and the support mechanism is driven to move along with the keycap to push the movable portion to change the optical signal received by the receiver to have a second intensity different from the first intensity, so that the switch module is triggered to generate a triggering signal.

16. The optical keyswitch of claim 15, wherein the support mechanism comprises an inner frame and an outer frame; the inner frame is pivotally connected to an inner side of the outer frame to form a scissor-like support mechanism; the support mechanism has a protrusion; the protrusion extends from an inner side of the inner frame toward an inner direction of the inner frame.

17. The optical keyswitch of claim 16, wherein when the support mechanism is driven to move along with the keycap, the protrusion pushes the movable portion to at least partially block the optical signal, so that the second intensity is smaller than the first intensity.

18. The optical keyswitch of claim 16, wherein when the keycap is not pressed, the protrusion at least partially overlaps the movable portion in a direction parallel to a moving direction of the keycap; when the keycap is pressed, the protrusion pushes the movable portion to laterally move, and the protrusion at least partially contacts the movable portion in a direction perpendicular to the moving direction of the keycap.

19. The optical keyswitch of claim 16, wherein the protrusion has a first inclined surface, and the movable portion has a second inclined surface corresponding to the first inclined surface; when the support mechanism is driven to move along with the keycap, the first inclined surface moves relative to the second inclined surface to push the movable portion to laterally move.

20. The optical keyswitch of claim 15, wherein the casing comprises an upper casing and a lower casing; the upper casing has an upper engaging portion; the movable portion is disposed on the lower casing; the lower casing has a lower engaging portion engaging the upper engaging portion to combine the upper casing and the lower casing.

21. The optical keyswitch of claim 15, wherein the casing comprises an upper casing and a lower casing; the upper casing has an upper engaging portion; the movable portion is disposed on the upper casing; the lower casing has a lower engaging portion engaging the upper engaging portion to combine the upper casing and the lower casing.

22. The optical keyswitch of claim 15, wherein the casing further has a grating portion disposed between the emitter and the receiver; when the keycap is pressed, the support mechanism pushes the movable portion to move, so as to change a relative position of the movable portion and the grating portion.

* * * * *